US009459535B2

(12) United States Patent
Motoike et al.

(10) Patent No.: US 9,459,535 B2
(45) Date of Patent: Oct. 4, 2016

(54) METHOD OF FORMING PATTERN

(71) Applicants: Tokyo Ohka Kogyo Co., Ltd., Kawasaki-shi (JP); Tokyo Electron Limited, Tokyo (JP)

(72) Inventors: Naoto Motoike, Kawasaki (JP); Katsumi Ohmori, Kawasaki (JP); Toshiaki Hato, Kawasaki (JP); Hidetami Yaegashi, Tokyo (JP); Kenichi Oyama, Tokyo (JP)

(73) Assignees: TOKYO OHKA KOGYO CO., LTD., Kawasaki-Shi (JP); TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 13/759,669

(22) Filed: Feb. 5, 2013

(65) Prior Publication Data

US 2013/0209941 A1    Aug. 15, 2013

(30) Foreign Application Priority Data

Feb. 10, 2012 (JP) ................. 2012-027462

(51) Int. Cl.
*G03F 7/26* (2006.01)
*G03F 7/20* (2006.01)
*G03F 7/004* (2006.01)
*G03F 7/40* (2006.01)

(52) U.S. Cl.
CPC ........... *G03F 7/2026* (2013.01); *G03F 7/0045* (2013.01); *G03F 7/405* (2013.01)

(58) Field of Classification Search
CPC ....... G03F 7/42; G03F 7/0045; G03F 7/0397
USPC ................................. 430/323, 324
See application file for complete search history.

(56) References Cited

U.S. PATENT DOCUMENTS

| 5,945,517 | A | 8/1999 | Nitta et al. |
| 6,153,733 | A | 11/2000 | Yukawa et al. |
| 2004/0110085 | A1 | 6/2004 | Iwai et al. |
| 2005/0089796 | A1 | 4/2005 | Funatsu et al. |
| 2006/0183876 | A1 | 8/2006 | Hayashi et al. |
| 2007/0026684 | A1 | 2/2007 | Parascandola et al. |
| 2008/0064213 | A1 | 3/2008 | Jung |
| 2009/0087990 | A1 | 4/2009 | Yatsuda et al. |
| 2009/0087991 | A1 | 4/2009 | Yatsuda et al. |
| 2009/0317743 | A1 | 12/2009 | Shiono et al. |
| 2010/0055621 | A1 | 3/2010 | Hatakeyama et al. |
| 2011/0183269 | A1 | 7/2011 | Zhu |
| 2011/0266647 | A1* | 11/2011 | Parekh et al. ............. 257/506 |
| 2011/0269072 | A1* | 11/2011 | Shibuya .................... 430/270.1 |
| 2013/0171825 | A1 | 7/2013 | Xu |

FOREIGN PATENT DOCUMENTS

| JP | A-09-208554 | 8/1997 |
| JP | A-11-035551 | 2/1999 |
| JP | A-11-035552 | 2/1999 |
| JP | A-11-035573 | 2/1999 |
| JP | A-11-322707 | 11/1999 |
| JP | A-2003-241385 | 8/2003 |
| JP | A-2005-097533 | 4/2005 |
| JP | A-2007-043156 | 2/2007 |
| JP | A-2008-072101 | 3/2008 |
| JP | A-2009-088085 | 4/2009 |
| JP | A-2009-099938 | 5/2009 |
| JP | A-2010-002870 | 1/2010 |
| JP | A-2010-060693 | 3/2010 |
| JP | A-2010-085977 | 4/2010 |
| JP | A-2010-096896 | 4/2010 |
| JP | A-2010-126581 | 6/2010 |
| JP | A-2011-027980 | 2/2011 |
| JP | A-2012-063653 | 3/2012 |
| JP | A-2013-156628 | 8/2013 |
| WO | WO 2004/074242 A2 | 9/2004 |
| WO | WO 2005/016982 A1 | 2/2005 |

OTHER PUBLICATIONS

Office Action in Japanese Patent Application No. 2012-027462, mailed Apr. 14, 2015.
Ebihara et al., "Beyond $k_1$=0.25 Lithography: 70nm L/S Patterning Using KrF Scanners;" Proceedings of SPIE, vol. 5256, pp. 985-994 (2003).
Yan Borodovsky, "Marching to the Beat of Moore's Law," Proceedings of SPIE, vol. 6153, 615301-1-19 (2006).

* cited by examiner

*Primary Examiner* — Daborah Chacko Davis
(74) *Attorney, Agent, or Firm* — Knobbe Martens Olson & Bear LLP

(57) ABSTRACT

A method of forming a pattern including applying a resist composition to a substrate to form a resist film, and then subjecting the resist film to exposure and development, thereby forming a first pattern containing a resist film; forming a $SiO_2$ film on the surface of the first pattern and the substrate; subjecting the $SiO_2$ to etching such that the $SiO_2$ film remains only on a side wall portion of the first pattern; and removing the first pattern, thereby forming a second pattern containing the $SiO_2$ film. The resist composition contains a base component that exhibits changed solubility in a developing solution under action of an acid, and an acid generator component that generates acid upon exposure, the base component containing a resin component containing a structural unit having an acid decomposable group which exhibits increased polarity by the action of acid and has no polycyclic group.

7 Claims, 1 Drawing Sheet

METHOD OF FORMING PATTERN

TECHNICAL FIELD

The present invention relates to a method of forming a pattern in which a second pattern composed of an $SiO_2$ film is formed on a first pattern obtained by conducting exposure to a resist film followed by developing the resist film.

Priority is claimed on Japanese Patent Application No. 2012-027462, filed Feb. 10, 2012, the content of which is incorporated herein by reference.

BACKGROUND ART

Techniques (pattern-forming techniques) in which a fine pattern is formed on top of a substrate, and a lower layer beneath that pattern is then fabricated by conducting etching with this pattern as a mask are widely used in the production of semiconductor devices and liquid display device. These types of fine patterns are usually formed from an organic material, and are formed, for example, using a lithography method or a nanoimprint method or the like. In lithography techniques, for example, a resist film composed of a resist material containing a base component such as a resin is formed on a support such as a substrate, and the resist film is subjected to selective exposure of radial rays such as light or electron beam, followed by development, thereby forming a resist pattern having a predetermined shape on the resist film. Using this resist pattern as a mask, a semiconductor or the like is produced by conducting a step in which the substrate is processed by etching.

The aforementioned resist material can be classified into positive types and negative types. Resist materials in which the exposed portions exhibit increased solubility in a developing solution is called a positive type, and a resist material in which the exposed portions exhibit decreased solubility in a developing solution is called a negative type.

In recent years, advances in lithography techniques have lead to rapid progress in the field of pattern miniaturization. Typically, these miniaturization techniques involve shortening the wavelength (increasing the energy) of the exposure light source. Conventionally, ultraviolet radiation typified by g-line and i-line radiation has been used, but nowadays KrF excimer lasers and ArF excimer lasers are starting to be introduced in mass production. Furthermore, research is also being conducted into lithography techniques that use an exposure light source having a wavelength shorter (energy higher) than these excimer lasers, such as electron beam (EB), extreme ultraviolet radiation (EUV), and X ray.

As shortening the wavelength of the exposure light source progresses, it is required to improve various lithography properties of the resist material, such as sensitivity to the exposure light source and resolution capable of reproducing patterns of minute dimensions. As resist materials which satisfy such requirements, chemically amplified resists are known.

As a chemically amplified composition, a composition including a base material component that exhibits changed solubility in a developing solution under the action of acid and an acid generator component that generates acid upon exposure is generally used. For example, in the case where an alkali developing solution is used as a developing solution (alkali developing process), a base component which exhibits increased solubility in an alkali developing solution under action of acid is used.

Conventionally, a resin (base resin) is typically used as the base component of a chemically amplified resist composition. Resins that contain structural units derived from (meth)acrylate esters within the main chain (acrylic resins) are the mainstream as base resins for chemically amplified resist compositions that use ArF excimer laser lithography, as they exhibit excellent transparency in the vicinity of 193 nm.

Here, the term "(meth)acrylic acid" is a generic term that includes either or both of acrylic acid having a hydrogen atom bonded to the α-position and methacrylic acid having a methyl group bonded to the α-position. The term "(meth)acrylate ester" is a generic term that includes either or both of the acrylate ester having a hydrogen atom bonded to the α-position and the methacrylate ester having a methyl group bonded to the α-position. The term "(meth)acrylate" is a generic term that includes either or both of the acrylate having a hydrogen atom bonded to the α-position and the methacrylate having a methyl group bonded to the α-position.

In general, the base resin contains a plurality of structural units for improving lithography properties and the like. For example, a structural unit having a lactone structure and a structural unit having a polar group such as a hydroxy group are used, as well as a structural unit having an acid decomposable group which is decomposed by the action of an acid generated from the acid generator to form an alkali soluble group (for example, see Patent Document 1). When the base resin is an acrylic resin, as the acid decomposable group, in general, resins in which the carboxy group of (meth)acrylic acid or the like is protected with an acid dissociable group such as a tertiary alkyl group or an acetal group are used.

In a positive tone development process using a positive type, chemically amplified resist composition (i.e., a chemically amplified resist composition which exhibits increased alkali solubility in an alkali developing solution upon exposure) in combination with an alkali developing solution, as described above, the exposed portions of the resist film are dissolved and removed by an alkali developing solution to form a resist pattern. The positive tone process is advantageous over a negative tone development process in which a negative type, chemically amplified resist composition is used in combination with an alkali developing solution in that the structure of the photomask can be simplified, a satisfactory contrast for forming an image can be reliably obtained, and the characteristics of a resist pattern to be formed are excellent. For these reasons, currently, positive tone development process is tended to be mainly used in the formation of an extremely fine resist pattern.

As a lithography technique which has been recently proposed, a double patterning process is known in which patterning is conducted two or more times to form a resist pattern (for example, see Non-Patent Documents 1 and 2). According to the double patterning process, a resist pattern with a high level of resolution can be formed, as compared to the case where a resist pattern is formed by a single lithography step (namely, a single patterning process), even when a light source with the same exposure wavelength is used, or even when the same resist composition is used. Furthermore, double patterning process can be conducted using a conventional exposure apparatus. There are several different types of double patterning process, for example, (1) a method in which a lithography step (containing operation from application of resist compositions, exposure and developing) and an etching step are performed twice or more to form a pattern and (2) a method in which the lithography step is successively performed twice or more.

According to the double patterning process, for example, a first resist pattern is formed on a substrate by forming a resist film using a first resist composition and patterning the resist film, and then a resist film is formed using a second resist composition on the substrate on which the first resist pattern has been formed, followed by patterning of the resist film. As a result, a resist pattern can be formed with a higher level of resolution than that of the resist pattern formed through one single patterning process.

Furthermore, for example, by using SWT (side wall transfer) process in which an $SiO_2$ film or an $Si_3N_4$ film is used as a sacrificial film and a mask is formed on both sides of the side walls of a pattern, patterning can be conducted with finer pitch than that of a resist pattern obtained by exposure and development of a resist film (see Patent Document 2). In this method, firstly a sacrificial film composed of an $SiO_2$ film is subjected to etching and patterning using a resist pattern. Then, an $Si_3N_4$ film is formed on the $SiO_2$ film pattern. Next, the $Si_3N_4$ film is subjected to etching such that the $Si_3N_4$ film remains only on a side wall portion of the $SiO_2$ film. Thereafter, wet-etching is conducted to remove the $SiO_2$ film, and the underlayer is subjected to etching using the remaining $Si_3N_4$ film as a mask.

However, when a double patterning process recited in non-Patent Documents 1 and 2 is applied, there is a problem that the number of steps is increased, and steps become complicated with high production cost, and productivity is decreased. In addition, the conventional SWT process as in Patent Document 2 needs wet-etching step, and therefore, both dry-etching and wet-etching are required. As a result, the SWT process is complicated. As a method of forming a pattern in simple process and low production cost, methods are disclosed in Patent Documents 3 and 4. Specifically, a method in which a photo resist film is subjected to exposure and development to obtain a first pattern, then an $SiO_2$ film is formed on the obtained first pattern composed of a photo resist film, and next, the $SiO_2$ film is subjected to etching such that the $SiO_2$ film remains only on a side wall portion of the first pattern, and then the first pattern composed of a photo resist film is removed thereby forming a second pattern composed of the $SiO_2$ film, is disclosed in Patent Documents 3 and 4.

DOCUMENTS OF RELATED ART

Patent Document

[Patent Document 1] Japanese Unexamined Patent Application, First Publication No. 2003-241385
[Patent Document 2] Japanese Unexamined Patent Application, First Publication No. 2007-043156
[Patent Document 3] Japanese Unexamined Patent Application, First Publication No. 2009-99938
[Patent Document 4] Japanese Unexamined Patent Application, First Publication No. 2009-88085

Non-Patent Documents

[Non-Patent Document 1] Proceedings of SPIE (U.S.), vol. 5256, pp. 985-994 (2003)
[Non-Patent Document 2] Proceedings of SPIE (U.S.), vol. 6153, pp. 615301-1-19 (2006)

SUMMARY OF THE INVENTION

As described above, the methods recited in Patent Documents 3 and 4 is able to produce fine pattern in a simple manner with solving the problem of double patterning process or SWT process. However, the methods recited in Patent Documents 3 and 4 have a room for improvement in uniformity of a second pattern obtained as a final product, in particular, in uniformity of a line width in the case of a line pattern.

The present invention takes the above circumstances into consideration, with an object of providing a method of forming a pattern capable of forming a fine pattern having an excellent uniformity, with simple process, low production cost and improved productivity.

As a result of intensive studies of the present inventors, they have found that by improving Line Width Roughness (hereafter, frequently referred to as "LWR") in a first pattern composed of a resist film, uniformity of a second pattern can be improved, and found that by using a specific resist composition for forming a first pattern, LWR of a first pattern can be improved. The present invention has been completed based on this finding. LWR refers to the phenomenon in which the line width of a line pattern formed using a resist composition lacks uniformity, and improvement of LWR becomes more important as the pattern becomes finer.

The method of forming a pattern according to the present invention relates to a method containing: a first pattern forming step in which a resist composition is applied to a substrate to form a resist film, and then the resist film is subjected to exposure and development, thereby forming a first pattern containing the resist film;

a film forming step in which an $SiO_2$ film is formed on the surface of the first pattern and the substrate;

an etching step in which the $SiO_2$ film is subjected to etching such that the $SiO_2$ film remains only on a side wall portion of the first pattern; and a second pattern forming step in which the first pattern is removed, thereby forming a second pattern containing the $SiO_2$ film, wherein the resist composition includes a base component (A) which exhibits changed solubility in a developing solution by the action of acid, and an acid generator component (B) which generates acid upon exposure, and the base component (A) contains a resin component (A1) having a structural unit (a1') having an acid decomposable group that exhibits increased polarity by the action of acid and has no polycyclic group.

In the present description and claims, the term "aliphatic" is a relative concept used in relation to the term "aromatic", and defines a group or compound that has no aromaticity.

The term "alkyl group" includes linear, branched or cyclic, monovalent saturated hydrocarbon, unless otherwise specified.

The term "alkylene group" includes linear, branched or cyclic, divalent saturated hydrocarbon, unless otherwise specified. The same applies for the alkyl group within an alkoxy group.

A "halogenated alkyl group" is a group in which part or all of the hydrogen atoms of an alkyl group is substituted with a halogen atom. Examples of the halogen atom include a fluorine atom, a chlorine atom, a bromine atom and an iodine atom.

A "fluorinated alkyl group" or a "fluorinated alkylene group" is a group in which part or all of the hydrogen atoms of an alkyl group or an alkylene group have been substituted with fluorine atom(s).

The term "structural unit" refers to a monomer unit that contributes to the formation of a polymeric compound (resin, polymer, copolymer).

The term "exposure" is used as a general concept that includes irradiation with any form of radiation.

According to the present invention, there is provided a method of forming a pattern capable of forming a fine pattern having an excellent uniformity, with simple process, low production cost and improved productivity.

DETAILED DESCRIPTION OF THE INVENTION

<<Method of Forming a Resist Pattern>>

A method of forming a pattern of the present invention contains: (1) a first pattern forming step in which a resist composition is applied to a substrate to form a resist film, and the resist film is subjected to exposure and development to form a first pattern composed of the resist film; (2) a film forming step in which an $SiO_2$ film is formed on the surface of the first pattern; (3) an etching step in which the $SiO_2$ film is subjected to etching such that the $SiO_2$ film remains only on a side wall portion of the first pattern; and (4) a second pattern forming step in which the first pattern is removed, thereby forming a second film composed of the $SiO_2$ film.

In this embodiment, a resist composition containing a base component which exhibits changed solubility in a developing solution by the action of acid and an acid generator component which generates acid upon exposure is used.

Hereinbelow, the method of forming a pattern according to the present invention will be described, with reference to the drawings. However, the present invention is not limited to these embodiments.

FIG. 1A to FIG. 1F show an example of one embodiment of the method of forming a pattern according to the present invention.

In this embodiment, a positive resist composition containing a base component which exhibits increased solubility in a developing solution by the action of acid and an acid generator component which generates acid upon exposure is used.

In the present specification, a resist composition which forms a positive resist pattern by dissolving and removing the exposed portions is called a positive resist composition, and a resist composition which forms a negative resist pattern by dissolving and removing the unexposed portions is called a negative resist composition.

Figure 1A:
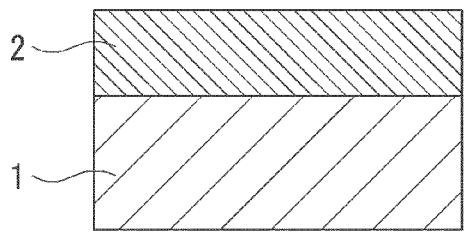
FIG. 1A is a cross-sectional diagram showing an example of one embodiment of the method of forming a pattern according to the present invention.

Firstly, as shown in FIG. 1A, a specific positive resist composition is applied to a substrate 1 to form a resist film 2 (FIG. 1A).

Figure 1B:
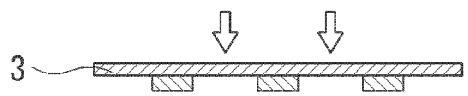
FIG. 1B is a cross-sectional diagram showing an example of one embodiment of the method of forming a pattern according to the present invention.
Figure 1B:
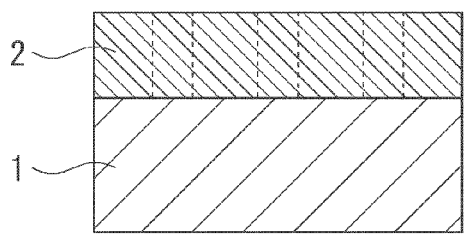

Next, as shown in FIG. 1B, the resist film 2 is subjected to exposure through a photomask 3 having a predetermined pattern formed thereon. As a result, in the exposed region (exposed portions) of the resist film 2, acid is generated from the component (B) upon exposure (FIG. 1B).

Figure 1C:
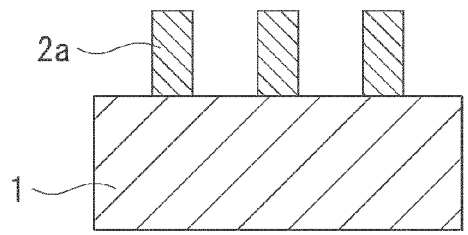
FIG. 1C is a cross-sectional diagram showing an example of one embodiment of the method of forming a pattern according to the present invention.
Figure 1D:
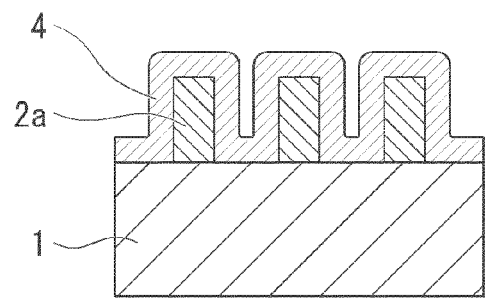
FIG. 1D is a cross-sectional diagram showing an example of one embodiment of the method of forming a pattern according to the present invention.

After exposure, baking (post exposure bake (PEB)) is conducted, followed by alkali development. By conducting development, the unexposed portions 2a of the resist film 2a remains, and the exposed portions of the resist film 2 are dissolved and removed by an alkali developing solution. As a result, as shown in FIG. 1C, a first pattern 2a composed of the unexposed portions 2a is formed on the substrate 1 (FIG. 1C; step (1)).

Thereafter, an $SiO_2$ film 4 is formed on the surface of the first pattern 2a and the substrate 1 thereby coating the first pattern 2a. As a result, a coating pattern is formed on the first pattern 2a and the substrate 1 (FIG. 1D; step (2)).

Figure 1E:
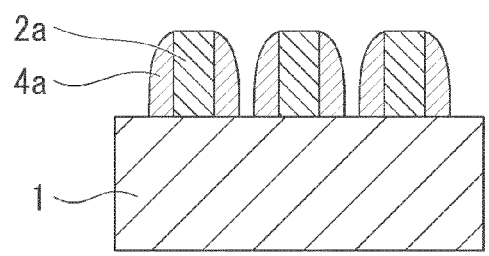
FIG. 1E is a cross-sectional diagram showing an example of one embodiment of the method of forming a pattern according to the present invention.
Figure 1F:
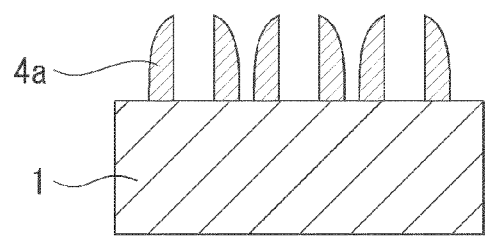
FIG. 1F is a cross-sectional diagram showing an example of one embodiment of the method of forming a pattern according to the present invention.

After forming the $SiO_2$ film 4, the $SiO_2$ film 4 is subjected to etching such that the $SiO_2$ film 4 remains only on a side wall portion of the first pattern 2a and a top of the first pattern 2a is revealed (exposed) (FIG. 1E; step (3)), and then the first pattern 2a is removed. As a result, as shown in FIG. 1F, a second pattern 4a composed of the $SiO_2$ film is formed on the substrate 1 (step (4)).

Each of these steps will be described.

[Step (1)]

The substrate 1 is not specifically limited and a conventionally known substrate can be used. For example, substrates for electronic components, and such substrates having wiring patterns formed thereon can be used. Specific examples of the material of the substrate include metals such as silicon wafer, copper, chromium, iron and aluminum; and glass. Suitable materials for the wiring pattern include copper, aluminum, nickel, and gold.

Further, as the substrate 1, any one of the above-mentioned substrates provided with an inorganic and/or organic film on the surface thereof may be used, and a substrate provided with an organic film on the surface thereof is preferred. As the inorganic film, an inorganic antireflection film (inorganic BARC) can be used. As the organic film, an organic antireflection film (organic BARC) and an organic film such as a lower-layer organic film used in a multilayer resist method can be used. When an organic film is provided, a pattern can be formed on the substrate with a high aspect ratio, and is useful in the production of semiconductors.

Here, a "multilayer resist method" is a method in which at least one layer of an organic film (lower-layer film) and at least one layer of a resist film are provided on a substrate, and a resist pattern formed on the upper resist film is used as a mask to conduct patterning of the lower-layer film. This method is considered as being capable of forming a pattern with a high aspect ratio. The multilayer resist method is broadly classified into a method in which a double-layer structure consisting of an upper-layer resist film and a lower-layer film is formed, and a method in which a multilayer structure having at least three layers consisting of an upper-layer resist film, a lower-layer film and at least one intermediate layer (thin metal film or the like) provided between the upper-layer resist film and the lower-layer film. In the multilayer resist method, a desired thickness can be ensured by the lower-layer film, and as a result, the thickness of the resist film can be reduced, and an extremely fine pattern with a high aspect ratio can be formed.

An inorganic film can be formed, for example, by coating an in organic anti-reflection film composition such as a silicon-based material (e.g., an SOG film material, an SiON film material, and the like) on a substrate, followed by baking.

An organic film can be formed, for example, by dissolving a resin component and the like for forming the film in an organic solvent to obtain an organic film forming material, coating the organic film forming material on a substrate using a spinner or the like, and baking under heating conditions preferably in the range of 200 to 300° C. for 30 to 300 seconds, more preferably for 60 to 180 seconds. The organic film forming material does not need to have susceptibility to light or electron beam like a resist film, and the organic film forming material may or may not have such susceptibility. More specifically, a resist or a resin generally used in the production of a semiconductor device or a liquid crystal display device can be used.

Further, it is preferable that the organic film forming material can be subjected to etching, particularly dry etching, so that, by etching the organic film using a resist pattern, the resist pattern can be transferred to the organic film, and an organic film pattern can be formed. It is particularly desirable to use an organic film forming material which can be subjected to oxygen plasma etching or the like. As such an organic film forming material, a material conventionally used for forming an organic film such as an organic BARC can be used. Examples of such an organic film forming material include the ARC series manufactured by Brewer Science Ltd., the AR series manufactured by Rohm and Haas Company, and the SWK series manufactured by Tokyo Ohka Kogyo Co., Ltd.

In this embodiment, as a resist composition, a positive resist composition which generates acid upon exposure and exhibits increased solubility in an alkali developing solution by the action of acid is used, but the resist composition of the present invention does not limited for a positive type. Specific examples of the resist composition are described later in detail.

The method of applying a resist composition to a substrate 1 to form a resist film 2 is not particularly limited, and a resist film 2 can be formed by a conventional method. For example, a resist composition can be applied to a substrate 1 by a conventional method using a spincoat or a spinner or the like to form a coating film, followed by drying, thereby forming a resist film 2.

As the drying method of a coating film, any method by which organic solvents (resist solvent) can be vaporized from the coating film can be applied. For example, a method of conducting prebake (PAB) can be mentioned.

The prebake temperature is preferably 70 to 140° C., more preferably 70 to 130° C., and still more preferably 70 to 120° C.

The prebake time is preferably 40 to 120 seconds, and more preferably 60 to 90 seconds.

The thickness of a resist film 2 is preferably 50 to 500 nm, and more preferably 50 to 450 nm. By ensuring that the thickness of the resist film 2 satisfies the above-mentioned range, a resist pattern with a high level of resolution can be formed.

With respect to the exposure dose, an amount capable of increasing solubility of the resist film 2 in an alkali developing solution at exposed portions 2a of a resist film 2 is sufficient.

The wavelength to be used for exposure is not particularly limited and the exposure can be conducted using radiation such as KrF excimer laser, ArF excimer laser, $F_2$ excimer laser, extreme ultraviolet rays (EUV), vacuum ultraviolet rays (VUV), electron beam (EB), X-rays, and soft X-rays. In terms of forming a fine resist pattern, ArF excimer laser, EUV or EB is preferable, and ArF excimer laser is particularly desirable.

The photomask 3 is not particularly limited, and a conventional mask can be used. For example, a binary mask in which the transmittance of the light shielding portion is 0% or a halftone-phase shift mask (HT-mask) in which the transmittance of the light shielding portion is 6% can be used. The unexposed portions can be selectively formed by using a halftone-phase shift mask.

As a binary mask, those in which a chromium film, a chromium oxide film, or the like is formed as a light shielding portion on a quartz glass substrate are generally used.

A phase shift mask is a photomask provided with a portion (shifter) which changes the phase of light. Thus, by using a phase shift mask, incidence of light to unexposed portions can be suppressed, and the dissolution contrast to an alkali developing solution can be improved between unexposed portions and exposed portions. As a phase shift mask other than a halftone-phase shift mask, a Levenson-phase shift mask can be mentioned. As any of these phase shift masks, commercially available masks can be used.

Specific examples of the half-tone type phase shift masks include those in which an MoSi (molybdenum silicide) film, a chromium film, a chromium oxide film, an oxynitriding silicon film, or the like is formed as a light shielding portion (shifter) exhibiting a transmittance of about several % to 10% (generally 6%) on a substrate generally made of quartz glass.

In the present embodiment, exposure is conducted through a photomask 3, but the present invention is not limited to this embodiment. For example, the exposure may be conducted without using a mask, e.g., selective exposure by drawing with electron beam (EB) or the like.

The exposure of the resist film 2 can be either a general exposure (dry exposure) conducted in air or an inert gas such as nitrogen, or immersion exposure (immersion lithography) through an immersion medium. In terms of forming a resist pattern with a high resolution, it is preferable to conduct exposure through an immersion medium.

In immersion lithography, exposure (immersion exposure) is conducted in a state where the region between the lens and the resist film 2 formed on the substrate 1 (which was conventionally filled with air or an inert gas such as nitrogen) is filled with a solvent (a immersion medium) that has a larger refractive index than the refractive index of air.

More specifically, in immersion lithography, the region between the resist film 2 formed in the above-described manner and lens at the lowermost portion of the exposure apparatus is filled with a solvent (an immersion medium) that has a larger refractive index than the refractive index of air, and in this state, the resist film 2 is subjected to exposure (immersion exposure) through a predetermined photomask 3.

The immersion medium preferably exhibits a refractive index larger than the refractive index of air but smaller than the refractive index of the resist film 2 to be subjected to immersion exposure. The refractive index of the immersion medium is not particularly limited as long at it satisfies the above-mentioned requirements.

Examples of this immersion medium which exhibits a refractive index that is larger than the refractive index of air but smaller than the refractive index of the resist film 2 include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which have a boiling point within a range from 70 to 180° C. and preferably from 80 to 160° C. A fluorine-based inert liquid having a boiling point within the above-mentioned range is advantageous in that the immersion medium after the exposure can be removed by a simple method.

As a fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point 102° C.), and an example of a suitable perfluoroalkylamine compound is perfluorotributylamine (boiling point 174° C.).

In the present embodiment, after exposure, baking (post exposure bake (PEB)) is conducted.

In the baking, the temperature conditions is preferably from 50 to 200° C., more preferably from 70 to 140° C., and still more preferably from 70 to 120° C. The baking time is preferably from 10 to 300 seconds, more preferably from 40 to 120 seconds, and still more preferably from 60 to 90 seconds.

In this manner, by conducting baking of the resist film 2 after exposure, at the exposed portions of the resist film 2, the solubility of the base component in an alkali developing solution can be increased by the action of the acid generated from an acid generator component. On the other hand, at unexposed portions 2a of the resist film 2, acid does not generated, and the solubility of the base component in alkali developing solution is unchanged. As a result, a difference in the dissolution rate in an alkali developing solution (dissolution contrast) occurs between the exposed portions 2a and the unexposed portions 2b.

In the present embodiment, after exposure and baking, by conducting alkali developing, the exposed portions of the resist film 2 are dissolved and removed, and the unexposed portions 2a remain, thereby forming a positive resist pattern.

Specific examples of the alkali developing solution include inorganic alkalis, such as sodium hydroxide, potassium hydroxide, sodium carbonate, sodium silicate, sodium metasilicate and aqueous ammonia; primary amines, such as ethylamine and n-propyl amine; secondary amines, such as diethylamine and di-n-butylamine; tertiary amines, such as triethylamine and methyldiethylamine; alcoholamines, such as dimethylethanolamine and triethanolamine; quaternary ammonium salts, such as tetramethylammonium hydroxide and tetraethylammonium hydroxide; and cyclic amines, such as pyrrole and piperidine.

Among these examples, as the alkali developing solution, an aqueous alkali solution containing at least one member selected from the group consisting of primary amines, secondary amines, tertiary amines and quaternary ammonium salts is preferable, and an aqueous solution of tetramethylammonium hydroxide (TMAH) is particularly desirable.

Further, the aforementioned aqueous alkali solution having alcohols, surfactants added thereto in an appropriate amount may be used.

In general, the alkali concentration within the alkali developing solution (i.e., concentration of inorganic alkalis, quaternary ammonium salts or amine compounds, based on the total weight of the alkali developing solution) is from 0.01 to 20% by weight.

The alkali developing treatment can be conducted by a conventional method.

After the alkali developing, a rinse treatment using pure water or the like can be conducted.

Further, after the alkali developing, post bake treatment may be conducted. Post bake (which is performed in order to remove water content after the alkali developing and rinsing) is generally conducted at about 100° C. preferably for 30 to 90 seconds.

A first pattern 2a obtained by the aforementioned step (1) is formed by a specific resist composition, and therefore, has excellent lithography properties and excellent uniformity.

A first pattern 2a obtained by the aforementioned step (1) may be subjected to slimming treatment prior to step (2).

Here, the term "slimming treatment" means a treatment for narrowing a width of a pattern portion of a first pattern 2a. For example, when the first patter 2a is a line and space pattern (LS pattern), the line width of a pattern portion can be narrowed by slimming treatment. By conducting slimming treatment after step (1), non-pattern portions (corresponding to space portions in the case of LS pattern) of a second pattern described later, which is formed on a side wall portion of the first pattern 2a, can be narrowed.

The slimming treatment can be conducted by a normal method such as oxygen plasma etching or the like. Furthermore, the exposure dose can be controlled during the slimming treatment.

When a substrate 1 on which an organic film has been formed is used, etching of the organic film may be conducted using a first pattern 2a or a first pattern 2a after slimming treatment as a mask, as well as a slimming treatment of the first pattern. By conducting etching of the organic film, an aspect ratio of a pattern obtained in step (1) can be enhanced.

[Step (2)]

A method of forming an $SiO_2$ film 4 does not particularly limited, as long as an $SiO_2$ film 4 can be formed on a first pattern 2a and a substrate 1, and an ALD (Atomic Layer Deposition) method or a chemical vapor deposition method using an activated gas of a raw material is preferably applied. By applying these methods, an $SiO_2$ film 4 can be formed with uniform thickness on the entire surface of a first pattern 2a and a substrate 1. As a result, a coating pattern composed of an $SiO_2$ film 4 can be formed on a first pattern 2a and a substrate 1.

The gas as a raw material does not particularly limited, and a compound containing silicon such as silane compounds and silicates can be used.

In the case of an ALD method, precursors of silicone sources (e.g., BTBAS (Bis(tertiary-butylamino)silane) are deposited on a substrate to be processed, and then the substrate is exposed to oxygen plasma thereby forming a silicon oxide film at the molecular level. By repeating this process step arbitrary number of times, a predetermined film thickness can be obtained. A proper temperature during forming an $SiO_2$ film is in the range from room temperature (23° C.) to 200° C.

Chemical vapor deposition can be conducted by a normal method. Further, it is preferable to form an $SiO_2$ film 4 by a catalytic chemical vapor deposition method using a heated catalyst. By using a heated catalyst, a film can be formed at low temperature, so that the shape of a first pattern 2a composed of a resist film which is formed under an SiO$_2$ film 4 would not be deteriorated by heat.

The thickness of an SiO$_2$ film 4 corresponds to the width of a second pattern 4a obtained by step (4). In the case where a first pattern 2a and a second pattern 4a are LS patterns, the thickness of an SiO$_2$ film 4 corresponds to the line width. Therefore, the thickness of an SiO$_2$ film can be appropriately selected depending on the pattern to be obtained finally.

Among these, for example, in the case where a first pattern 2a is an LS pattern, the thickness of an SiO$_2$ pattern is preferably thinner than the width of a space portion of the LS pattern. By the thickness of an SiO$_2$ pattern being thinner than the width of a space portion or the width of a line portion, a finer second pattern 4a than the first pattern 2a can be formed. Specifically, the thickness of SiO$_2$ film is preferably 5 to 40 nm, more preferably 5 to 30 nm. By ensuring that the thickness of the resist film satisfies the above-mentioned range, a resist pattern with a high level of resolution can be formed.

For example, in the case where a second pattern 4a is an LS pattern having a line width of 10 to 20 nm, the thickness of an SiO$_2$ film 4 is preferably 5 to 20 nm.

In this case, the space width after forming a first pattern or after slimming treatment of a first pattern as indicated in FIG. 1C is more than twice the line width of a second pattern 4a, and is preferably 15 to 70 nm.

In addition, in the case where a second pattern 4a is an LS pattern having a line width in the range from greater than 20 nm to 40 nm, the thickness of an SiO$_2$ film 4 is preferably 10 to 30 nm.

In this case, the space width after forming a first pattern or after slimming treatment of a first pattern as indicated in FIG. 1C is more than twice the line width of a second pattern 4a, and is preferably 25 to 100 nm.

[Step (3)]

As indicated in FIG. 1E, an SiO$_2$ film 4 is subjected to etching such that the SiO$_2$ film 4 remains only on a side wall portion of the first pattern 2a. With respect to the SiO$_2$ film 4, portions formed on the top of a first pattern 2a and portions formed directly on a substrate on which a first pattern 2a has not been formed are removed, and the SiO$_2$ film 4 remains only on a side wall portion of the first pattern 2a.

A method of etching is not particularly limited, and a conventional method can be applied. Among these, dry etching is preferable. Among dry etching, especially in terms of production efficiency, etching using gas containing a CF-based gas such as $CF_4$, $C_4F_8$, $CHF_3$, $CH_3F$ or $CH_2F_2$ is preferable, and etching using a mixture of the CF-based gas and Ar gas or oxygen gas is particularly desirable. A proper temperature during dry etching is in the range from 30 to 100° C.

The degree and time of etching can be appropriately determined based on the thickness of an SiO$_2$ film 4 or based on the type of gas used for etching such that an SiO$_2$ film 4 remains only on a side wall portion of the first pattern 2a.

[Step (4)]

In this embodiment, a first pattern 2a exposing the top after the aforementioned step (3) is removed, thereby forming a second pattern 4a composed of an SiO$_2$ film on the substrate 1.

The method of removing a first pattern 2a is not particularly limited as long as only a fist pattern 2a can be removed selectively, and a normal method such as ashing using oxygen plasma can be applied. A proper temperature during removing a first pattern is in the range from 30 to 100° C.

As above, a method of forming a pattern according to the present invention is described with embodiments. However, the present invention is not limited to these embodiments.

For example, in the aforementioned embodiment, a positive resist composition used as a resist composition is exemplified. But a negative resist composition may be used instead of the positive resist composition. The resist compositions are described later in detail. As a negative resist composition, a resist composition including a base component that exhibits decreased solubility in a developing solution by the action of acid and an acid generator component that generates acid upon exposure can be used.

When a negative resist composition is used, a pattern of the present invention can be formed in the same manner as in the aforementioned steps (2) to (4), except that unexposed portions are dissolved and removed by development thereby forming a first pattern composed of exposed portions of a resist film in the aforementioned step (1).

According to the method of forming a pattern of the present invention, by using a combination of a first pattern 2a and an SiO$_2$ film 4, a fine pattern can be formed with simple process, low production cost and improved productivity.

Furthermore, according to the method of forming a pattern of the present invention, by using a specific resist composition described later to form a first pattern, a first pattern can be formed with excellent uniformity. As a result, in the aforementioned steps (3) and (4), a second pattern can be formed with excellent uniformity as a fine pattern along the side wall portion of the first pattern.

The reason why these effects can be achieved has not been elucidated yet, but the following is presumed. The resist composition used in the method of forming a pattern of the present invention contains a structural unit (a1') having an acid decomposable group which does not have a polycyclic group. The structural unit (a1') has a chain-like or monocyclic acid decomposable group, and the volume of an acid decomposable group or acid dissociable group is relatively small. By virtue of the small volume of an acid dissociable group after dissociation from a base component at exposed portions, at exposed portions of a resist film, voids formed in the resist film by the dissociation of the acid dissociable group have a small volume, and therefore, change in the volume of the resist film before and after the dissociation of the acid dissociable group by the action of acid (i.e., before and after exposure) can be suppressed, and roughness on the first pattern can be reduced. As a result, roughness on the second pattern which is formed on the first pattern can be also reduced.

Furthermore, by virtue of the small volume of the acid dissociable group which is dissociated from a base component, the dissociated residue is likely to volatile during baking after exposure. Therefore, the dissociated residue caused by dissociation of the acid dissociable group at exposed portions of the resist film is less likely to remain in the resist film, and therefore, the fine resist film can be formed after development, and roughness on the first pattern can be reduced.

{Resist Composition}

In the method of forming a resist pattern according to the present invention, a resist composition which includes at least a base component (A) (hereafter, frequently referred to as "component (A)") which exhibits changed solubility in a developing solution by the action of acid, and an acid generator component (B) (hereafter, frequently referred to as "component (B)") which generates acid upon exposure.

With respect to a resist film formed using the resist composition, when a selective exposure is conducted during formation of a resist pattern, acid is generated from the component (B), and the generated acid acts on the component (A) to change the solubility of the component (A) in a developing solution. As a result, the solubility of the exposed portions in a developing solution is changed, whereas the solubility of the unexposed portions in a developing solution remains unchanged. Therefore, the exposed portions are dissolved and removed by developing in the case of a positive pattern, whereas the unexposed portions are dissolved and removed in the case of a negative pattern, and hence, a resist pattern can be formed.

The resist composition of the present invention may be either a negative resist composition or a positive resist composition.

Further, in the formation of a resist pattern, the resist composition of the present invention can be applied to either an alkali developing process using an alkali developing solution in the developing treatment, or a solvent developing process using a developing solution containing an organic solvent (organic developing solution) in the developing treatment.

<Component (A)>

The component (A) is a base component which exhibits changed solubility in a developing solution by the action of acid, and includes a resin component (A1) which has a structural unit (a1') having an acid decomposable group that exhibits increased polarity by the action of acid and has no polycyclic group.

The term "base component" refers to an organic compound capable of forming a film, and is preferably an organic compound having a molecular weight of 500 or more. When the organic compound has a molecular weight of 500 or more, the film-forming ability is improved, and a resist pattern of nano level can be easily formed.

The "organic compound having a molecular weight of 500 or more" which can be used as a base component is broadly classified into non-polymers and polymers.

In general, as a non-polymer, any of those which have a molecular weight in the range of no less than 500 to less than 4,000 is used. Hereafter, a non-polymer having a molecular weight in the range of 500 to less than 4,000 is referred to as a low molecular weight compound.

As a polymer, any of those which have a molecular weight of 1,000 or more is generally used. Hereafter, a polymer having a molecular weight of 1,000 or more is referred to as a polymeric compound. With respect to a polymeric compound, the "molecular weight" is the weight average molecular weight in terms of the polystyrene equivalent value determined by gel permeation chromatography (GPC). Hereafter, a polymeric compound is frequently referred to simply as a "resin".

[Component (A1)]

The component (A1) may be either a component that exhibits increased solubility in a developing solution under the action of acid, or may be a component that exhibits decreased solubility in a developing solution under the action of acid.

When the resist composition used in the method of the present invention is a resist composition which forms a negative resist pattern in an alkali developing process and which forms a positive resist pattern in a solvent developing process, for example, as the component (A1), a polymeric compound that exhibits solubility in an alkali developing solution (hereafter, frequently referred to as "component (A1-2)") is used, and a cross-linking agent is blended in the resist composition.

Generally, the component (A1-2) contains alkali soluble groups such as a hydroxy group, a carboxy group and an amino group. As the cross-linking agent, a compound containing reactive groups such as a methylol group or alkoxymethyl group, which can react with the alkali soluble groups by the action of acid, can be used. Therefore, when a resist film formed using the resist composition is subjected to a selective exposure, acid is generated from the component (B) at exposed portions, and the action of the generated acid causes cross-linking between the component (A1-2) and the cross-linking agent, thereby decreasing the number of alkali soluble groups in the component (A1-2), decreasing polarity, and increasing the molecular weight. As a result, the solubility of the component (A1-2) in an alkali developing solution is decreased (that is, the solubility of the component (A1-2) in an organic developing solution is increased). Therefore, in the formation of a resist pattern, by conducting selective exposure to a resist film formed by applying the resist composition onto a substrate, the exposed portions become insoluble in an alkali developing solution (that is, soluble in an organic developing solution), whereas the unexposed portions remain soluble in an alkali developing solution (that is, insoluble in an organic developing solution), and hence, a negative resist pattern can be formed by alkali developing. In addition, when an organic developing solution is used as a developing solution, a positive resist pattern can be formed.

As the cross-linking agent, typically, an amino-based cross-linking agent such as a glycoluril having a methylol group or an alkoxymethyl group, or a melamine-based cross-linking agent is preferable, as it enables formation of a resist pattern with minimal swelling. The amount of the cross-linking agent added is preferably within a range from 1 to 50 parts by weight, relative to 100 parts by weight of the alkali-soluble resin.

It is noted that in the case that the component (A1-2) is a self-crosslinkable component (for example, in the case that the component (A1-2) has a group which can react with an alkali soluble group by the action of acid), it is not necessary to add a cross-linking agent to the resist composition.

In the case where the resist composition used in the method of the present invention is a resist composition which forms a positive resist pattern in an alkali developing process and which forms a negative resist pattern in a solvent developing process, it is preferable to use a polymeric compound (hereafter, frequently referred to as "component (A1-1)") which exhibits increased polarity by the action of acid, as the component (A1). Since the polarity of the component (A1-1) changes before and after exposure, by using the component (A1-1), an excellent development contrast can be obtained not only in an alkali developing process, but also in a solvent developing process.

More specifically, in the case of applying an alkali developing process, the component (A1-1) is substantially insoluble in an alkali developing solution prior to exposure, but when acid is generated from the component (B) upon exposure, the action of this acid causes an increase in the polarity of the component (A1-1), thereby increasing the solubility of the component (A1-1) in an alkali developing solution. Therefore, in the formation of a resist pattern, by conducting selective exposure of a resist film formed by applying the resist composition to a substrate, the exposed portions change from an insoluble state to a soluble state in an alkali developing solution, whereas the unexposed portions remain insoluble in an alkali developing solution. As a result, by conducting development using an alkali developing solution, a contrast can be made between the exposed portions and unexposed portions, thereby enabling the formation of a positive resist pattern. On the other hand, in the case of a solvent developing process, the component (A1-1) exhibits high solubility in an organic developing solution prior to exposure, and when acid is generated from the component (B) upon exposure, the polarity of the component (A-1) is increased by the action of the generated acid, thereby decreasing the solubility of the component (A1-1) in an organic developing solution. Therefore, in the formation of a resist pattern, by conducting selective exposure of a resist film formed by applying the resist composition to a substrate, the exposed portions changes from an soluble state to an insoluble state in an organic developing solution, whereas the unexposed portions remain soluble in an organic developing solution. As a result, by conducting development using an organic developing solution, a contrast can be made between the exposed portions and unexposed portions, thereby enabling the formation of a negative resist pattern.

In the present invention, as the component (A), a component (A1-1) is preferred. That is, the resist composition used in the method of the present invention is preferably a chemically amplified resist composition which becomes a positive type in the case of an alkali developing process, and a negative type in the case of a solvent developing process.

The component (A1) preferably further includes a structural unit (a2) containing a —$SO_2$— containing cyclic group or a lactone-containing cyclic group, as well as the structural unit (a1') having an acid decomposable group which exhibits increased polarity by the action of acid and has no polycyclic group.

[Structural Unit (a1')]

The structural unit (a1') is a structural unit containing an acid decomposable group which exhibits increased polarity by the action of an acid, and the acid decomposable group does not have a polycyclic group.

The term "acid decomposable group" refers to a group in which at least a part of the bond within the structure thereof is cleaved by the action of an acid.

Examples of acid decomposable groups which exhibit increased polarity by the action of an acid include groups which are decomposed by the action of acid to form a polar group.

Examples of the polar group include a carboxy group, a hydroxy group, an amino group and a sulfo group (—$SO_3H$). Among these, a polar group containing —OH in the structure thereof (hereafter, frequently referred to as "OH-containing polar group") is preferable, a carboxy group or a hydroxy group is more preferable, and a carboxy group is particularly desirable.

Specific examples of an acid decomposable group include a group in which the aforementioned polar group has been protected with an acid dissociable group (such as a group in which the hydrogen atom of the OH-containing polar group has been protected with an acid dissociable group) can be given.

An "acid dissociable group" is a group in which exhibits acid dissociable properties that at least a bond between an acid dissociable group and an atom adjacent to the acid dissociable group is cleaved by the action of acid. It is necessary that the acid dissociable group that constitutes the acid decomposable group is a group which exhibits a lower polarity than the polar group generated by the dissociation of the acid dissociable group. Thus, when the acid dissociable group is dissociated by the action of acid, a polar group exhibiting a higher polarity than that of the acid dissociable group is generated, thereby increasing the polarity. As a result, the polarity of the entire component (A1) is increased. When the polarity of the component (A1) is increased, the solubility in a developing solution is changed relatively. For example, when the developing solution is an alkali developing solution, the solubility of the component (A1) in the developing solution is increased. On the other hand, when the developing solution is an organic developing solution, the solubility of the component (A1) in the developing solution is decreased.

The acid dissociable group is not particularly limited as long as it does not have a polycyclic group, and any of the groups that have been conventionally proposed as acid dissociable groups for the base resins of chemically amplified resists can be used. Generally, groups that form either a cyclic or chain-like tertiary alkyl ester with the carboxyl group of the (meth)acrylic acid, and acetal-type acid dissociable groups such as alkoxyalkyl groups are widely known.

Here, a tertiary alkyl ester describes a structure in which an ester is formed by substituting the hydrogen atom of a carboxyl group with a chain-like or cyclic tertiary alkyl group, and a tertiary carbon atom within the chain-like or cyclic tertiary alkyl group is bonded to the oxygen atom at the terminal of the carbonyloxy group (—C(=O)—O—). In this tertiary alkyl ester, the action of acid causes cleavage of the bond between the oxygen atom and the tertiary carbon atom, thereby forming a carboxy group.

The chain-like or cyclic alkyl group may have a substituent.

Hereafter, for the sake of simplicity, groups that exhibit acid dissociability as a result of the formation of a tertiary alkyl ester with a carboxyl group are referred to as "tertiary alkyl ester-type acid dissociable groups".

Examples of tertiary alkyl ester-type acid dissociable groups include aliphatic branched, acid dissociable groups and aliphatic monocyclic group-containing acid dissociable groups.

The term "aliphatic branched" refers to a branched structure having no aromaticity. The "aliphatic branched, acid dissociable group" is not limited to be constituted of only carbon atoms and hydrogen atoms (not limited to hydrocarbon groups), but is preferably a hydrocarbon group. Further, the "hydrocarbon group" may be either saturated or unsaturated, but is preferably saturated.

As an example of the aliphatic branched, acid dissociable group, for example, a group represented by the formula —C($R^{71}$)($R^{72}$)($R^{73}$) can be given. In the formula, each of $R^{71}$ to $R^{73}$ independently represents a linear alkyl group of 1 to 5 carbon atoms. The group represented by the formula —C($R^{71}$)($R^{72}$)($R^{73}$) preferably has 4 to 8 carbon atoms, and specific examples include a tert-butyl group, a 2-methyl-2-butyl group, a 2-methyl-2-pentyl group and a 3-methyl-3-pentyl group.

Among these, a tert-butyl group is particularly desirable.

The term "aliphatic monocyclic group" refers to a monocyclic group that has no aromaticity.

In the "aliphatic monocyclic group-containing acid dissociable group", the "aliphatic monocyclic group" may or may not have a substituent. Examples of the substituent include an alkyl group of 1 to 5 carbon atoms, an alkoxy group of 1 to 5 carbon atoms, a fluorine atom, a fluorinated alkyl group of 1 to 5 carbon atoms, and an oxygen atom (=O).

The basic ring of the "aliphatic monocyclic group" exclusive of substituents is not limited to a structure consisting of a carbon atom and a hydrogen atom (not limited to hydrocarbon groups), but is preferably a hydrocarbon group. Further, the "hydrocarbon group" may be either saturated or unsaturated, but is preferably saturated.

Further examples of the aliphatic monocyclic group include groups in which one or more hydrogen atoms have been removed from monocycloalkane which may or may not be substituted with an alkyl group of 1 to 5 carbon atoms, a fluorine atom or a fluorinated alkyl group. In these aliphatic monocyclic hydrocarbon groups, part of the carbon atoms constituting the ring may be replaced with an ethereal oxygen atom (—O—).

Examples of aliphatic monocyclic group-containing acid dissociable groups include (i) a monovalent aliphatic cyclic group in which a substituent (a group or an atom other than hydrogen) is bonded to the carbon atom on the ring skeleton to which an atom adjacent to the acid dissociable group (e.g., "—O—" within "—C(=O)—O— group") is bonded to form a tertiary carbon atom; and (ii) a group which has a branched alkylene group containing a tertiary carbon atom, and a monovalent aliphatic monocyclic group to which the tertiary carbon atom is bonded.

In the group (i), as the substituent bonded to the carbon atom to which an atom adjacent to the acid dissociable group on the ring skeleton of the aliphatic monocyclic group is bonded, an alkyl group can be mentioned. Examples of the alkyl group include the same groups as those represented by $R^{14}$ in formula (1-1) described later.

Specific examples of the group (i) include groups represented by general formula (1-1) shown below.

Specific examples of the group (ii) include groups represented by general formula (2-1) shown below.

[Chemical Formula 1]

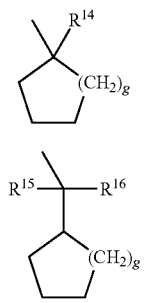

(1-1)

(2-1)

In the formula, $R^{14}$ represents an alkyl group; $R^{15}$ and $R^{16}$ each independently represents an alkyl group; and g represents an integer of 0 to 8.

In formula (1-1), the alkyl group for $R^{14}$ may be linear, branched or cyclic (provided that, monocyclic), and is preferably linear or branched.

The linear alkyl group preferably has 1 to 5 carbon atoms, more preferably 1 to 4, and still more preferably 1 or 2. Specific examples include a methyl group, an ethyl group, an n-propyl group, an n-butyl group and an n-pentyl group. Among these, a methyl group, an ethyl group or an n-butyl group is preferable, and a methyl group or an ethyl group is more preferable.

The branched alkyl group preferably has 3 to 10 carbon atoms, and more preferably 3 to 5. Specific examples of such branched alkyl groups include an isopropyl group, an isobutyl group, a tert-butyl group, an isopentyl group and a neopentyl group, and an isopropyl group is most desirable.

In general formulas (1-1) and (2-1), g is preferably an integer of 0 to 4, more preferably an integer of 1 to 4, and most preferably 1 or 2.

In formula (2-1), as the alkyl group for $R^{15}$ and $R^{16}$, the same alkyl groups as those for $R^{14}$ can be used.

In formulas (1-1) and (2-1), part of the carbon atoms constituting the ring may be replaced with an ethereal oxygen atom (—O—).

Further, in formulas (1-1) and (2-1), one or more of the hydrogen atoms bonded to the carbon atoms constituting the ring may be substituted with a substituent. Examples of the substituent include an alkyl group of 1 to 5 carbon atoms, a fluorine atom and a fluorinated alkyl group.

An "acetal-type acid dissociable group" generally substitutes a hydrogen atom at the terminal of an OH-containing polar group such as a carboxy group or hydroxy group, so as to be bonded with an oxygen atom. The acid acts to break the bond between the acetal-type acid dissociable group and the oxygen atom to which the acetal-type, acid dissociable group is bonded, thereby forming an OH-containing polar group such as a carboxy group or a hydroxy group.

Examples of acetal-type acid dissociable groups include groups represented by general formula (p1) shown below.

[Chemical Formula 2]

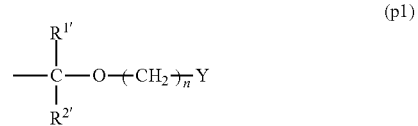

(p1)

In the formula, $R^{1'}$ and $R^{2'}$ each independently represent a hydrogen atom or an alkyl group of 1 to 5 carbon atoms; n represents an integer of 0 to 3; and Y represents an alkyl group of 1 to 5 carbon atoms or an cyclic alkyl group. Alternatively, $R^{1'}$ and Y may independently represent an alkyl group, and the terminal of $R^{1'}$ may be bonded to the terminal of Y to form a ring.

In general formula (p1), n is preferably an integer of 0 to 2, more preferably 0 or 1, and most preferably 0, Specific examples of the alkyl groups of 1 to 5 carbon atoms for $R^{1'}$ and $R^{2'}$ include linear or branched alkyl groups such as a methyl group, an ethyl group, a propyl group, an isopropyl group, an n-butyl group, an isobutyl group, a tert-butyl group, a pentyl group, an isopentyl group and a neopentyl group. Among these examples, a methyl group or an ethyl group is preferable, and a methyl group is particularly desirable.

As the alkyl group of 1 to 5 carbon atoms for Y, the same alkyl groups of 1 to 5 carbon atoms as those above for $R^{1'}$ and $R^{2'}$ can be used.

The cyclic alkyl group for Y preferably has 4 to 15 carbon atoms, more preferably 4 to 12, and most preferably 5 to 10. As examples of the cyclic alkyl group, groups in which one or more hydrogen atoms have been removed from a monocycloalkane which may or may not be substituted with a fluorine atom or a fluorinated alkyl group, may be used. Specific examples include groups in which one or more hydrogen atoms have been removed from a monocycloalkane such as cyclopentane or cyclohexane.

Alternatively, $R^{1'}$ and Y each independently represents an alkyl group of 1 to 5 carbon atoms, the terminal of $R^{1'}$ may be boned to the terminal of Y to form a ring.

In the case, the cyclic group formed by $R^{1'}$ and Y is preferably 4- to 7-membered ring, and more preferably 4- to 6-membered ring. Specific examples of the cyclic group include tetrahydropyranyl group and tetrahydrofuranyl group.

The structural unit (a1') is not particularly limited as long as it has an acid decomposable group which does not have a polycyclic group, and a structural unit which is derived from a compound containing an ethylenic double bond and has an acid decomposable group that does not have a polycyclic group is preferred.

Here, the "structural unit derived from a compound containing an ethylenic double bond" refers to a structural unit in which the ethylenic double bond of the compound containing an ethylenic double bond is cleaved to form a single bond.

Examples of the compound containing an ethylenic double bond include an acrylic acid or ester thereof which may have the hydrogen atom bonded to the carbon atom on the α-position substituted with a substituent, an acrylamide or derivative thereof which may have the hydrogen atom bonded to the carbon atom on the α-position substituted with a substituent, a vinyl aromatic compound which may have the hydrogen atom bonded to the carbon atom on the α-position substituted with a substituent, a cycloolefine or derivative thereof, and a vinyl sulfonate ester and the like. Among these, an acrylic acid or ester thereof which may have the hydrogen atom bonded to the carbon atom on the α-position substituted with a substituent, an acrylamide or derivative thereof which may have the hydrogen atom bonded to the carbon atom on the α-position substituted with a substituent, and a vinyl aromatic compound which may have the hydrogen atom bonded to the carbon atom on the α-position substituted with a substituent are preferable.

An "acrylate ester" refers to a compound in which the terminal hydrogen atom of the carboxy group of acrylic acid ($CH_2$=CH—COOH) has been substituted with an organic group.

In the present specification, an acrylic acid and acrylate ester in which the hydrogen atom bonded to the carbon atom on the α position has been substituted with a substituent are referred to as an "α-substituted acrylic acid" and an "α-substituted acrylate ester", respectively. Further, acrylic acid and α-substituted acrylic acid are collectively referred to as "(α-substituted) acrylic acid", and acrylate esters and α-substituted acrylate esters are collectively referred to as "(α-substituted) acrylate ester".

Examples of the substituent bonded to the carbon atom on the α-position of the α-substituted acrylate or ester thereof include a halogen atom, an alkyl group of 1 to 5 carbon atoms, a halogenated alkyl group of 1 to 5 carbon atoms and a hydroxyalkyl group. With respect to the structural unit derived from an acrylate ester, the α-position (the carbon atom on the α-position) refers to the carbon atom having the carbonyl group bonded thereto, unless specified otherwise.

Examples of the halogen atom as a substituent at the α-position include a fluorine atom, a chlorine atom, a bromine atom and an iodine atom.

Specific examples of the alkyl group of 1 to 5 carbon atoms as a substituent on the α-position include linear or branched alkyl groups such as a methyl group, an ethyl group, a propyl group, an isopropyl group, an n-butyl group, an isobutyl group, a tert-butyl group, a pentyl group, an isopentyl group, and a neopentyl group.

Specific examples of the halogenated alkyl group of 1 to 5 carbon atoms as a substituent on the α-position include groups in which part or all of the hydrogen atoms of the aforementioned alkyl group of 1 to 5 carbon atoms are substituted with halogen atoms. Examples of the halogen atom include a fluorine atom, a chlorine atom, a bromine atom and an iodine atom, and a fluorine atom is particularly preferred.

As the hydroxyalkyl group as a substituent on the α-position, a hydroxyalkyl group of 1 to 5 carbon atoms is preferred. Specific examples include a group in which part or all of the hydrogen atoms of the aforementioned alkyl group of 1 to 5 carbon atoms are substituted with a hydroxy group.

In the present invention, it is preferable that a hydrogen atom, an alkyl group of 1 to carbon atoms or a halogenated alkyl group of 1 to 5 carbon atoms is bonded to the α-position of the (α-substituted) acrylic acid of ester thereof, a hydrogen atom, an alkyl group of 1 to 5 carbon atoms or a fluorinated alkyl group of 1 to 5 carbon atoms is more preferable, and in terms of industrial availability, a hydrogen atom or a methyl group is the most preferred.

The "organic group" refers to a group containing a carbon atom, and may include atoms other than carbon atoms (e.g., a hydrogen atom, an oxygen atom, a nitrogen atom, a sulfur atom, a halogen atom (such as a fluorine atom and a chlorine atom) and the like).

The organic group in (α-substituted) acrylate ester is not particularly limited. Examples thereof include characteristic groups such as an aromatic group, a characteristic group such as an acid decomposable group described above, and a characteristic group-containing group which contains the characteristic group in the structure thereof. Examples of the characteristic group-containing group include a group in which a divalent linking group is bonded to the characteristic group. Examples of the divalent linking group include the same divalent linking groups as those described later for $Y^2$ in the general formula (a1-3).

Examples of aromatic groups include an aryl group which is an aromatic hydrocarbon ring having one hydrogen atom removed therefrom, such as a phenyl group, a biphenyl group, a fluorenyl group, a naphthyl group, an anthryl group or a phenanthryl group; and a heteroaryl group in which a part of the carbon atoms constituting the aforementioned aryl group has been substituted with a hetero atom such as an oxygen atom, a sulfur atom or a nitrogen atom.

The aromatic group may have a substituent such as an alkyl group of 1 to 10 carbon atoms, a halogenated alkyl group, an alkoxy group, a hydroxyl group or a halogen atom. The alkyl group or halogenated alkyl group as a substituent preferably has 1 to 8 carbon atoms, and more preferably 1 to 4 carbon atoms. Further, the halogenated alkyl group is preferably a fluorinated alkyl group. Examples halogen atoms include a fluorine atom, a chlorine atom, an iodine atom and a bromine atom, and a fluorine atom is preferable.

Examples of the "acrylamide and derivative thereof" include an acryl amide which may have the hydrogen atom bonded to the carbon atom on the α-position substituted with a substituent (hereafter, frequently referred to as (α-substituted) acrylamide) and a compound in which one or both of hydrogen atoms at the terminal of the amino group within the (α-substituted) acrylamide have been substituted with a substituent.

As the substituent which may be bonded to the carbon atom on the α-position of an acrylamide or derivatives thereof, the same substituents as those described above for the substituent to be bonded to the carbon atom on the α-position of an α-substituted acrylate ester can be mentioned.

As the substituent with which one or both of hydrogen atoms at the terminal of the amino group within (α-substituted) acrylamide is substituted, an organic group is preferable. The organic group is not particularly limited, and examples thereof include the same groups as described for the organic groups within (α-substituted) acrylate ester.

Examples of the compound in which one or both of hydrogen atom at the terminal of amino group within the (α-substituted) acrylamide have been substituted with a substituent include a compound in which —C(=O)—O— bonded to carbon atom on the α-position of the (α-substituted) acrylate ester is replaced by —C(=O)—N($R^b$)— [in the formula, $R^b$ represents a hydrogen atom or an alkyl group of 1 to 5 carbon atoms].

In the formula, the alkyl group for $R^b$ is preferably a linear or branched alkyl group.

The "vinyl aromatic compound" is a compound having an aromatic ring and one vinyl group bonded to the aromatic ring, and as the examples thereof, a stylene or derivative thereof and a vinylnaphthalene and derivative thereof can be mentioned.

As the substituent which may be bonded to the carbon atom (that is, the carbon atom of the vinyl group, which is bonded to the aromatic ring) on the α-position of a vinyl aromatic compound, the same substituents as those described above for the substituent to be bonded to the carbon atom on the α-position of an α-substituted acrylate ester can be mentioned.

Hereafter, a vinyl aromatic compound in which the hydrogen atom bonded to the carbon atom on the α-position has been substituted with a substituent is frequently referred to as an (α-substituted) vinyl aromatic compound.

Examples of the "styrene and derivative thereof" include a styrene which may have the hydrogen atom bonded to the carbon atom on the α-position substituted with a substituent and may have the hydrogen atom bonded to the benzene ring substituted with a substituent other than the hydroxy group (hereafter, frequently referred to as α-substituted)styrene), a hydroxystyrene which may have the hydrogen atom bonded to the carbon atom on the α-position substituted with a substituent and may have a hydrogen atom bonded to the benzene ring substituted with a substituent other than a hydroxy group (hereafter, frequently referred to as (α-substituted)hydroxystyrene), a compound in which a hydrogen atom of hydroxy group of (α-substituted)hydroxystyrene is substituted with an organic group, a vinylbenzoic acid which may have the hydrogen atom bonded to the carbon atom on the α-position substituted with a substituent and may have a hydrogen atom bonded to the benzene ring substituted with a substituent other than a hydroxy group or carboxy group (hereafter, frequently referred to as (α-substituted)vinylbenzoic acid), and a compound in which a hydrogen atom of carboxy group of α-substituted)vinylbenzoic acid is substituted with an organic group.

A hydroxystyrene is a compound which has one vinyl group and at least one hydroxy group bonded to a benzene ring. The number of hydroxy groups bonded to the benzene ring is preferably 1 to 3, and most preferably 1. The bonding position of the hydroxy group on the benzene ring is not particularly limited. When the number of the hydroxy group is 1, para (4th) position against the bonding position of the vinyl group is preferable. When the number of the hydroxy groups is an integer of 2 or more, an arbitrary combination of the bonding positions can be adopted.

The vinylbenzoic acid is a compound in which one vinyl group is bonded to the benzene ring within the benzoic acid.

The bonding position of the vinyl group on the benzene ring is not particularly limited.

The substituent other than a hydroxy group or a carboxy group which may be bonded to the benzene ring of an styrene or derivative thereof is not particularly limited, and examples thereof include a halogen atom, an alkyl group of 1 to 5 carbon atoms and a halogenated alkyl group of 1 to 5 carbon atoms. Examples of the halogen atom include a fluorine atom, a chlorine atom, a bromine atom and an iodine atom, and a fluorine atom is particularly preferred.

The organic group within a compound in which the hydrogen atom of the hydroxy group within the (α-substituted) hydroxystyrene is substituted with an organic group is not particularly limited, and examples thereof include the same groups as described for the organic groups within (α-substituted) acrylate ester.

The organic group within a compound in which the hydrogen atom of the carboxy group within the (α-substituted) vinylbenzoic acid is substituted with an organic group is not particularly limited, and examples thereof include the same organic groups as those described for the organic group within (α-substituted) acrylate ester.

Examples of the "vinylnaphthalene and derivative thereof" include a vinylnaphthalene which may have the hydrogen atom bonded to the carbon atom on the α-position substituted with a substituent and may have the hydrogen atom bonded to the naphthalene ring substituted with a substituent other than the hydroxy group (hereafter, frequently referred to as (α-substituted) vinyl naphthalene), a vinyl (hydroxynaphthalene) which may have the hydrogen atom bonded to the carbon atom on the α-position substituted with a substituent and may have a hydrogen atom bonded to the naphthalene ring substituted with a substituent other than a hydroxy group (hereafter, frequently referred to as (α-substituted) vinyl(hydroxynaphthalene) and a compound in which a hydrogen atom of hydroxy group within (α-substituted) vinyl(hydroxynaphthalene) is substituted with a substituent.

A vinyl(hydroxynaphthalene) is a compound which has one vinyl group and at least one hydroxy group bonded to a naphthalene ring. The vinyl group may be bonded to the 1st or 2nd position of the naphthalene ring. The number of hydroxy groups bonded to the naphthalene ring is preferably 1 to 3, and particularly preferably 1. The bonding position of the hydroxy group on the naphthalene ring is not particularly limited. When the vinyl group is bonded to the 1st or 2nd position of the naphthalene ring, the hydroxy group is preferably bonded to either one of the 5th to 8th position of the naphthalene ring. In particular, when the number of hydroxy group is 1, the hydroxy group is preferably bonded to either one of the 5th to 7th position of the naphthalene ring, and more preferably the 5th or 6th position. When the number of the hydroxy groups is an integer of 2 or more, an arbitrary combination of the bonding positions can be adopted.

As the substituent which may be bonded to the naphthalene ring of the vinylnaphthalene or derivative thereof, the same substituents as those described above for the substituent which may be bonded to the benzene ring of the (α-substituted) styrene can be mentioned.

The organic group within a compound in which the hydrogen atom of the hydroxy group within the (α-substituted) vinyl(hydroxynaphthalene is substituted with an organic group is not particularly limited, and examples thereof include the same organic groups as those described for the organic group within (α-substituted) acrylate ester.

Examples of the structural unit (a1') include: a structural unit derived from an acrylate ester which may have the hydrogen atom bonded to the carbon atom on the α-position substituted with a substituent and contains an acid decomposable group that has no polycyclic group; a structural unit derived from a hydroxystyrene which may have the hydrogen atom bonded to the carbon atom on the α-position substituted with a substituent and may have the hydrogen atom bonded to the benzene ring substituted with a substituent other than a hydroxy group, and which has the hydrogen atom of the hydroxy group substituted with an acid dissociable group that has no polycyclic group or a substituent having an acid dissociable group that has no polycyclic group; and a structural unit derived from a vinyl(hydroxynaphthalene) which may have the hydrogen atom bonded to the carbon atom on the α-position substituted with a substituent and may have the hydrogen atom bonded to the naphthalene ring substituted with a substituent other than a hydroxy group, and which has the hydrogen atom of the hydroxy group substituted with an acid dissociable group that has no polycyclic group or a substituent having an acid dissociable group that has no polycyclic group. Among these, the structural unit (a11) derived from an acrylate ester which may have the hydrogen atom bonded to the carbon atom on the α-position substituted with a substituent and contains an acid decomposable group that has no polycyclic group is preferable.

[Structural unit (a11)]

The structural unit (a11) is a structural unit derived from an acrylate ester which may have the hydrogen atom bonded to the carbon atom on the α-position substituted with a substituent and contains an acid decomposable group that has no polycyclic group.

Examples of the structural unit (a11) include a structural unit represented by general formula (a1-0-1) shown below and a structural unit represented by general formula (a1-0-2) shown below.

[Chemical Formula 3]

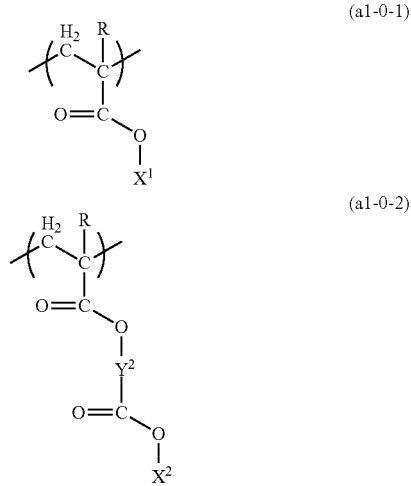

In the formulas, R represents a hydrogen atom, an alkyl group of 1 to 5 carbon atoms or a halogenated alkyl group of 1 to 5 carbon atoms; $X^1$ represents an acid dissociable group; $Y^2$ represents a divalent linking group; and $X^2$ represents an acid dissociable group.

In general formula (a1-0-1), the alkyl group and the halogenated alkyl group for R are respectively the same alkyl group of 1 to 5 carbon atoms and the halogenated alkyl group of 1 to 5 carbon atoms as defined above for a substituent which may be bonded to the carbon atom on the α-position of the aforementioned α-substituted acrylic acid or ester thereof.

R is preferably a hydrogen atom, an alkyl group of 1 to 5 carbon atoms or a fluorinated alkyl group of 1 to 5 carbon atoms, and most preferably a hydrogen atom or a methyl group.

$X^1$ is not particularly limited as long as it is an acid dissociable group that has no polycyclic group. Examples thereof include the aforementioned tertiary alkyl ester-type acid dissociable groups and acetal-type acid dissociable groups, and tertiary alkyl ester-type acid dissociable groups are preferable.

As the polycyclic groups that an acid dissociable group or acid decomposable group do not have, groups in which two or more hydrogen atoms have been removed from a polycycloalkane such as a bicycloalkane, tricycloalkane or tetracycloalkane which may or may not be substituted with an alkyl group of 1 to 5 carbon atoms, a fluorine atom or a fluorinated alkyl group, can be mentioned. Specific examples include groups in which two or more hydrogen atoms have been removed from a polycycloalkane such as adamantane, norbornane, isobornane, tricyclodecane or tetracyclododecane.

In general formula (a1-0-2), R is the same as defined for R in general formula (a1-0-1).

$X^2$ is the same as defined above for $X^1$ in general formula (a1-0-1).

The divalent linking group for $Y^2$ is not particularly limited, and preferable examples thereof include a divalent hydrocarbon group which may have a substituent and a divalent linking group containing a hetero atom.

(Divalent Hydrocarbon Group which May have a Substituent)

The hydrocarbon group as the divalent linking group may be either an aliphatic hydrocarbon group or an aromatic hydrocarbon group.

An "aliphatic hydrocarbon group" refers to a hydrocarbon group that has no aromaticity. The aliphatic hydrocarbon group may be saturated or unsaturated. In general, the aliphatic hydrocarbon group is preferably saturated.

As specific examples of the aliphatic hydrocarbon group, a linear or branched aliphatic hydrocarbon group, and an aliphatic hydrocarbon group containing a ring in the structure thereof can be given.

The linear or branched aliphatic hydrocarbon group preferably has 1 to 10 carbon atoms, more preferably 1 to 8, and still more preferably 1 to 5.

As the linear aliphatic hydrocarbon group, a linear alkylene group is preferable, and specific examples include a methylene group [—$CH_2$—], an ethylene group [—$(CH_2)_2$—], a trimethylene group [—$(CH_2)_3$—], a tetramethylene group [—$(CH_2)_4$—] and a pentamethylene group [—$(CH_2)_5$—].

As the branched aliphatic hydrocarbon group, a branched alkylene group is preferable, and specific examples include alkylalkylene groups, e.g., alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; alkyltrimethylene groups such as —$CH(CH_3)CH_2CH_2$—, and —CH$_2$CH(CH$_3$)CH$_2$—; and alkyltetramethylene groups such as —CH(CH$_3$)CH$_2$CH$_2$CH$_2$—, and —CH$_2$CH(CH$_3$)CH$_2$CH$_2$—. As the alkyl group within the alkylalkylene group, a linear alkyl group of 1 to 5 carbon atoms is preferable.

The linear or branched aliphatic hydrocarbon group may or may not have a substituent (that is, a group or an atom other than hydrogen atom) which substitutes a hydrogen atom in the linear or branched aliphatic hydrocarbon group. Examples of the substituent include a fluorine atom, a fluorinated alkyl group of 1 to 5 carbon atoms, and an oxo group (═O).

As examples of the aliphatic hydrocarbon group containing a ring in the structure thereof, a cyclic aliphatic hydrocarbon group which may have a substituent containing a hetero atom in the ring structure thereof (a group in which two hydrogen atoms have been removed from an aliphatic hydrocarbon ring) and a group in which the cyclic aliphatic hydrocarbon group has been bonded to the terminal of the linear or branched aliphatic hydrocarbon group or interposed within the aforementioned linear or branched aliphatic hydrocarbon group, can be given. Examples of the linear or branched aliphatic hydrocarbon group include the same groups as described above.

The cyclic aliphatic hydrocarbon group preferably has 3 to 20 carbon atoms, and more preferably 3 to 12 carbon atoms.

The cyclic aliphatic hydrocarbon group may be either a polycyclic group or a monocyclic group. As the monocyclic aliphatic hydrocarbon group, a group in which 2 hydrogen atoms have been removed from a monocycloalkane is preferable. The monocycloalkane preferably has 3 to 6 carbon atoms, and specific examples thereof include cyclopentane and cyclohexane. As the polycyclic aliphatic hydrocarbon group, a group in which two hydrogen atoms have been removed from a polycycloalkane is preferable, and the polycyclic group preferably has 7 to 12 carbon atoms. Examples of the polycycloalkane include adamantane, norbornane, isobornane, tricyclodecane and tetracyclododecane.

The cyclic aliphatic hydrocarbon group may or may not have a substituent (that is, a group or an atom other than hydrogen atom) which substitutes a hydrogen atom in the cyclic aliphatic hydrocarbon group. Examples of substituents include an alkyl group, an alkoxy group, a halogen atom, a halogenated alkyl group, a hydroxyl group and an oxo group (═O).

The alkyl group as a substituent is preferably an alkyl group of 1 to 5 carbon atoms, and a methyl group, an ethyl group, a propyl group, an n-butyl group or a tert-butyl group is most desirable.

The alkoxy group as a substituent is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

Examples of the halogen atom as a substituent include a fluorine atom, a chlorine atom, a bromine atom and an iodine atom, and a fluorine atom is preferable.

Examples of the halogenated alkyl group as a substituent include groups in which part or all of the hydrogen atoms within the aforementioned alkyl groups has been substituted with the aforementioned halogen atoms.

Further, part of the carbon atoms constituting the cyclic structure of the cyclic aliphatic hydrocarbon group may be substituted with a hetero atom-containing substituent group.

The hetero atom-containing substituent group is preferably —O—, —C(═O)—O—, —S—, —S(═O)$_2$— or —S(═O)$_2$—O—.

The aromatic hydrocarbon group as a divalent hydrocarbon group is a divalent hydrocarbon group having at least one aromatic ring, and may have a substituent. The aromatic ring is not particularly limited as long as it is a cyclic conjugation ring having 4n+2 of π electrons, and may be a monocyclic or a polycyclic. The aromatic ring preferably has 5 to 30 carbon atoms, more preferably 5 to 20, still more preferably 6 to 15, and particularly preferably 6 to 12. Here, the number of carbon atoms within a substituent(s) is not included in the number of carbon atoms of the aromatic ring. Examples of the aromatic ring include aromatic hydrocarbon rings such as benzene, biphenyl, fluorene, naphthalene, anthracene and phenanthrene and aromatic heterocycles in which part of the carbon atoms of the aromatic hydrocarbon ring have been substituted with a hetero atom. Examples of hetero atoms within the aromatic heterocycle include an oxygen atom, a nitrogen atom, and a sulfur atom. Specific examples of aromatic heterocycles include a pyridine ring and a thiophene ring.

Specific examples of the aromatic hydrocarbon group include a group in which two hydrogen atoms have been removed from the aromatic hydrocarbon ring or aromatic heterocycle (arylene group or heteroarylene group); a group in which two hydrogen atoms have been removed from an aromatic compound having two or more aromatic rings (for example, biphenyl or fluorene); a group in which one hydrogen atom has been removed from the aromatic hydrocarbon group or aromatic heterocycle (aryl group or heteroaryl group) and another one hydrogen atom has been substituted with an alkylene group (for example, a group in which one hydrogen atom has been removed from an aryl group of an arylalkyl group such as a benzyl group, a phenethyl group, a 1-naphthylmethyl group, a 2-naphthylmethyl group, a 1-naphthylethyl group, or a 2-naphthylethyl group).

The alkylene group bonded to the aryl group or heteroaryl group preferably has 1 to 4 carbon atom, more preferably 1 or 2, and most preferably 1.

For example, one or more of the hydrogen atoms in the aromatic hydrocarbon group may be substituted with a substituent. For example, the hydrogen atom bonded to the aromatic ring in the aromatic hydrocarbon group may be substituted with a substituent. Examples of substituents include an alkyl group, an alkoxy group, a halogen atom, a halogenated alkyl group, a hydroxyl group and an oxo group (═O).

The alkyl group as a substituent is preferably an alkyl group of 1 to 5 carbon atoms, and a methyl group, an ethyl group, a propyl group, an n-butyl group or a tert-butyl group is most desirable.

The alkoxy group as a substituent is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

Examples of the halogen atom as a substituent include a fluorine atom, a chlorine atom, a bromine atom and an iodine atom, and a fluorine atom is preferable.

Examples of the halogenated alkyl group as a substituent include groups in which part or all of the hydrogen atoms within the aforementioned alkyl groups has been substituted with the aforementioned halogen atoms.

(Divalent Linking Group Containing a Hetero Atom)

With respect to a divalent linking group containing a hetero atom, a hetero atom is an atom other than carbon and hydrogen, and examples thereof include an oxygen atom, a nitrogen atom, a sulfur atom and a halogen atom.

Specific examples of the divalent linking group containing a hetero atom include non-hydrocarbon linking groups such as —O—, —C(=O)—, —C(=O)—O—, —O—C(=O)—O—, —S—, —S(=O)$_2$—, —S(=O)$_2$—O—, —NH—, —NH—C(=O)—, —NH—C(=NH)— and =N—; and a combination of any one of these non-hydrocarbon linking groups with a divalent hydrocarbon group. As the divalent hydrocarbon group, the same groups as those described above for the divalent hydrocarbon group which may have a substituent can be given, and a linear or branched aliphatic hydrocarbon group is preferable.

The hydrogen atom included in —NH— within —C(=O)—NH—, —NH— or —NH— within —NH—C(=NH)— may be substituted with a substituent such as an alkyl group or an acyl group. The substituent preferably has 1 to 10 carbon atoms, more preferably 1 to 8 carbon atoms, and most preferably 1 to 5 carbon atoms.

As $Y^2$, a linear or branched alkylene group, a cyclic aliphatic hydrocarbon group or a divalent linking group containing a hetero atom is particularly preferable.

When $Y^2$ represents a linear or branched alkylene group, it preferably has 1 to 10 carbon atoms, more preferably 1 to 6, still more preferably 1 to 4, and most preferably 1 to 3. Specific examples include the same linear alkylene groups and branched alkylene groups as those described above for the linear or branched aliphatic hydrocarbon group in the explanation of the "divalent hydrocarbon group which may have a substituent" as a divalent linking group.

When $Y^2$ represents a cyclic aliphatic hydrocarbon group, as the cyclic aliphatic hydrocarbon group, the same cyclic aliphatic hydrocarbon group as those described above for the "aliphatic hydrocarbon group containing a ring in the structure thereof" explained above in relation to the divalent linking group which may have a substituent.

As the cyclic aliphatic hydrocarbon group, a group in which two or more hydrogen atoms have been removed from cyclopentane, cyclohexane, norbornane, isobornane, adamantane, tricyclodecane or tetracyclododecane is particularly desirable.

When $Y^2$ is a divalent linking group containing a hetero atom, preferable examples of the linking group include —O—, —C(=O)—O—, —C(=O)—, —O—C(=O)—O—, —C(=O)—NH— and —NH— (H may be replaced with a substituent such as an alkyl group, an acyl group or the like), —S—, —S(=O)$_2$—, —S(=O)$_2$—O—, a group represented by general formula —$Y^{21}$—O—$Y^{22}$—, —$Y^{21}$—O—, —$Y^{21}$—C(=O)—O—, —[$Y^{21}$—C(=O)—O]$_{m'}$—$Y^{22}$— or —$Y^{21}$—O—C(=O)—$Y^{22}$— [wherein $Y^{21}$ and $Y^{22}$ each independently represents a divalent hydrocarbon group which may have a substituent; O represents an oxygen atom; and m' represents an integer of 0 to 3].

When $Y^2$ represents —NH—, H in —NH— may be substituted with a substituent such as an alkyl group, an acyl group or the like. The substituent (an alkyl group, an acyl group or the like) preferably has 1 to 10 carbon atoms, more preferably 1 to 8, and most preferably 1 to 5.

In the formula —$Y^{21}$—O—$Y^{22}$—, —$Y^{21}$—O—, —$Y^{21}$—C(=O)—O—, —[$Y^{21}$—C(=O)—O]$_{m'}$—$Y^{22}$— or —$Y^{21}$—O—C(=O)—$Y^{22}$—, $Y^{21}$ and $Y^{22}$ each independently represents a divalent linking group which may have a substituent. Examples of the divalent hydrocarbon group include the same divalent hydrocarbon group which may have a substituent as described above in the explanation of the divalent linking group.

As $Y^{21}$, a linear aliphatic hydrocarbon group is preferable, more preferably a linear alkylene group, still more preferably a linear alkylene group of 1 to 5 carbon atoms, and a methylene group or an ethylene group is particularly desirable.

As $Y^{22}$, a linear or branched aliphatic hydrocarbon group is preferable, and a methylene group, an ethylene group or an alkylmethylene group is more preferable. The alkyl group within the alkylmethylene group is preferably a linear alkyl group of 1 to 5 carbon atoms, more preferably a linear alkyl group of 1 to 3 carbon atoms, and most preferably a methyl group.

In the group represented by the formula —[$Y^{21}$—C(=O)—O]$_{m'}$—$Y^{22}$—, m' represents an integer of 0 to 3, preferably an integer of 0 to 2, more preferably 0 or 1, and most preferably 1. Namely, it is particularly desirable that the group represented by the formula —[$Y^{21}$—C(=O)—O]$_{m'}$—$Y^{22}$— is a group represented by the formula —$Y^{21}$—C(=O)—O—$Y^{22}$—. Among these, a group represented by the formula —(CH$_2$)$_{a'}$—C(=O)—O—(CH$_2$)$_{b'}$— is preferable. In the formula, a' is an integer of 1 to 10, preferably an integer of 1 to 8, more preferably an integer of 1 to 5, still more preferably 1 or 2, and most preferably 1. b' is an integer of 1 to 10, preferably an integer of 1 to 8, more preferably an integer of 1 to 5, still more preferably 1 or 2, and most preferably 1.

As the divalent linking group containing a hetero atom for $Y^2$, an organic group which consists of a combination of at least one of non-hydrocarbon groups and a divalent hydrocarbon group can be mentioned. In particular, as the divalent linking group containing a hetero atom, a linear group containing an oxygen atom as the hetero atom e.g., a group containing an ether bond or an ester bond is preferable, and a group represented by the aforementioned formula —$Y^{21}$—O—$Y^{22}$—, —$Y^{21}$—O—, —$Y^{21}$—C(=O)—O—, —[$Y^{21}$—C(=O)—O]$_{m'}$—$Y^{22}$— or —$Y^{21}$—O—C(=O)—$Y^{22}$— is more preferable, and a group represented by the aforementioned formula —[$Y^{21}$—C(=O)—O]$_{m'}$—$Y^{22}$— or —$Y^{21}$—O—C(=O)—$Y^{22}$— is still more preferable.

Among these, as for $Y^2$, a linear or branched alkylene group or a divalent linking group containing a hetero atom is preferable, and a linear or branched alkylene group, a group represented by the formula —$Y^{21}$—O—$Y^{22}$—, a group represented by the formula —[$Y^{21}$—C(=O)—O]$_{m'}$—$Y^{22}$—, or a group represented by the formula —$Y^{21}$—O—C(=O)—$Y^{22}$— is more preferable.

Specific examples of the structural unit (a11) include structural units represented by general formulas (a1-1) to (a1-4) shown below.

[Chemical Formula 4]

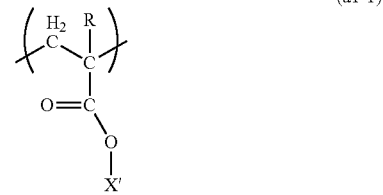

(a1-1)

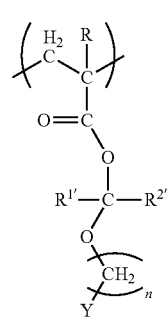
(a1-2)

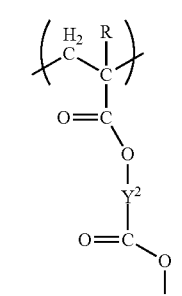
(a1-3)

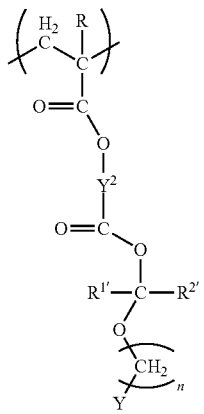
(a1-4)

In the formulas, R, $R^{1'}$, $R^{2'}$, n, Y and $Y^2$ are the same as defined above; and $X^1$ represents a tertiary alkyl ester-type acid dissociable group.

In the formulas, R is the same as defined above for R in the formula (a1-0-1).

The tertiary alkyl ester-type acid dissociable group for X' include the same tertiary alkyl ester-type acid dissociable groups as those described above.

As $R^{1'}$, $R^{2'}$, n and Y are respectively the same as defined for $R^{1'}$, $R^{2'}$, n and Y in the general formula (p1) described above in connection with the "acetal-type acid dissociable group".

$Y^2$ is the same as defined for $Y^2$ in general formula (a1-0-2).

Specific examples of structural units represented by general formulas (a1-1) to (a1-4) are shown below.

In the formulas shown below, $R^a$ represents a hydrogen atom, a methyl group or a trifluoromethyl group.

[Chemical Formula 5]

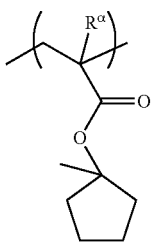
(a1-1-1)

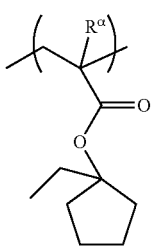
(a1-1-2)

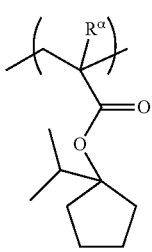
(a1-1-3)

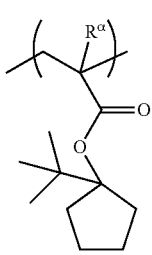
(a1-1-4)

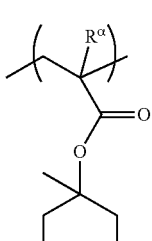
(a1-1-5)

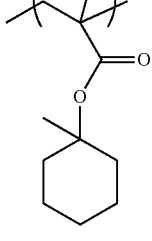
(a1-1-6)

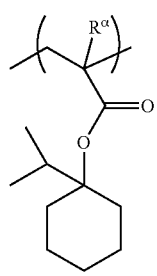 (a1-1-7)
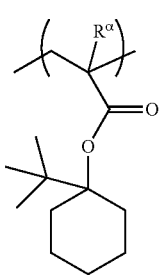 (a1-1-8)
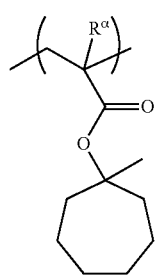 (a1-1-9)
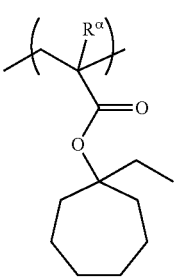 (a1-1-10)
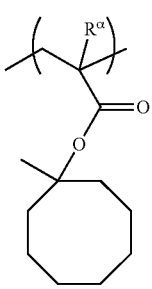 (a1-1-11)
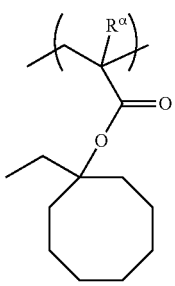 (a1-1-12)
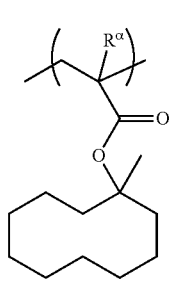 (a1-1-13)

(a1-1-17)
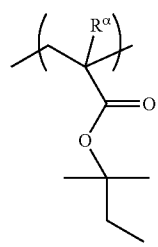
(a1-1-18)
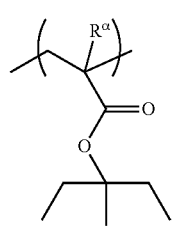
(a1-1-19)
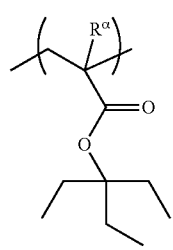
[Chemical Formula 6]
(a1-2-1)
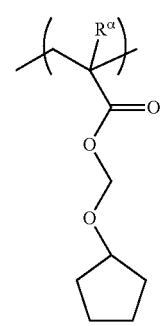
(a1-2-2)
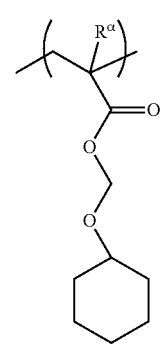
(a1-2-3)
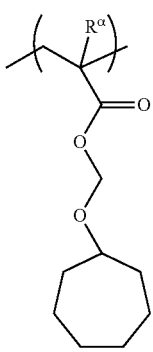
(a1-2-4)
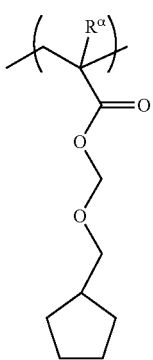
(a1-2-5)
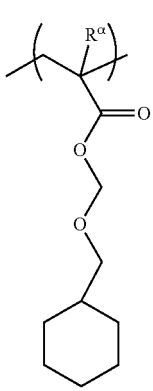
(a1-2-6)
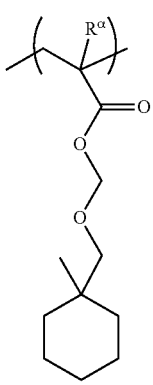

-continued
(a1-2-7)
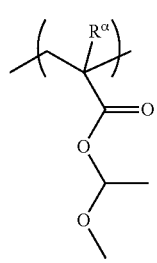
(a1-2-8)
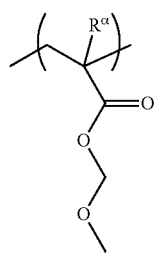
(a1-2-9)
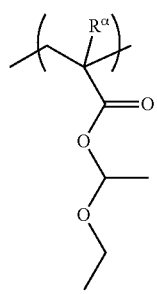
(a1-2-10)
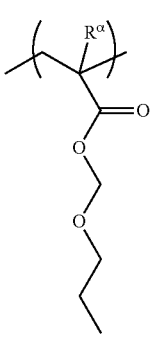
[Chemical Formula 7]
(a1-3-1)
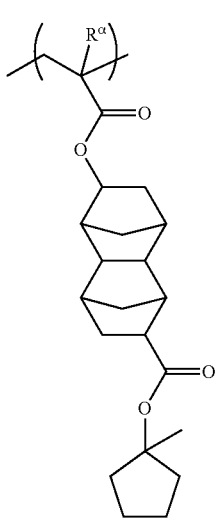
(a1-3-2)
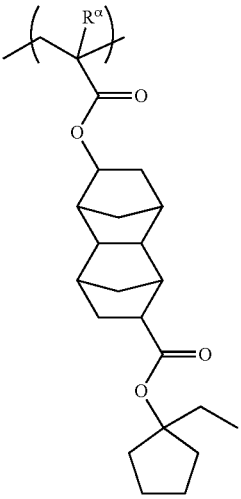
(a1-3-3)
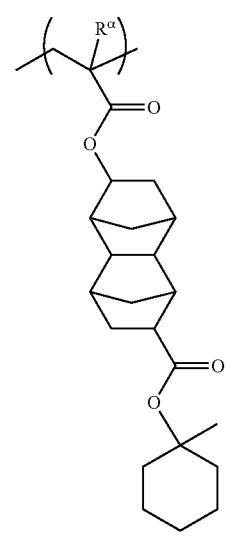
(a1-3-4)
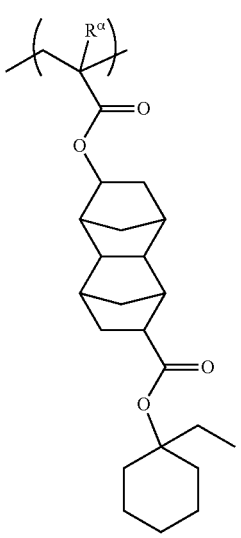

-continued
(a1-3-5)
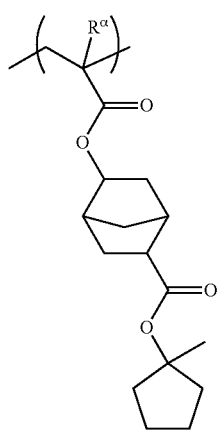
(a1-3-6)
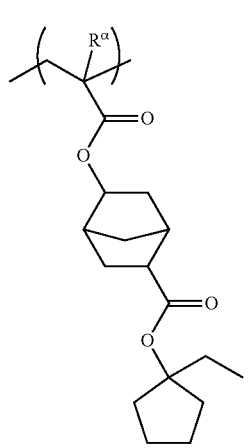
(a1-3-7)
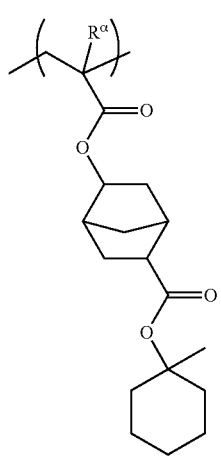
(a1-3-8)
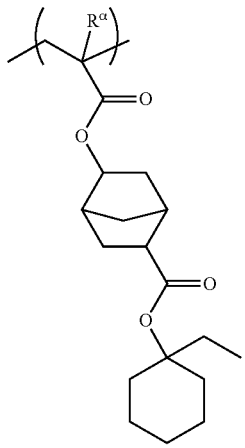
(a1-3-9)
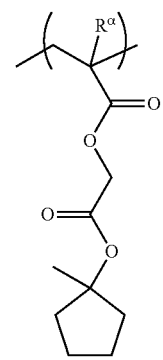
(a1-3-10)
(a1-3-11)
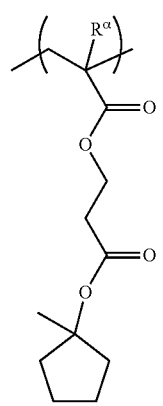

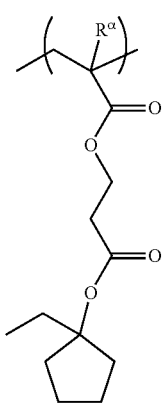
(a1-3-12)
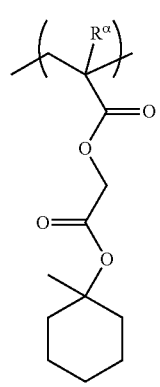
(a1-3-13)
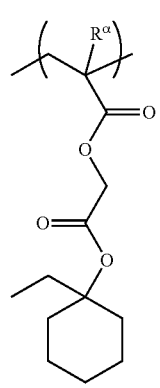
(a1-3-14)
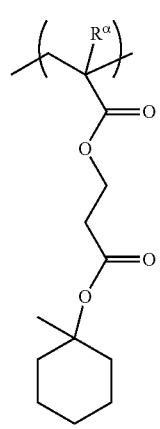
(a1-3-15)
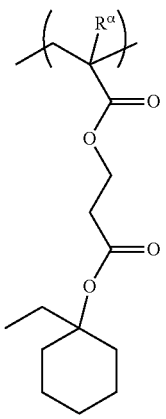
(a1-3-16)
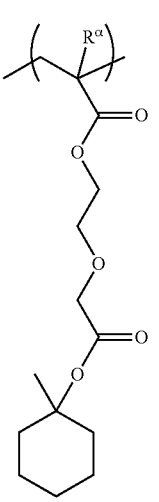
(a1-3-17)
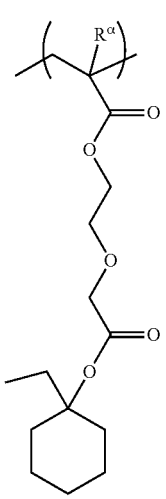
(a1-3-18)

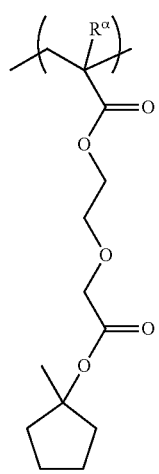 (a1-3-19)
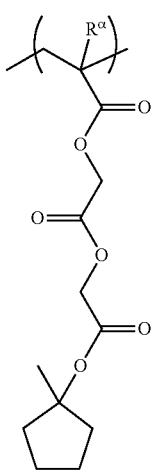 (a1-3-22)
[Chemical Formula 8]
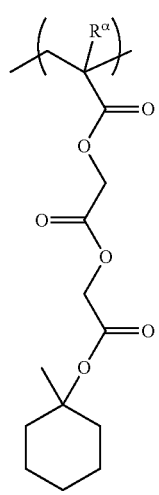 (a1-3-20)
 (a1-4-1)
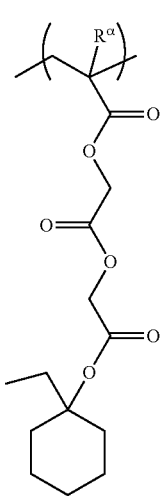 (a1-3-21)
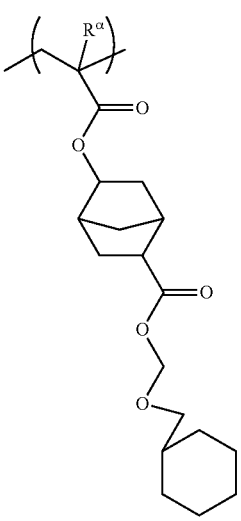 (a1-4-2)

(a1-4-3)
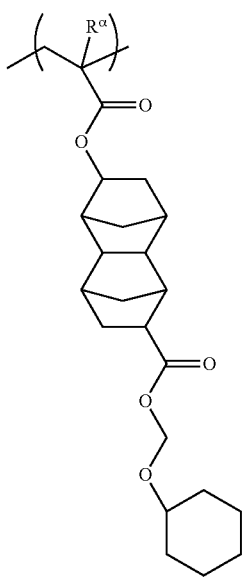
(a1-4-4)
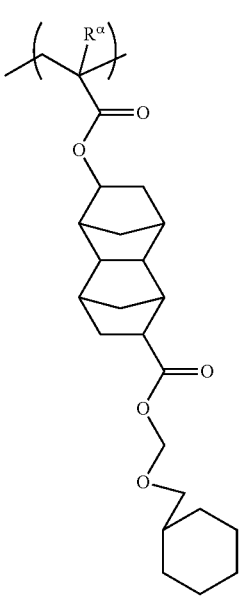
(a1-4-5)
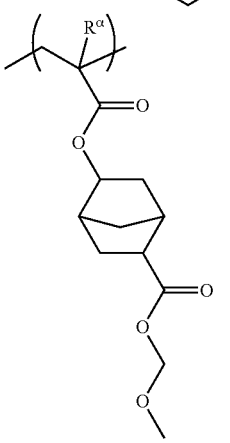
(a1-4-6)
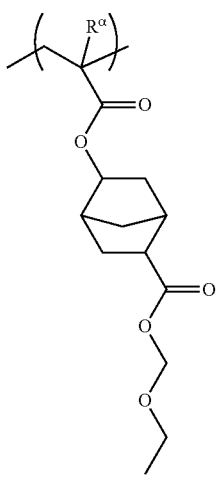
(a1-4-7)
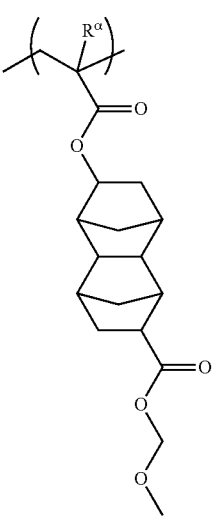
(a1-4-8)
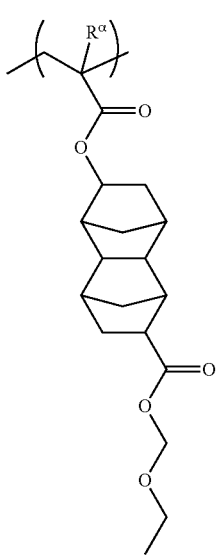
As the structural unit (a1′) contained in the component (A1), 1 type of structural unit may be used, or 2 or more types may be used.

As the structural unit (a1'), a structural unit (a11) is preferred.

In the component (A1), the amount of the structural unit (a1') based on the combined total of all structural units constituting the component (A1) is preferably 30 to 70 mol %, more preferably 30 to 65 mol %, and still more preferably 40 to 60 mol %. When the amount of the structural unit (a1') is at least as large as the lower limit of the above-mentioned range, a pattern can be easily formed using a resist composition prepared from the component (A1), and various lithography properties such as sensitivity, resolution, pattern shape and the like are improved. On the other hand, when the amount of the structural unit (a1') is no more than the upper limit of the above-mentioned range, a good balance can be achieved with the other structural units.

[Structural Unit (a2)]

It is preferable that the component (A1) include a structural unit (a2) containing a —$SO_2$— containing cyclic group or a lactone-containing cyclic group, as well as the structural unit (a1').

When the component (A1) is used for forming a resist film, the —$SO_2$— containing cyclic group or the lactone-containing cyclic group in the structural unit (a2) is effective in improving the adhesion between the resist film and the substrate. Furthermore, in the case of alkali developing process, it is effective in increasing the compatibility with the developing solution containing water such as an alkali developing solution.

—$SO_2$— Containing Cyclic Group

Here, an "—$SO_2$— containing cyclic group" refers to a cyclic group having a ring containing —$SO_2$— within the ring skeleton thereof, i.e., a cyclic group in which the sulfur atom (S) within —$SO_2$— forms part of the ring skeleton of the cyclic group. The ring containing —$SO_2$— within the ring skeleton thereof is counted as the first ring. A cyclic group in which the only ring structure is the ring that contains —$SO_2$— in the ring skeleton thereof is referred to as a monocyclic group, and a group containing other ring structures is described as a polycyclic group regardless of the structure of the other rings. The —$SO_2$-containing cyclic group may be either a monocyclic group or a polycyclic group.

As the —$SO_2$— containing cyclic group, a cyclic group containing —O—$SO_2$— within the ring skeleton thereof, i.e., a cyclic group containing a sultone ring in which —O—S— within the —O—$SO_2$— group forms part of the ring skeleton thereof is particularly desirable.

The —$SO_2$— containing cyclic group preferably has 3 to 30 carbon atoms, more preferably 4 to 20, still more preferably 4 to 15, and particularly preferably 4 to 12. Herein, the number of carbon atoms refers to the number of carbon atoms constituting the ring skeleton, excluding the number of carbon atoms within a substituent.

The —$SO_2$— containing cyclic group may be either a —$SO_2$— containing aliphatic cyclic group or a —$SO_2$— containing aromatic cyclic group. A —$SO_2$— containing aliphatic cyclic group is preferable.

Examples of the —$SO_2$— containing aliphatic cyclic group include aliphatic cyclic groups in which part of the carbon atoms constituting the ring skeleton has been substituted with a —$SO_2$— group or a —O—$SO_2$— group and has at least one hydrogen atom removed from the aliphatic hydrocarbon ring. Specific examples include an aliphatic hydrocarbon ring in which a —$CH_2$— group constituting the ring skeleton thereof has been substituted with a —$SO_2$— group and has at least one hydrogen atom removed therefrom; and an aliphatic hydrocarbon ring in which a —$CH_2$— group constituting the ring skeleton has been substituted with a —O—$SO_2$— group and has at least one hydrogen atom removed therefrom.

The alicyclic hydrocarbon ring preferably has 3 to 20 carbon atoms, and more preferably 3 to 12 carbon atoms.

The alicyclic hydrocarbon ring may be either a monocyclic group or a polycyclic group. As the monocyclic group, a group in which two hydrogen atoms have been removed from a monocycloalkane of 3 to 6 carbon atoms is preferable. Examples of the monocycloalkane include cyclopentane and cyclohexane. As the polycyclic alicyclic hydrocarbon group, a group in which two hydrogen atoms have been removed from a polycycloalkane of 7 to 12 carbon atoms is preferable. Examples of the polycycloalkane include adamantane, norbornane, isobornane, tricyclodecane and tetracyclododecane.

The —$SO_2$— containing cyclic group may have a substituent. Examples of substituents include an alkyl group, an alkoxy group, a halogen atom, a halogenated alkyl group, a hydroxy group, an oxygen atom (=O), —COOR", —OC(=O)R", a hydroxyalkyl group and a cyano group.

The alkyl group as a substituent is preferably an alkyl group of 1 to 6 carbon atoms. Further, the alkyl group is preferably a linear alkyl group or a branched alkyl group. Specific examples include a methyl group, ethyl group, propyl group, isopropyl group, n-butyl group, isobutyl group, tert-butyl group, pentyl group, isopentyl group, neopentyl group and hexyl group. Among these examples, a methyl group or an ethyl group is preferable, and a methyl group is particularly desirable.

As the alkoxy group as a substituent, an alkoxy group of 1 to 6 carbon atoms is preferable. Further, the alkoxy group is preferably a linear alkoxy group or a branched alkoxy group. Specific examples of the alkoxy groups include the aforementioned alkyl groups for the substituent having an oxygen atom (—O—) bonded thereto.

Examples of the halogen atom as a substituent include a fluorine atom, a chlorine atom, a bromine atom and an iodine atom, and a fluorine atom is preferable.

Examples of the halogenated alkyl group as a substituent include groups in which part or all of the hydrogen atoms within the aforementioned alkyl groups has been substituted with the aforementioned halogen atoms.

As examples of the halogenated alkyl group as a substituent, groups in which part or all of the hydrogen atoms of the aforementioned alkyl groups for the substituent have been substituted with the aforementioned halogen atoms can be given. As the halogenated alkyl group, a fluorinated alkyl group is preferable, and a perfluoroalkyl group is particularly desirable.

In the —COOR" group and the —OC(=O)R" group, R" represents a hydrogen atom or a linear, branched or cyclic alkyl group of 1 to 15 carbon atoms.

When R" represents a linear or branched alkyl group, it is preferably an alkyl group of 1 to 10 carbon atoms, more preferably an alkyl group of 1 to 5 carbon atoms, and most preferably a methyl group or an ethyl group.

When R" is a cyclic alkyl group (cycloalkyl group), it preferably has 3 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane.

The hydroxyalkyl group as a substituent preferably has 1 to 6 carbon atoms, and specific examples thereof include the aforementioned alkyl groups as a substituent in which at least one hydrogen atom has been substituted with a hydroxy group.

More specific examples of the —$SO_2$— containing cyclic group include groups represented by general formulas (3-1) to (3-4) shown below.

[Chemical Formula 9]

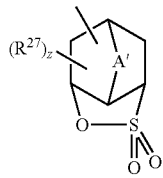
(3-1)

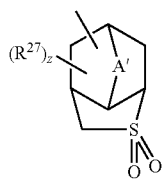
(3-2)

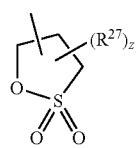
(3-3)

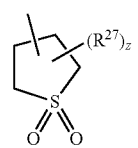
(3-4)

In the formulas, A' represents an oxygen atom, a sulfur atom or an alkylene group of 1 to 5 carbon atoms which may contain an oxygen atom or a sulfur atom; z represents an integer of 0 to 2; and $R^{27}$ represents an alkyl group, an alkoxy group, a halogenated alkyl group, a hydroxyl group, —COOR", —OC(=O)R", a hydroxyalkyl group or a cyano group, wherein R" represents a hydrogen atom or an alkyl group.

In general formulas (3-1) to (3-4) above, A' represents an oxygen atom (—O—), a sulfur atom (—S—) or an alkylene group of 1 to 5 carbon atoms which may contain an oxygen atom or a sulfur atom.

As the alkylene group of 1 to 5 carbon atoms for A', a linear or branched alkylene group is preferable, and examples thereof include a methylene group, an ethylene group, an n-propylene group and an isopropylene group.

Examples of alkylene groups that contain an oxygen atom or a sulfur atom include the aforementioned alkylene groups in which —O— or —S— is bonded to the terminal of the alkylene group or interposed within the alkylene group. Specific examples of such alkylene groups include —O—$CH_2$—, —$CH_2$—O—$CH_2$—, —S—$CH_2$— and —$CH_2$—S—$CH_2$—.

As A', an alkylene group of 1 to 5 carbon atoms or —O— is preferable, more preferably an alkylene group of 1 to 5 carbon atoms, and most preferably a methylene group.

z represents an integer of 0 to 2, and is most preferably 0.

If there are two of the $R^{27}$ groups, as indicated by the value z, then the two of the $R^{27}$ groups may be the same or different from each other.

As the alkyl group, alkoxy group, halogenated alkyl group, —COOR", —OC(=O)R" and hydroxyalkyl group for $R^{27}$, the same alkyl groups, alkoxy groups, halogenated alkyl groups, —COOR", —OC(=O)R" and hydroxyalkyl groups as those described above as the substituent for the —$SO_2$— containing cyclic group can be mentioned.

Specific examples of the cyclic groups represented by general formulas (3-1) to (3-4) are shown below. In the formulas shown below, "Ac" represents an acetyl group.

[Chemical Formula 10]

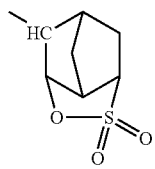
(3-1-1)

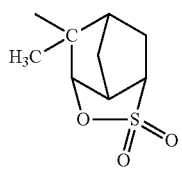
(3-1-2)

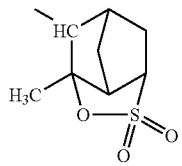
(3-1-3)

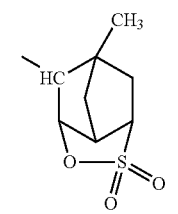
(3-1-4)

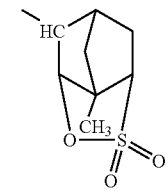
(3-1-5)

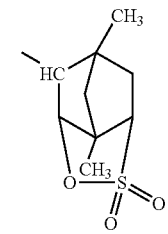
(3-1-6)

-continued
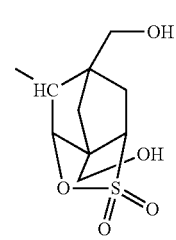 (3-1-7)
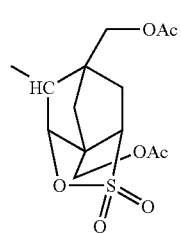 (3-1-8)
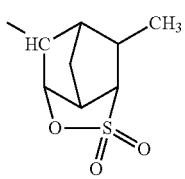 (3-1-9)
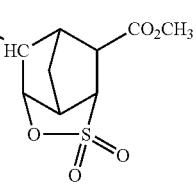 (3-1-10)
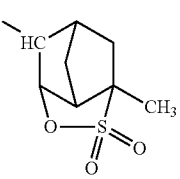 (3-1-11)
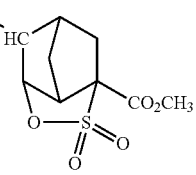 (3-1-12)
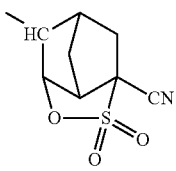 (3-1-13)
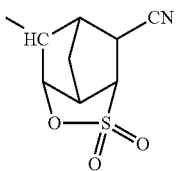 (3-1-14)
-continued
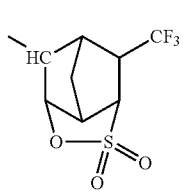 (3-1-15)
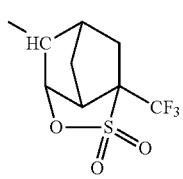 (3-1-16)
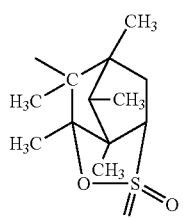 (3-1-17)
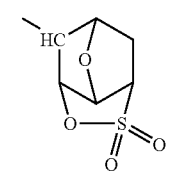 (3-1-18)
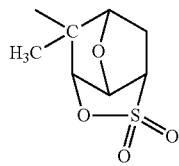 (3-1-19)
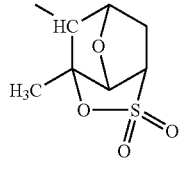 (3-1-20)
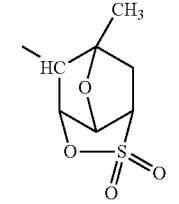 (3-1-21)
[Chemical Formula 11]
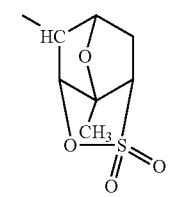 (3-1-22)

(3-1-23) 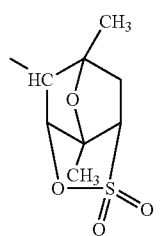

(3-1-24) 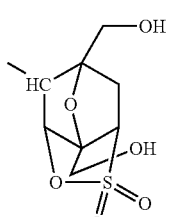

(3-1-25) 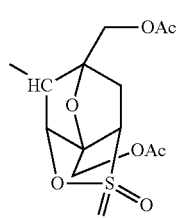

(3-1-26) 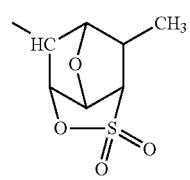

(3-1-27) 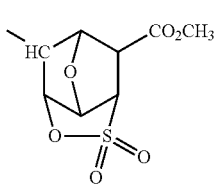

(3-1-28) 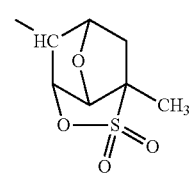

(3-1-29) 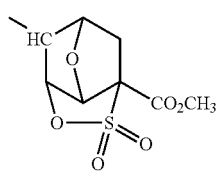

(3-1-30) 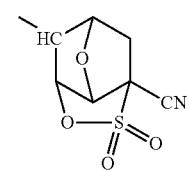

(3-1-31) 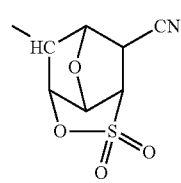

(3-1-32) 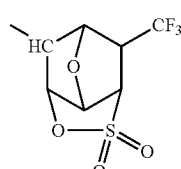

(3-1-33) 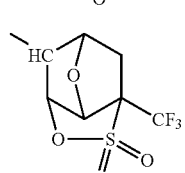

[Chemical Formula 12]

(3-2-1) 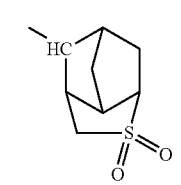

(3-2-2) 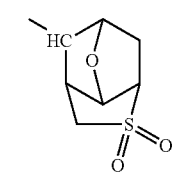

(3-3-1) 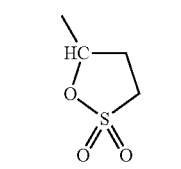

(3-4-1) 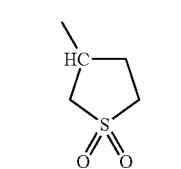

As the —SO$_2$— containing cyclic group, a group represented by the aforementioned general formula (3-1) is preferable, at least one member selected from the group consisting of groups represented by the aforementioned chemical formulas (a1-0-1), (3-1-18), (3-3-1) and (3-4-1) is more preferable, and a group represented by the chemical formula (a1-0-1) is most preferable.

Lactone-Containing Cyclic Group

The term "lactone-containing cyclic group" refers to a cyclic group including a ring containing a —O—C(=O)— structure (lactone ring). The term "lactone ring" refers to a single ring containing a —O—C(=O)— structure, and this ring is counted as the first ring. A lactone-containing cyclic group in which the only ring structure is the lactone ring is referred to as a monocyclic group, and groups containing other ring structures are described as polycyclic groups regardless of the structure of the other rings. The lactone-containing cyclic group may be either a monocyclic group or a polycyclic group.

The lactone-containing cyclic group for the structural unit (a2) is not particularly limited, and an arbitrary structural unit may be used. Specific examples of lactone-containing monocyclic groups include a group in which one hydrogen atom has been removed from a 4- to 6-membered lactone ring, such as a group in which one hydrogen atom has been removed from β-propionolatone, a group in which one hydrogen atom has been removed from γ-butyrolactone, and a group in which one hydrogen atom has been removed from δ-valerolactone. Further, specific examples of lactone-containing polycyclic groups include groups in which one hydrogen atom has been removed from a lactone ring-containing bicycloalkane, tricycloalkane or tetracycloalkane.

More specific examples of the lactone-containing cyclic group include groups represented by general formulas (4-1) to (4-7) shown below.

[Chemical Formula 13]

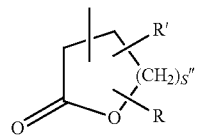
(4-1)

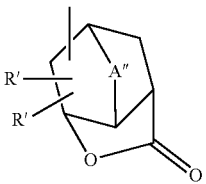
(4-2)

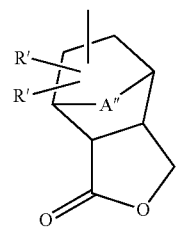
(4-3)

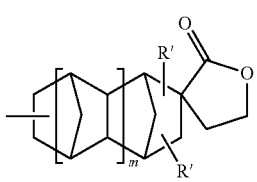
(4-4)

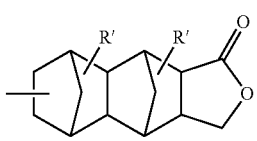
(4-5)

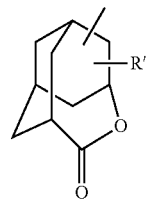
(4-6)

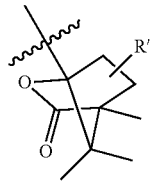
(4-7)

In the formulas, R' represents a hydrogen atom, an alkyl group, an alkoxy group, a halogen atom, a halogenated alkyl group, a hydroxy group, —COOR", —OC(=O)R", a hydroxyalkyl group, or a cyano group, wherein R" represents a hydrogen atom or an alkyl group; s" represents an integer of 0 to 2; A" represents an oxygen atom, a sulfur atom or an alkylene group of 1 to 5 carbon atoms which may contain an oxygen atom or a sulfur atom; and m represents 0 or 1.

As the alkyl group, alkoxy group, halogen atom, halogenated alkyl group, —COOR", —OC(=O)R" and hydroxyalkyl group for R', the same alkyl groups, alkoxy groups, halogen atoms, halogenated alkyl groups, —COOR", —OC(=O)R" and hydroxyalkyl groups as those described above as the substituent for the —SO$_2$-containing cyclic group can be mentioned.

As A", an alkylene group of 1 to 5 carbon atoms or —O— is preferable, more preferably an alkylene group of 1 to 5 carbon atoms, and most preferably a methylene group.

s" is preferably 1 or 2.

Specific examples of the cyclic groups represented by general formulas (4-1) to (4-7) are shown below. In the formulas shown below, a wavy line represents a binding portion with the main chain.

[Chemical Formula 14]

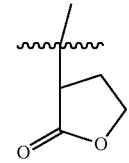
(4-1-1)

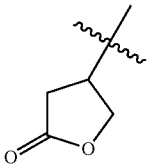
(4-1-2)

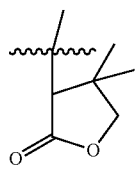
(4-1-3)

(4-1-4) 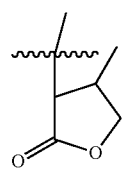
(4-1-5) 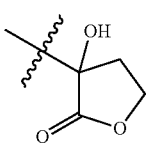
(4-1-6) 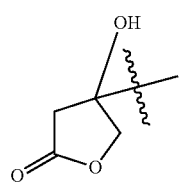
(4-1-7) 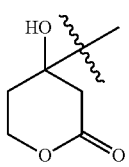
(4-2-1) 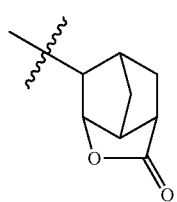
(4-2-2) 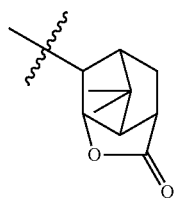
(4-2-3) 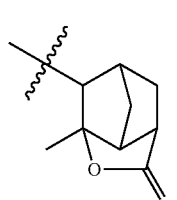
(4-2-4) 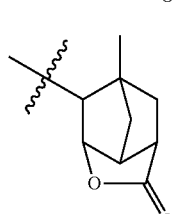
(4-2-5) 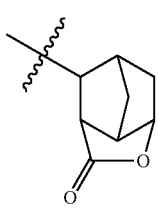
(4-2-6) 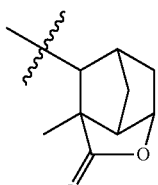
(4-2-7) 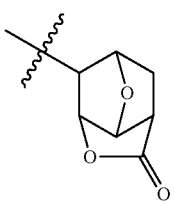
(4-2-8) 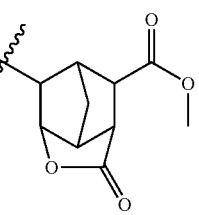
(4-2-9) 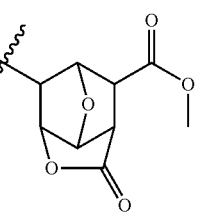
(4-2-10) 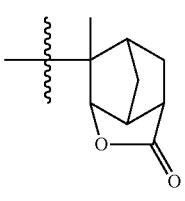
(4-2-11) 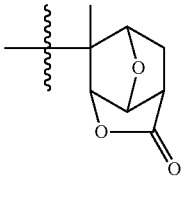

(4-3-1)
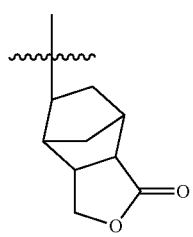
(4-3-2)
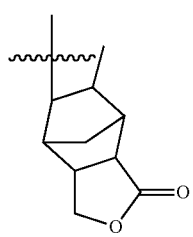
(4-3-3)
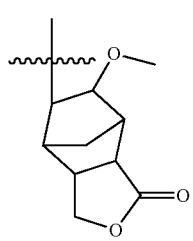
(4-3-4)
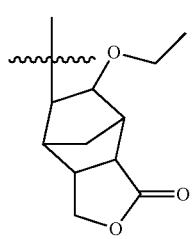
(4-3-5)
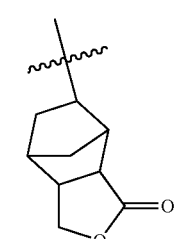
[Chemical Formula 15]
(4-4-1)
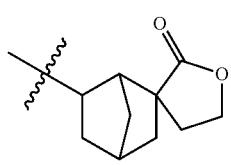
(4-4-2)
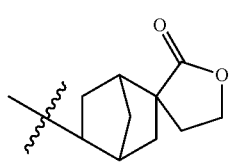
(4-4-3)
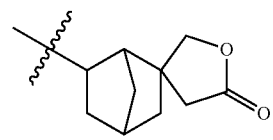
(4-4-4)
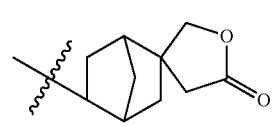
(4-4-5)
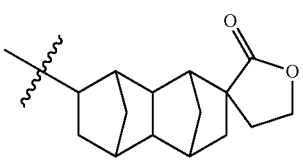
(4-4-6)
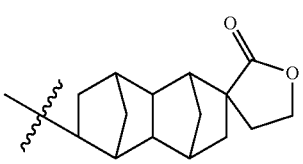
(4-4-7)
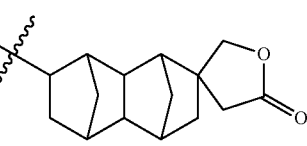
(4-4-8)
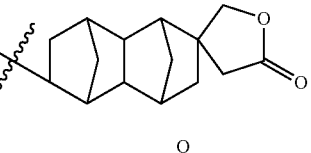
(4-4-9)
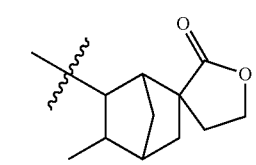
(4-5-1)
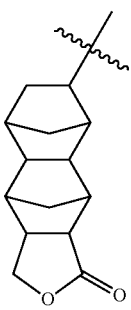

(4-5-2)
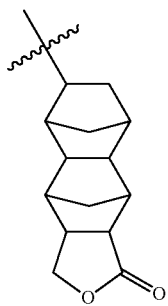

(4-5-3)
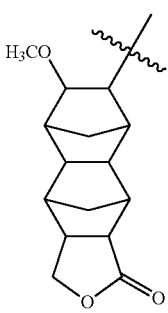

(4-5-4)
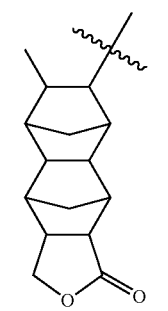

(4-6-1)
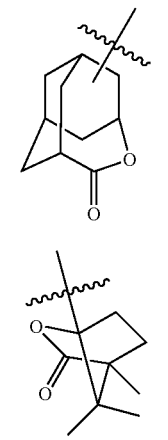

(4-7-1)
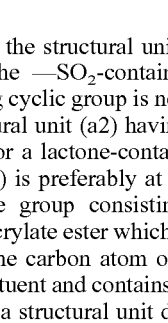

With respect to the structural unit (a2), the partial structure other than the —SO$_2$-containing cyclic group or a lactone-containing cyclic group is not particularly limited as long as the structural unit (a2) having an —SO$_2$— containing cyclic group or a lactone-containing cyclic group. The structural unit (a2) is preferably at least one structural unit selected from the group consisting of a structural unit derived from an acrylate ester which may have the hydrogen atom bonded to the carbon atom on the α-position substituted with a substituent and contains an —SO$_2$— containing cyclic group, and a structural unit derived from an acrylate ester which may have the hydrogen atom bonded to the carbon atom on the α-position substituted with a substituent and contains a lactone-containing cyclic group.

More specific examples of the structural unit (a2) include structural units represented by general formula (a2-0) shown below.

[Chemical Formula 16]

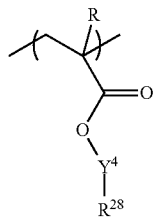

(a2-0)

In the formula, R represents a hydrogen atom, an alkyl group of 1 to 5 carbon atoms or a halogenated alkyl group of 1 to 5 carbon atoms; $R^{28}$ represents a —SO$_2$-containing cyclic group; and $Y^4$ represents a single bond or a divalent linking group.

In genera formula (a2-0), R is the same as defined above.

$R^{28}$ is the same as defined for the aforementioned —SO$_2$— containing group or lactone-containing cyclic group.

$Y^4$ may be either a single bond or a divalent linking group, and preferably a divalent linking group.

The divalent linking group for $Y^4$ is not particularly limited, and examples thereof include the same divalent linking groups as those described above for $Y^2$ in the aforementioned formula (a1-0-2). Among these, an alkylene group or a divalent linking group containing an ester bond (—C(=O)—O—) is preferable.

As the alkylene group, a linear or branched alkylene group is preferable. Specific examples include the same linear alkylene groups and branched alkylene groups as those described above in relation to the aliphatic hydrocarbon group for $Y^2$.

As the divalent linking group containing an ester bond, a group represented by general formula: —$R^{30}$—C(=O)—O— (in the formula, $R^{30}$ represents a divalent linking group) is particularly desirable. That is, the structural unit (a2) is preferably structural units represented by general formulas (a1-0-1) to (a2-O-3) shown below.

[Chemical Formula 17]

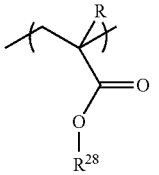

(a2-0-1)

-continued (a2-0-2)
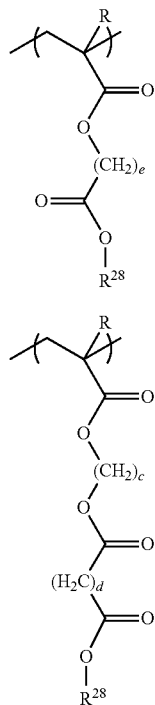

(a2-0-3)
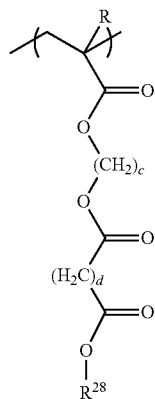

In the formulas, R and $R^{28}$ are the same as defined above; and each of c to e independently represents an integer of 1 to 3.

In particular, as the structural unit (a2), a structural unit represented by general formula (a1-0-11), (a2-1-12), (a2-2-11) or (a2-2-12) shown below is preferable, and a structural unit represented by general formula (a1-0-12) or (a2-2-11) shown below is more preferable.

[Chemical Formula 18]

(a2-1-11)
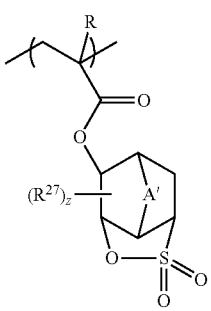

(a2-1-12)
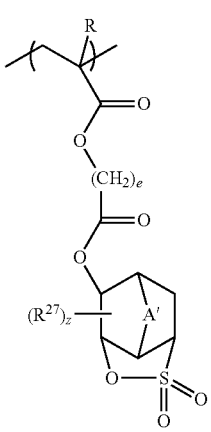

-continued (a2-2-11)
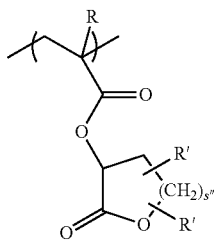

(a2-2-12)
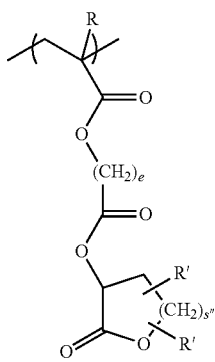

In the formulas, R, A', $R^{27}$, z, R' and s" are the same as defined above.

As the structural unit (a2) contained in the component (A1), 1 type of structural unit may be used, or 2 or more types may be used.

When the component (A1) contains the structural unit (a2), the amount of the structural unit (a2) based on the combined total of all structural units constituting the component (A1) is preferably 30 to 70 mol %, more preferably 30 to 65 mol %, and still more preferably 40 to 60 mol %. When the amount of the structural unit (a2) is at least as large as the lower limit of the above-mentioned range, the effect of using the structural unit (a2) can be satisfactorily achieved. On the other hand, when the amount of the structural unit (a2) is no more than the upper limit of the above-mentioned range, a good balance can be achieved with the other structural units, and various lithography properties such as DOF and CDU and pattern shape can be improved.

[Other Structural Unit]

The component (A1) may also have a structural unit (a4) which is other than the above-mentioned structural units (a1') and (a2), as long as the effects of the present invention are not impaired.

As the structural unit (a4), any other structural unit which cannot be classified as one of the above structural units (a1') and (a2) can be used without any particular limitation, and any of the multitude of conventional structural units used within resist resins for ArF excimer lasers or KrF excimer lasers (and particularly for ArF excimer lasers) can be used.

As the structural unit (a4), a structural unit which contains a non-acid-dissociable aliphatic polycyclic group, and is also derived from an acrylate ester is preferable. Examples of this polycyclic group include the same groups as those described above in relation to the aforementioned structural unit (a1'), and any of the multitude of conventional polycyclic groups used within the resin component of resist compositions for ArF excimer lasers or KrF excimer lasers (and particularly for ArF excimer lasers) can be used.

In consideration of industrial availability and the like, at least one polycyclic group selected from amongst a tricyclodecyl group, adamantyl group, tetracyclododecyl group, isobornyl group, and norbornyl group is particularly desirable. These polycyclic groups may be substituted with a linear or branched alkyl group of 1 to 5 carbon atoms, a linear or branched hydroxyalkyl group of 1 to 5 carbon atoms, or a cyano group.

Preferable examples of the structural unit (a4) include a structural unit derived from an acrylate ester which contains a non-acid-dissociable aromatic group, a structural unit derived from a styrene monomer and a structural unit derived from a hydroxystyrene monomer.

Specific examples of the structural unit (a4) include structural units represented by general formulas (a1-0-1) to (a4-6) shown below, vinyl(hydroxy)naphthalene, (hydroxy)naphthyl(meth)acrylate and (hydroxy)benzyl(meth)acrylate.

[Chemical Formula 19]

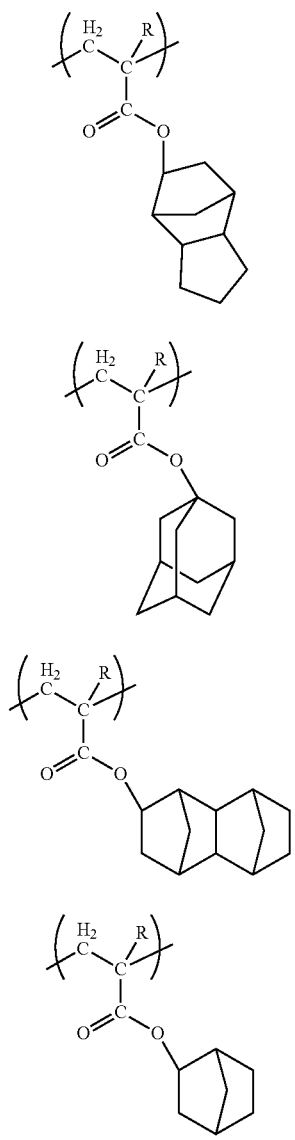

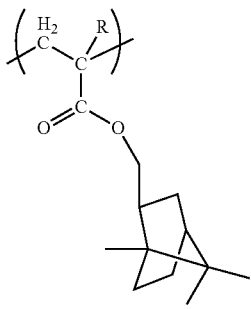

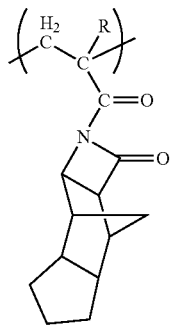

In the formulas, R is the same as defined above.

The structural unit (a4) may be a structural unit which contains an acid decomposable group and which does not fall under the definition of the structural unit (a1').

When the structural unit (a4) is included in the component (A1), the amount of the structural unit (a4) based on the combined total of all the structural units that constitute the component (A1) is preferably within the range from 1 to 30 mol %, and more preferably from 10 to 20 mol %.

The component (A1) is preferably a resin component containing the structural unit (a1').

Examples of the component (A1) include a copolymer consisting of the structural units (a1') and (a2), and a copolymer consisting of the structural units (a1'), (a2) and (a4).

The weight average molecular weight (Mw) (the polystyrene equivalent value determined by gel permeation chromatography) of the component (A1) is not particularly limited, but is preferably 1,000 to 50,000, more preferably 1,500 to 30,000, and most preferably 2,000 to 20,000. When the weight average molecular weight of the component (A) is no more than the upper limit of the above-mentioned range, the resist composition exhibits a satisfactory solubility in a resist solvent. On the other hand, when the weight average molecular weight is at least as large as the lower limit of the above-mentioned range, the dry etching resistance and the cross-sectional shape of the resist pattern becomes satisfactory.

Further, the dispersity (Mw/Mn) is not particularly limited, but is preferably 1.0 to 5.0, more preferably 1.0 to 3.0, and most preferably 1.2 to 2.5. Here, Mn is the number average molecular weight.

The component (A1) can be obtained, for example, by a conventional radical polymerization or the like of the monomers corresponding to each of the structural units, using a radical polymerization initiator such as azobisisobutyronitrile (AIBN).

Furthermore, in the component (A1), by using a chain transfer agent such as HS—$CH_2$—$CH_2$—$CH_2$—$C(CF_3)_2$—

OH, a —C(CF$_3$)$_2$—OH group can be introduced at the terminals of the component (A1). Such a copolymer having introduced a hydroxyalkyl group in which some of the hydrogen atoms of the alkyl group are substituted with fluorine atoms is effective in reducing developing defects and LER (line edge roughness: unevenness of the side walls of a line pattern).

As the monomers for deriving the corresponding structural units, commercially available monomers may be used, or the monomers may be synthesized by a conventional method.

As the component (A1), one type may be used alone, or two or more types may be used in combination.

In the component (A), the amount of the component (A1) based on the total weight of the component (A) is preferably 25% by weight or more, more preferably 50% by weight or more, still more preferably 75% by weight or more, and may be even 100% by weight. When the amount of the component (A1) is 25% by weight or more, various lithography properties such as MEF, circularity and reduced roughness are improved.

The component (A) may contain a base component which exhibits increased polarity in an alkali developing solution under action of acid other than the component (A1) (hereafter, referred to as "component (A2)"), as long as the effects of the present invention are not impaired.

Examples of the component (A2) include low molecular weight compounds that have a molecular weight of at least 500 and less than 2,000, contains a hydrophilic group, and also contains an acid dissociable group described above in connection with the component (A1). Specific examples include compounds containing a plurality of phenol skeletons in which a part of the hydrogen atoms within hydroxyl groups have been substituted with the aforementioned acid dissociable groups.

Examples of the low-molecular weight compound include low molecular weight phenolic compounds in which a portion of the hydroxyl group hydrogen atoms have been substituted with an aforementioned acid dissociable group, and these types of compounds are known, for example, as sensitizers or heat resistance improvers for use in non-chemically amplified g-line or i-line resists, and these compounds may be arbitrarily selected for use.

Examples of these low molecular weight phenol compounds include bis(4-hydroxyphenyl)methane, bis(2,3,4-trihydroxyphenyl)methane, 2-(4-hydroxyphenyl)-2-(4'-hydroxyphenyl)propane, 2-(2,3,4-trihydroxyphenyl)-2-(2',3',4'-trihydroxyphenyl)propane, tris(4-hydroxyphenyl)methane, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-3-methylphenyl)-3,4-dihydroxyphenylmethane, bis(3-cyclohexyl-4-hydroxy-6-methylphenyl)-4-hydroxyphenylmethane, bis(3-cyclohexyl-4-hydroxy-6-methylphenyl)-3,4-dihydroxyphenylmethane, 1-[1-(4-hydroxyphenyl)isopropyl]-4-[1,1-bis(4-hydroxyphenyl)ethyl]benzene, and dimers, trimers, tetramers, pentamers and hexamers of formalin condensation products of phenols such as phenol, m-cresol, p-cresol and xylenol. Needless to say, the low molecular weight phenol compound is not limited to these examples. In particular, a phenol compound having 2 to 6 triphenylmethane skeletons is preferable in terms of resolution and line width roughness (LWR). Also, there are no particular limitations on the acid dissociable group, and suitable examples include the groups described above.

In the resist composition used for the present invention, the amount of the component (A) can be appropriately adjusted depending on the thickness of the resist film to be formed, and the like.

<Acid Generator Component; Component (B)>

The component (B) is an acid generator component which generates acid upon exposure.

As the component (B), there is no particular limitation, and any of the known acid generators used in conventional chemically amplified resist compositions can be used. Examples of these acid generators are numerous, and include onium salt acid generators such as iodonium salts and sulfonium salts; oxime sulfonate acid generators; diazomethane acid generators such as bisalkyl or bisaryl sulfonyl diazomethanes and poly(bis-sulfonyl)diazomethanes; nitrobenzylsulfonate acid generators; iminosulfonate acid generators; and disulfone acid generators.

As an onium salt acid generator, a compound represented by general formula (b-1) or (b-2) shown below can be used.

[Chemical Formula 20]

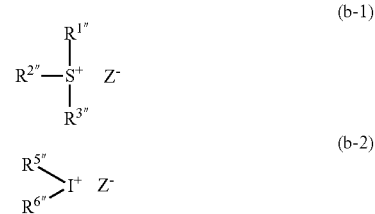

In the formulas, each of $R^{1''}$ to $R^{3''}$, and $R^{5''}$ to $R^{6''}$ independently represents an aryl group, alkyl group or alkenyl group which may have a substituent; In formula (b-1), two of $R^{1''}$ to $R^{3''}$ may be bonded to each other to form a ring with the sulfur atom; and Z- represents a counteranion.

Cation Moiety

Examples of the aryl group which may have a substituent for $R^{1''}$ to $R^{3''}$ include an unsubstitued aryl group of 6 to 20 carbon atoms, a substituted aryl group in which part or all of hydrogen atoms of the unsubstituted alkyl group have been substituted with a substituent.

The unsubstituted aryl group is preferably an aryl group having 6 to 10 carbon atoms because it can be synthesized at a low cost. Specific examples thereof include a phenyl group and a naphthyl group.

Examples of the substituent of the substituted alkyl group include an alkyl group, an alkoxy group, a halogen atom, a halogenated alkyl group, a hydroxy group, an oxo group (=O), a cyano group, an aryl group, an alkoxyalkyloxy group, an alkoxycarbonylalkyloxy group, —C(=O)—O—$R^{6'}$, —O—C(=O)—$R^{7'}$, —O—$R^{8'}$, —O—$R^{9'}$, a halogenated alkylsulfonyloxy group and —O—$W^1$—[O—$R^{11''}$—S$^+$($R^{21''}$)($R^{31''}$)]$_x$. Each of $R^{6'}$, $R^{7'}$ and $R^{8'}$ independently represents a linear or branched saturated hydrocarbon group of 1 to 25 atoms, a cyclic saturated hydrocarbon group of 3 to 20 carbon atoms or a linear or branched, aliphatic unsaturated hydrocarbon group of 2 to 5 carbon atoms. $R^{9'}$ represents a nitrogen-containing hydrocarbon group. $R^{11''}$ represents an arylene group, an alkylene group or an alkenylene which may have a substituent. Each of $R^{21''}$ and $R^{31''}$ independently represents an aryl group, an alkyl group or an alkenylene group which may have a substituent, and $R^{21''}$ and $R^{31''}$ may be mutually bonded with the sulfur atom to form a ring. x represents 1 or 2, and $W^1$ represents (x+1)-valent linking group.

Examples of the alkyl group, alkoxy group, halogen atom and halogenated alkyl group as the substituent for the aryl group include the same substituent groups as those described above as a substituent for an aromatic hydrocarbon group in the explanation of divalent linking group for $Y^2$ in the formula (a1-0-2)

As an aryl group as a substituent of the aryl group, an aryl group of 6 to 12 carbon atoms is preferable, and a phenyl group or a naphthyl group is more desirable.

Examples of the alkoxyalkyloxy group as a substituent for the aforementioned aryl group includes:

a group represented by general formula —O—C($R^{47}$)($R^{48}$)—O—$R^{49}$ [in the formula, each of $R^{47}$ and $R^{48}$ independently represents a hydrogen atom or a linear or branched alkyl group; and $R^{49}$ represents an alkyl group].

The alkyl group for $R^{47}$ and $R^{48}$ preferably has 1 to 5 carbon atoms, and may be either linear or branched, and is preferably an ethyl group or a methyl group, and most preferably a methyl group.

It is preferable that at least one of $R^{47}$ and $R^{48}$ be a hydrogen atom. It is particularly desirable that at least one of $R^{47}$ and $R^{48}$ be a hydrogen atom, and the other be a hydrogen atom or a methyl group.

The alkyl group for $R^{49}$ preferably has 1 to 15 carbon atoms, and may be linear, branched or cyclic.

The linear or branched alkyl group for $R^{49}$ preferably has 1 to 5 carbon atoms. Examples thereof include a methyl group, an ethyl group, a propyl group, an n-butyl group and a tert-butyl group.

The cyclic alkyl group for $R^{49}$ preferably has 4 to 15 carbon atoms, more preferably 4 to 12, and most preferably 5 to 10. Specific examples thereof include groups in which one or more hydrogen atoms have been removed from a monocycloalkane or a polycycloalkane such as a bicycloalkane, tricycloalkane or tetracycloalkane, and which may or may not be substituted with an alkyl group of 1 to 5 carbon atoms, a fluorine atom or a fluorinated alkyl group. Examples of the monocycloalkane include cyclopentane and cyclohexane. Examples of polycycloalkanes include adamantane, norbornane, isobornane, tricyclodecane and tetracyclododecane. Among these, a group in which one or more hydrogen atoms have been removed from adamantane is preferable.

Examples of the alkoxycarbonylalkyloxy group as a substituent for the aforementioned aryl group includes:

a group represented by general formula —O—$R^{50}$—C(=O)—O—$R^{56}$ [in the formula, $R^{50}$ represents a linear or branched alkylene group; and $R^{56}$ represents a tert-alkyl group].

The linear or branched alkylene group for $R^{50}$ preferably has 1 to 5 carbon atoms, and examples thereof include a methylene group, an ethylene group, a trimethylene group, a tetramethylene group and a 1,1-dimethylethylene group.

The alkyl group for $R^{56}$ is a tertiary alkyl group, and examples thereof include a 2-methyl-2-adamantyl group, a 2-ethyl-2-adamantyl group, a 1-methyl-1-cyclopentyl group, a 1-ethyl-1-cyclopentyl group, a 1-methyl-1-cyclohexyl group, a 1-ethyl-1-cyclohexyl group, a 1-(1-adamantyl)-1-methylethyl group, a 1-(1-adamantyl)-1-methylpropyl group, a 1-(1-adamantyl)-1-methylbutyl group, a 1-(1-adamantyl)-1-methylpentyl group, a 1-(1-cyclopentyl)-1-methylethyl group, a 1-(1-cyclopentyl)-1-methylpropyl group, a 1-(1-cyclopentyl)-1-methylbutyl group, a 1-(1-cyclopentyl)-1-methylpentyl group, a 1-(1-cyclohexyl)-1-methylethyl group, a 1-(1-cyclohexyl)-1-methylpropyl group, a 1-(1-cyclohexyl)-1-methylbutyl group, a 1-(1-cyclohexyl)-1-methylpentyl group, a tert-butyl group, a tert-pentyl group and a tert-hexyl group.

Further, a group in which $R^{56}$ in the group represented by the aforementioned general formula: —O—$R^{50}$—C(=O)—O—$R^{56}$ has been substituted with $R^{56'}$ can also be mentioned. $R^{56'}$ represents a hydrogen atom, an alkyl group, a fluorinated alkyl group or an aliphatic cyclic group which may contain a hetero atom.

The alkyl group for $R^{56'}$ is the same as defined for the alkyl group for the aforementioned $R^{49}$ Examples of the fluorinated alkyl group for $R^{56'}$ include groups in which part or all of the hydrogen atoms within the alkyl group for $R^{49}$ has been substituted with a fluorine atom.

Examples of the aliphatic cyclic group for $R^{56'}$ which may contain a hetero atom include an aliphatic cyclic group which does not contain a hetero atom, an aliphatic cyclic group containing a hetero atom in the ring structure, and an aliphatic cyclic group in which a hydrogen atom has been substituted with a hetero atom.

As an aliphatic cyclic group for $R^{56'}$ which does not contain a hetero atom, a group in which one or more hydrogen atoms have been removed from a monocycloalkane or a polycycloalkane such as a bicycloalkane, a tricycloalkane or a tetracycloalkane can be mentioned. Examples of the monocycloalkane include cyclopentane and cyclohexane. Examples of polycycloalkanes include adamantane, norbornane, isobornane, tricyclodecane and tetracyclododecane. Among these, a group in which one or more hydrogen atoms have been removed from adamantane is preferable.

Specific examples of the aliphatic cyclic group for $R^{56'}$ containing a hetero atom in the ring structure include groups represented by formulas (L1) to (L7) and (S1) to (S4) described later.

As the aliphatic cyclic group for $R^{56'}$ in which a hydrogen atom has been substituted with a hetero atom, an aliphatic cyclic group in which a hydrogen atom has been substituted with an oxygen atom (=O) can be mentioned.

In the groups —C(=O)—O—$R^{6'}$, —O—C(=O)—$R^{7'}$ and —O—$R^{8'}$, each of $R^{6'}$, $R^{7'}$ and $R^{8'}$ independently represents a linear or branched saturated hydrocarbon group of 1 to 25 atoms, a cyclic saturated hydrocarbon group of 3 to 20 carbon atoms or a linear or branched, aliphatic unsaturated hydrocarbon group of 2 to 5 carbon atoms.

The linear or branched, saturated hydrocarbon group preferably has 1 to 25 carbon atoms, more preferably 1 to 15, and still more preferably 4 to 10.

Examples of the linear, saturated hydrocarbon group include a methyl group, an ethyl group, a propyl group, a butyl group, a pentyl group, a hexyl group, a heptyl group, an octyl group, a nonyl group and a decyl group.

Examples of the branched, saturated hydrocarbon group include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group, but excluding tertiary alkyl groups.

The linear or branched, saturated hydrocarbon group may have a substituent. Examples of the substituent include an alkoxy group, a halogen atom, a halogenated alkyl group, a hydroxyl group, an oxygen atom (=O), a cyano group and a carboxy group.

The alkoxy group as a substituent for the linear or branched, saturated hydrocarbon group is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

Examples of the halogen atom as a substituent for the linear or branched, saturated alkyl group include a fluorine atom, a chlorine atom, a bromine atom and an iodine atom, and a fluorine atom is preferable.

Example of the halogenated alkyl group as a substituent for the linear or branched, saturated hydrocarbon group includes a group in which part or all of the hydrogen atoms within the aforementioned linear or branched, saturated hydrocarbon group have been substituted with the aforementioned halogen atoms.

The cyclic saturated hydrocarbon group of 3 to 20 carbon atoms for $R^{6'}$, $R^{7'}$ and $R^{8'}$ may be either a polycyclic group or a monocyclic group, and examples thereof include groups in which one hydrogen atom has been removed from a monocycloalkane, and groups in which one hydrogen atom has been removed from a polycycloalkane (e.g., a bicycloalkane, a tricycloalkane or a tetracycloalkane). More specific examples include groups in which one hydrogen atom has been removed from a monocycloalkane such as cyclopentane, cyclohexane, cycloheptane or cyclooctane; and groups in which one or more hydrogen atoms have been removed from a polycycloalkane such as adamantane, norbornane, isobornane, tricyclodecane or tetracyclododecane.

The cyclic, saturated hydrocarbon group may have a substituent. For example, part of the carbon atoms constituting the ring within the cyclic alkyl group may be substituted with a hetero atom, or a hydrogen atom bonded to the ring within the cyclic alkyl group may be substituted with a substituent.

In the former example, a heterocycloalkane in which part of the carbon atoms constituting the ring within the aforementioned monocycloalkane or polycycloalkane has been substituted with a hetero atom such as an oxygen atom, a sulfur atom or a nitrogen atom, and one hydrogen atom has been removed therefrom, can be used. Further, the ring may contain an ester bond (—C(=O)—O—) in the ring structure thereof. More specific examples include a lactone-containing monocyclic group, such as a group in which one hydrogen atom has been removed from γ-butyrolactone; and a lactone-containing polycyclic group, such as a group in which one hydrogen atom has been removed from a bicycloalkane, tricycloalkane or tetracycloalkane containing a lactone ring.

In the latter example, as the substituent, the same substituent groups as those for the aforementioned linear or branched alkyl group, or an alkyl group of 1 to 5 carbon atoms can be used.

Alternatively, $R^{6'}$, $R^{7'}$ and $R^{8'}$ may be a combination of a linear or branched alkyl group and a cyclic group.

Examples of the combination of a linear or branched alkyl group with a cyclic alkyl group include groups in which a cyclic alkyl group as a substituent is bonded to a linear or branched alkyl group, and groups in which a linear or branched alkyl group as a substituent is bonded to a cyclic alkyl group.

Examples of the linear aliphatic unsaturated hydrocarbon group for $R^{6'}$, $R^{7'}$ and $R^{8'}$ include a vinyl group, a propenyl group (an allyl group) and a butynyl group.

Examples of the branched aliphatic unsaturated hydrocarbon group for $R^{6'}$, $R^{7'}$ and $R^{8'}$ include a 1-methylpropenyl group and a 2-methylpropenyl group.

The aforementioned linear or branched, aliphatic unsaturated hydrocarbon group may have a substituent. Examples of substituents include the same substituents as those which the aforementioned linear or branched alkyl group may have.

Among the aforementioned examples, as $R^{7'}$ and $R^{8'}$, in terms of improvement in lithography properties and shape of the resist pattern, a linear or branched, saturated hydrocarbon group of 1 to 15 carbon atoms or a cyclic saturated hydrocarbon group of 3 to carbon atoms is preferable.

As the nitrogen-containing hydrocarbon group for $R^{9'}$ in —O—$R^{9'}$, a group in which part of the carbon atom in the aromatic hydrocarbon group or aliphatic hydrocarbon group has been substituted with a nitrogen atom.

Preferable examples thereof include a mono- or di-alkylaminoalkyl group in which one or two hydrogen atoms bonded to the nitrogen atom in the linear or branched aminoalkyl group of 1 to 10 carbon atoms have been substituted with alkyl groups of 1 to 10 carbon atoms.

Examples of the halogenated alkyl group in the halogenated alkylsulfonyloxy group include the same halogenated alkyl group as those described above as a substituent, and a trifluoromethyl group is particularly preferable.

With respect to —O—$W^1$—(O—$R^{11''}$—$S^+(R^{21''})(R^{31''}))_x$, as the arylene group, alkylene group or alkenylene group which may have a substituent for $R^{11''}$, a group in which one hydrogen atom has been removed from the aryl group, alkyl group or alkenyl group which may have a substituent for $R^{1''}$ can be mentioned.

As examples of $R^{21''}$ and $R^{31''}$, the same groups as those described above for $R^{2''}$ and $R^{3''}$ in the formula (b-1) can be given, respectively.

x represents 1 or 2.

$W^1$ represents a (x+1)-valent linking group, that is, divalent or trivalent linking group.

Examples of the divalent linking group for $W^1$ include the same divalent linking groups as those described above for $Y^2$. The divalent linking group may be linear, branched or cyclic, but is preferably cyclic. Among these, an arylene group having two carbonyl groups, each bonded to the terminal thereof is preferable. Specific examples of the arylene groups include a phenylene group and a naphthylene group. Of these, a phenylene group is particularly desirable.

Examples of the trivalent linking group for $W^1$ include a group in which one hydrogen atom has been removed from the divalent linking group, or a group in which one divalent linking group has been bonded to another divalent linking group. Examples of the divalent linking group include the same divalent linking groups as those described above for $Y^2$. The trivalent linking group for $W^1$ is preferably an arylene group combined with three carbonyl groups.

When the aryl group has a group represented by the formula —O—$W^1$—[O—$R^{11''}$—$S^+(R^{21''})(R^{31''})]_x$ as a substituent, it is preferable that $R^{1''}$ to $R^{3''}$ has single group represented by formula —O—W—[O—$R^{11''}$—$S^+(R^{21''})(R^{31''})]_x$ in total.

Specific examples of the cation moiety having a group represented by formula —O—$W^1$—[O—$R^{11''}$—$S^+(R^{21''})(R^{31''})]_x$ as a substituent include the anion moiety represented by general formula (ca-0) shown below.

[Chemical Formula 21]

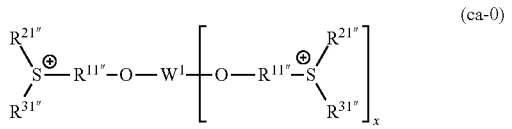

(ca-0)

In the formula, $R^{11''}$ represents an arylene group, an alkylene group or an alkenylene group which may have a substituent; each of $R^{21''}$ and $R^{31''}$ independently represents an aryl group, an alkyl group or an alkenyl group which may have a substituent, and $R^{21''}$ and $R^{31''}$ may be mutually bonded with the sulfur atom to form a ring; x represents 1 or 2, and $W^1$ represents (x+1)-valent linking group.

Examples of the alkyl group which may have a substituent for $R^{1''}$ to $R^{3''}$ include a substituted alkyl group in which part or all of hydrogen atoms of the unsubstituted alkyl group have been substituted with a substituent.

The unsubstituted alkyl group may be any of linear, branched or cyclic. In terms of achieving excellent resolution, an alkyl group of 1 to 10 carbon atoms is preferable, and an alkyl group of 1 to 5 carbon atoms. Specific examples include a methyl group, an ethyl group, an n-propyl group, an isopropyl group, an n-butyl group, an isobutyl group, an n-pentyl group, a cyclopentyl group, a hexyl group, a cyclohexyl group, a nonyl group and a decyl group.

Examples of the substituent of the substituted alkyl group include an alkoxy group, a halogen atom, a halogenated alkyl group, a hydroxy group, an oxo group (=O), a cyano group, an aryl group, an alkoxyalkyloxy group, an alkoxycarbonylalkyloxy group, —C(=O)—O—$R^{6'}$, —O—C(=O)—$R^{7'}$, —O—$R^{8'}$, —O—$R^{9'}$, a halogenated alkylsulfonyloxy group and —O—$W^1$—[O—$R^{11''}$—$S^+(R^{21''})(R^{3''})$]$_x$.

Examples of these substituents include an alkoxy group, a halogen atom, a halogenated alkyl group, a hydroxy group, an oxo group (=O), a cyano group, an aryl group, an alkoxyalkyloxy group, an alkoxycarbonylalkyloxy group, —C(=O)—O—$R^{6'}$, —O—C(=O)—$R^{7'}$, —O—$R^{8'}$, —O—$R^{9'}$, a halogenated alkylsulfonyloxy group and —O—$W^1$—[O—$R^{1''}$—$S^+(R^{21''})(R^{31''})$]$_x$ which are the same substituents as those described above in relation to the substituted aryl group for R1" to R3".

Examples of the alkenyl group which may have a substituent for substituting $R^{1''}$ to $R^{3''}$ include an unsubstituted alkenyl group and a substituted alkenyl group in which part or all of hydrogen atoms of the unsubstituted alkenyl group have been substituted with a substituent.

The unsubstituted alkylene group is preferably linear or branched. Further, the unsubstituted alkylene group preferably has 2 to 10 carbon atoms, more preferably 2 to 5, and still more preferably 2 to 4. Specific examples thereof include a vinyl group, a propenyl group (an allyl group), a butynyl group, a 1-methylpropenyl group and a 2-methylpropenyl group.

Examples of the substituent for the substituted alkenyl group include the same groups as those described above for substituent which the substituted alkyl group represented by $R^{1''}$ to $R^{3''}$ may have.

In the formula (b-1), preferable examples of the cation moiety represented by formula ($S^+(R^{1''})(R^{2''})(R^{3''})$) in which each of $R^{1''}$ to $R^{3''}$ independently represents an aryl group, an alkyl group or an alkenyl group which may have a substituent include cation moieties represented by formula (ca-1-1) to (ca-1-46) shown below.

[Chemical Formula 22]

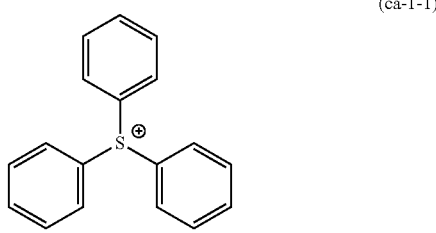

(ca-1-1)

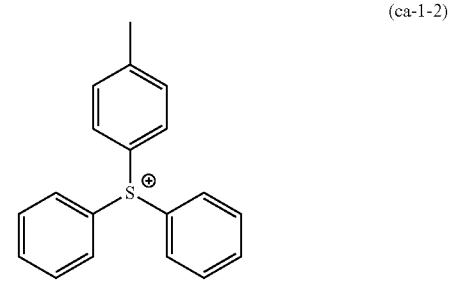

(ca-1-2)

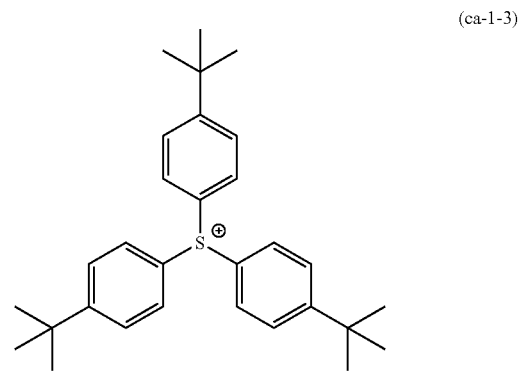

(ca-1-3)

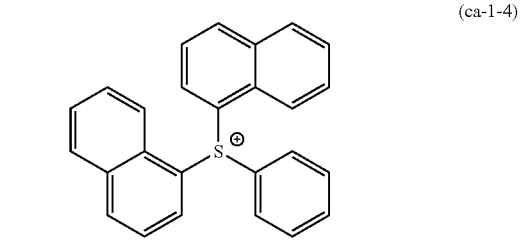

(ca-1-4)

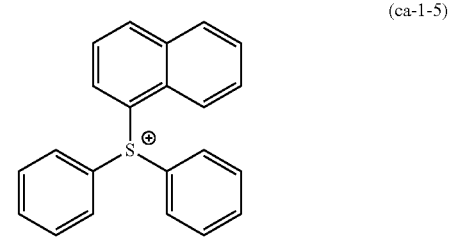

(ca-1-5)

-continued
(ca-1-6)
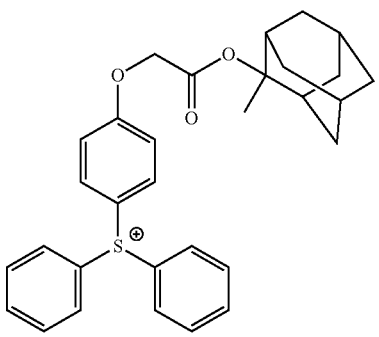
(ca-1-10)
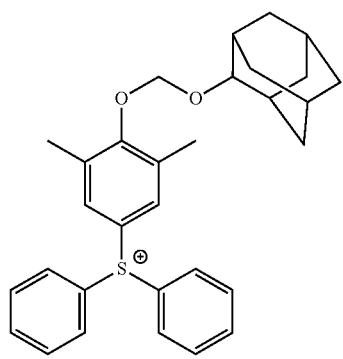
(ca-1-7)
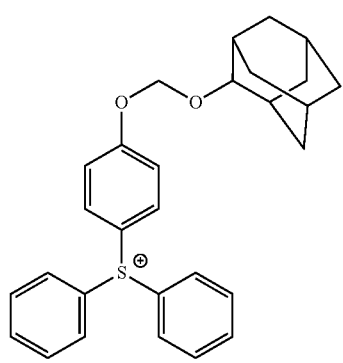
(ca-1-11)
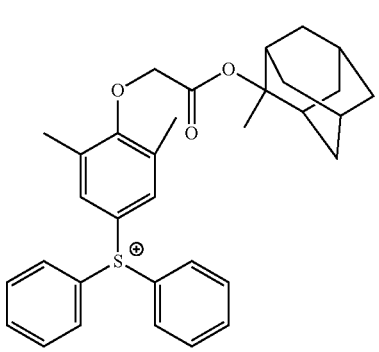
(ca-1-8)
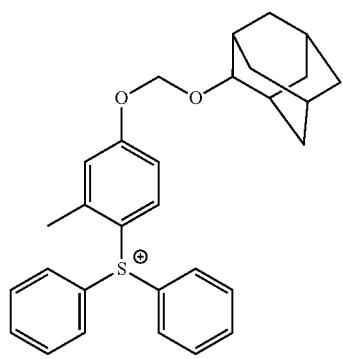
(ca-1-12)
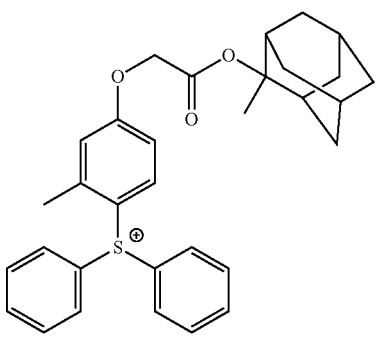
(ca-1-9)
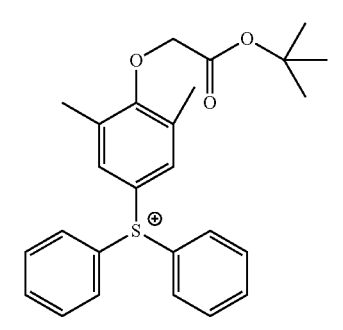
(ca-1-13)
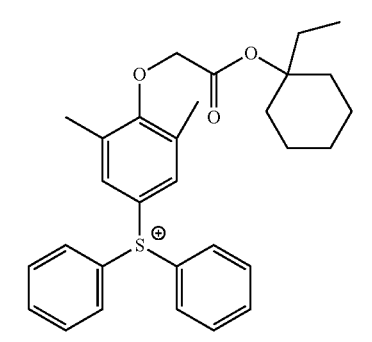

-continued
(ca-1-14)
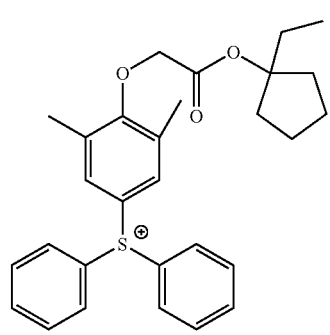
(ca-1-15)
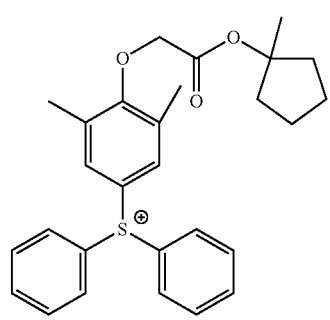
(ca-1-16)
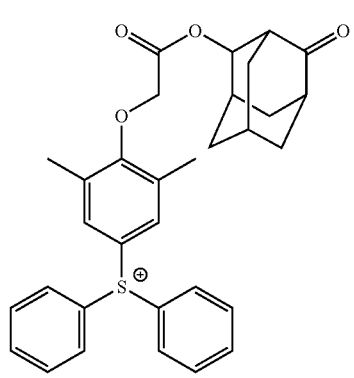
-continued
(ca-1-17)
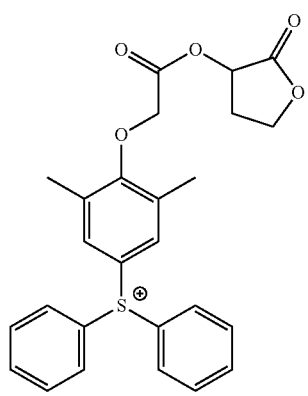
[Chemical Formula 23]
(ca-1-18)
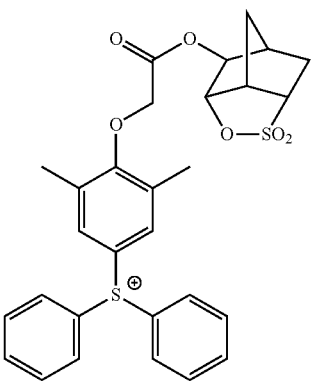
(ca-1-19)
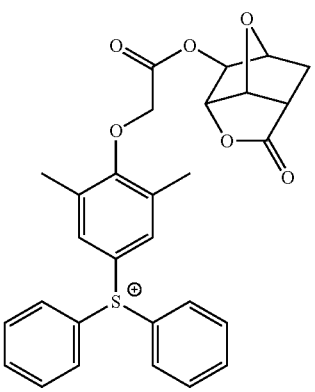
(ca-1-20)
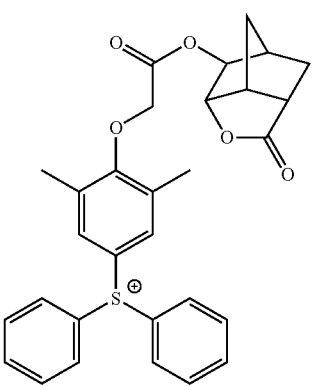

(ca-1-21) 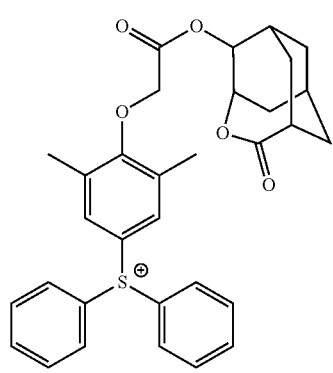
(ca-1-26) 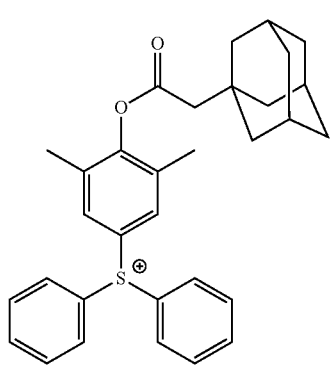
(ca-1-22) 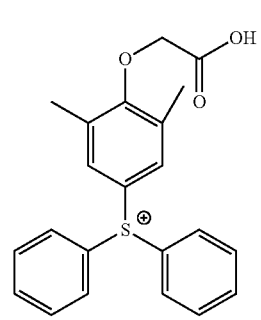
(ca-1-27) 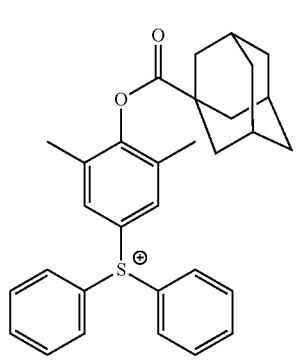
(ca-1-23) 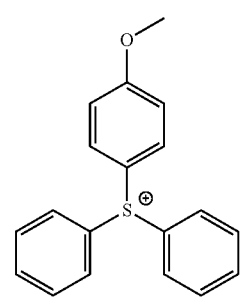
(ca-1-28) 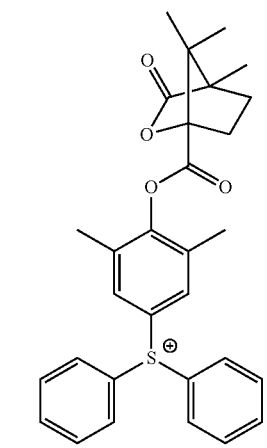
(ca-1-24) 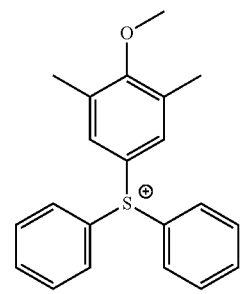
(ca-1-25)
(ca-1-29) 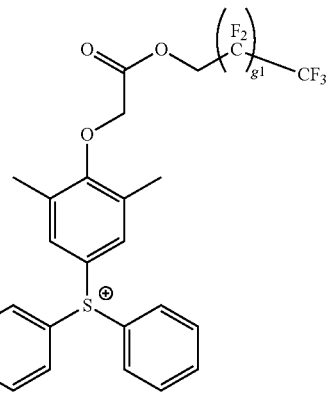

-continued
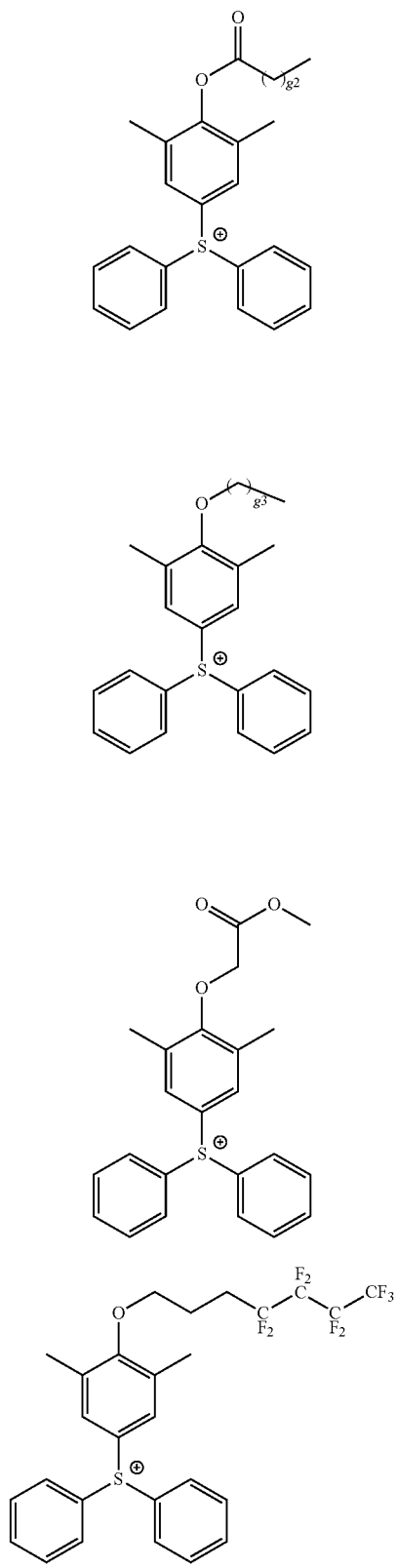
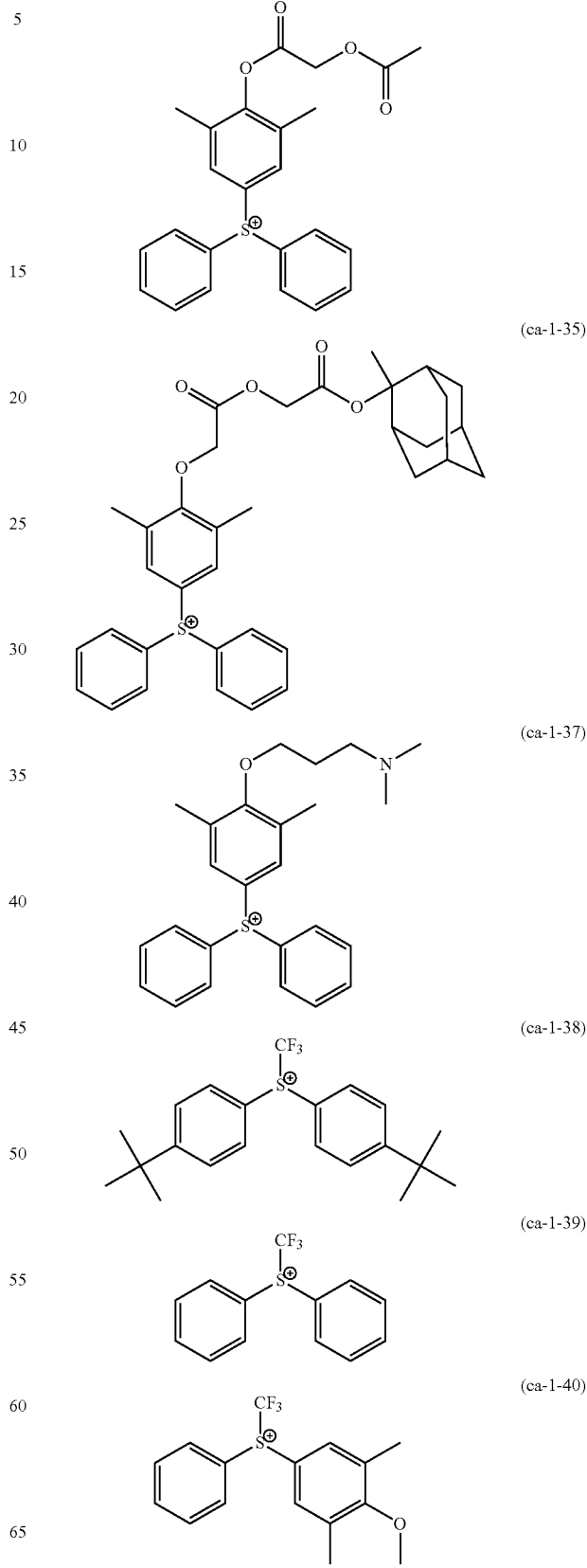
In the formulas, g1, g2 and g3 represent recurring numbers, wherein g1 is an integer of 1 to 5, g2 is an integer of 0 to 20, and g3 is an integer of 0 to 20.

(ca-1-41)

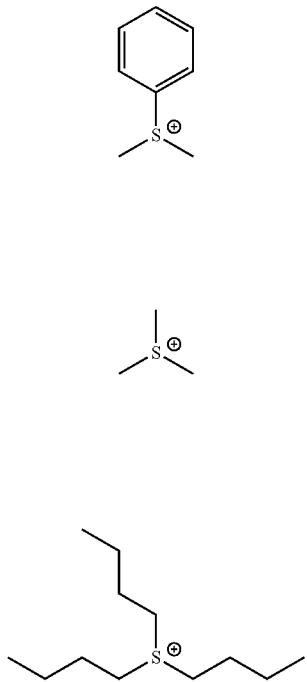

(ca-1-42)

(ca-1-43)

(ca-1-44)

(ca-1-45)

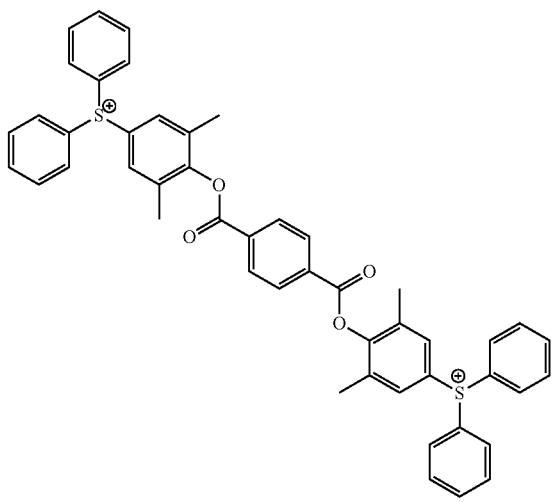

(ca-1-46)

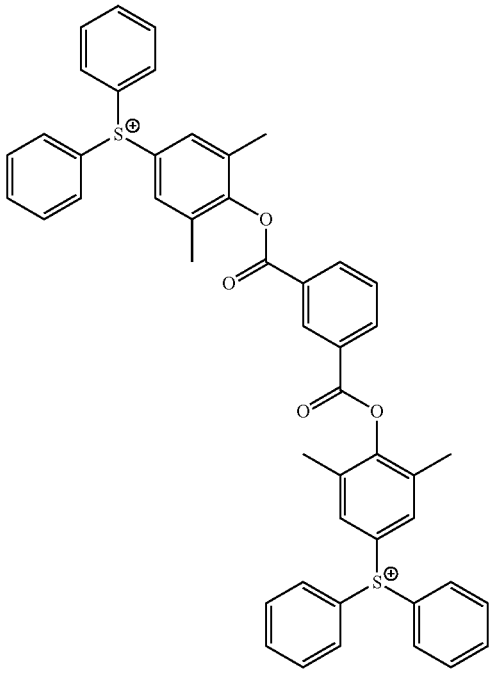

In formula (b-1), two of $R^{1'''}$ to $R^{3'}$ may be bonded to each other to form a ring with the sulfur atom. The ring may be saturated or unsaturated. Further, the ring may be monocyclic or polycyclic. For example, in the case where either one or both of the two of $R^{1'''}$ to $R^3$ represent a cyclic group (i.e., a cyclic alkyl group or an aryl group), when the two groups are bonded a polycyclic ring (fused ring) is formed.

As the ring to be formed, the ring containing the sulfur atom in the skeleton thereof is preferably a 3 to 10-membered ring, and most preferably a 5 to 7-membered ring.

The ring may have a hetero atom as an atom constituting the ring skeleton other than the sulfur atom having $R^{1'''}$ to $R^{3'''}$ bonded thereto. Examples of hetero atoms include an oxygen atom, a nitrogen atom, and a sulfur atom.

Specific examples of the rings to be formed include a thiophene ring, a thiazole ring, a benzothiophene ring, a thianthrene ring, a benzothiophene ring, a dibenzothiophene ring, a 9H-thioxanthene ring, a thioxanthone ring, a thianthrene ring, a phenoxathiin ring, a tetrahydrothiophenium ring and tetrahydrothiopyranium ring.

In the formula (b-1), preferable examples of the cation moiety represented by formula $(S^+(R^{1''})(R^{2''})(R^{3''}))$ in which two of $R^{1'''}$ to $R^{3'''}$ are mutually bonded with the sulfur atom to form a ring include cation moieties represented by formula (ca-12) to (ca-15) shown below.

[Chemical Formula 25]

(ca-12)

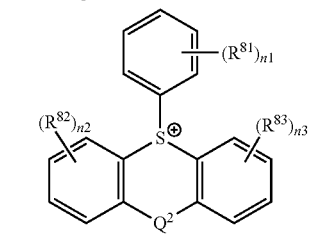

-continued (ca-13)

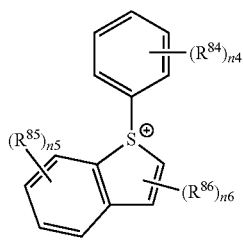

In the formulas, $Q^2$ represents a single bond, a methylene group, a sulfur atom, an oxygen atom, a nitrogen atom, a carbonyl group, —SO—, —SO$_2$—, —SO$_3$—, —COO—, —CONH— or —N(R$_N$)— (R$_N$ represents an alkyl group of 1 to 5 carbon atoms); each of $R^{81}$ to $R^{86}$ independently represents an alkyl group, an acetyl group, an alkoxy group, a carboxy group, a hydroxy group or a hydroxyalkyl group; each of $n_1$ to $n_5$ independently represents an integer of 0 to 3; and $n_6$ represents an integer of 0 to 2.

[Chemical Formula 26]

(ca-14)

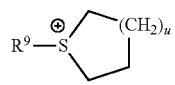

(ca-15)

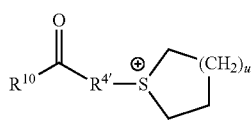

In the formulas, u represents an integer of 1 to 3; $R^9$ represents a phenyl group, a naphthyl group or an alkyl group which may have a substituent; $R^{10}$ represents a hydroxy group, a phenyl group, a naphthyl group, an alkyl group or an alkoxy group which may have a substituent; and $R^{4'}$ represents an alkylene group which may have a substituent.

In the formulas (ca-12) and (ca-13), the alkyl group for $R^{81}$ to $R^{86}$ is preferably an alkyl group of 1 to 5 carbon atoms, more preferably a linear or branched alkyl group, and particularly preferably a methyl group, an ethyl group, a propyl group, an isopropyl group, an n-butyl group or a tert-butyl group.

The alkoxy group is preferably an alkoxy group of 1 to 5 carbon atoms, more preferably a linear or branched alkoxy group, and most preferably a methoxy group or an ethoxy group.

The hydroxyalkyl group is preferably a group in which one or more hydrogen atoms in the aforementioned alkyl group have been substituted with hydroxy groups, and examples thereof include a hydroxymethyl group, a hydroxyethyl group and a hydroxypropyl group.

If there are two or more of an individual $R^{81}$ to $R^{86}$ group, as indicated by the corresponding value of $n_1$ to $n_6$ then the two or more of the individual $R^{81}$ to $R^{86}$ group may be the same or different from each other.

$n_1$ is preferably 0 to 2, more preferably 0 or 1, and still more preferably 0.

It is preferable that each of $n_2$ and $n_3$ independently represent 0 or 1, and more preferably 0.

$n_4$ is preferably 0 to 2, and more preferably 0 or 1.

$n_5$ is preferably 0 or 1, and more preferably 0.

$n_6$ is preferably 0 or 1, and more preferably 1.

Preferable examples of the cation represented by the formula (ca-12) or (ca-13) are shown below.

[Chemical Formula 27]

(ca-12-1)

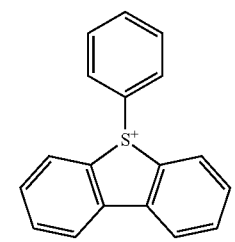

(ca-12-2)

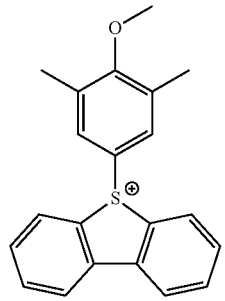

(ca-12-3)

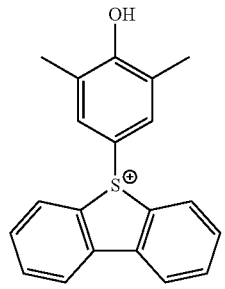

(ca-12-4)

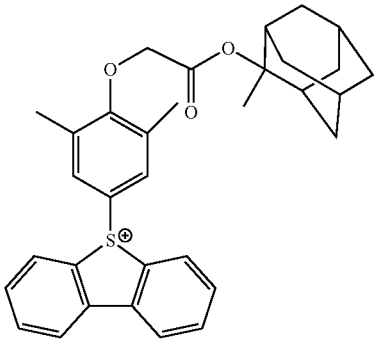

-continued

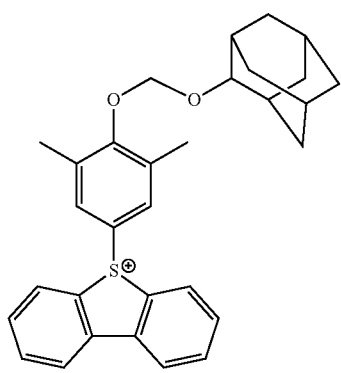
(ca-12-5)

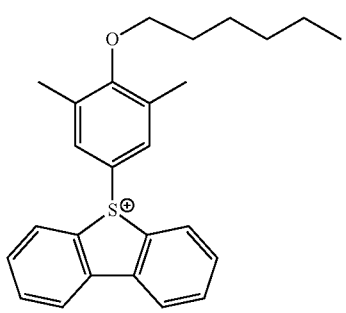
(ca-12-6)

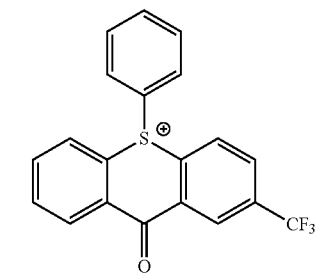
(ca-12-7)

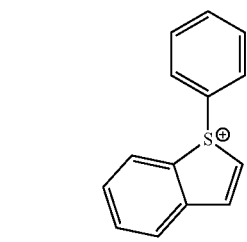
(ca-13-1)

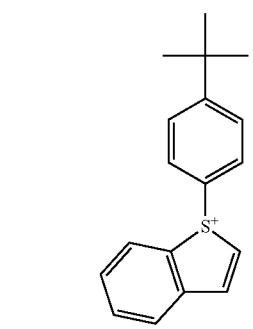
(ca-13-2)

In the formulas (ca-14) and (ca-15), u is an integer of 1 to 3, and most preferably 1 or 2.

$R^9$ represents a phenyl group, a naphthyl group or an alkyl group which may have a substituent.

Further, examples of the substituent for the phenyl group or naphthyl group represented by $R^9$ include the same groups as those described above for substituents which the substituted aryl group represented by $R^{1'''}$ to $R^{3'''}$ may have. Specific examples thereof include an alkyl group, an alkoxy group, a halogen atom, a halogenated alkyl group, a hydroxy group, an oxo group (=O), a cyano group, an aryl group, an alkoxyalkyloxy group, an alkoxycarbonylalkyloxy group, —C(=O)—O—$R^{6'}$, —O—C(=O)—$R^{7'}$, —O—$R^{8'}$, —O—$R^{9'}$, a halogenated alkylsulfonyoxy group and —O—$W^{1'}$—[O—$R^{11'''}$—$S^+(R^{21'''})(R^{31'''})]_x$.

As the alkyl group which may have a substituent for $R^9$, the same alkyl group which may have a substituent as those described above for $R^{1'''}$ to $R^{3'''}$.

$R^{10}$ represents a hydroxy group, a phenyl group, a naphthyl group, an alkyl group and an alkoxy group which may have a substituent.

Examples of the substituent for the phenyl group or naphthyl group represented by $R^{10}$ include the same groups as those described above for substituent which the phenyl group or naphthyl group represented by $R^9$ may have.

As the alkyl group in the alkyl group and alkoxy group which may have a substituent for $R^{10}$, the same alkyl group as those described above for $R^{1'''}$ to $R^{3'''}$ can be mentioned.

As the alkylene group for $R^{4'}$, a linear or branched alkylene group is preferable. The alkylene group preferably has 1 to 12 carbon atoms, more preferably 1 to 5 carbon atoms, still more preferably 1 to 3 carbon atoms and particularly preferably 1 or 2 carbon atoms.

Further, examples of the substituent which the alkylene group represented by $R^{4'}$ may have include the same groups as those described above for substituent which the substituted alkyl group represented by $R^{1'''}$ to $R^{3'''}$ may have. Specific examples thereof include an alkoxy group, a halogen atom, a halogenated alkyl group, a hydroxy group, an oxo group (=O), a cyano group, an aryl group, an alkoxyalkyloxy group, an alkoxycarbonylalkyloxy group, —C(=O)—O—$R^{6'}$, —O—C(=O)—$R^{7'}$, —O—$R^{8'}$, —O—$R^{9'}$, a halogenated alkylsulfonyoxy group and —O—$W^{1'}$—[O—$R^{11'''}$—$S^+(R^{21'''})(R^{31'''})]_x$.

Preferable examples of the cation represented by formula (ca-14) or (ca-15) are shown below.

[Chemical Formula 28]

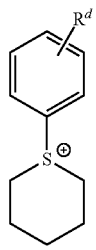
(ca-14-1)

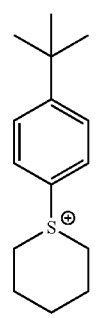
(ca-14-2)

-continued (ca-14-3) 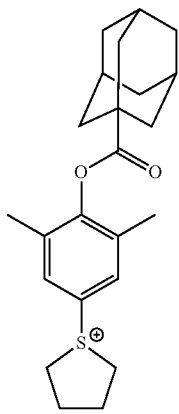

(ca-14-4) 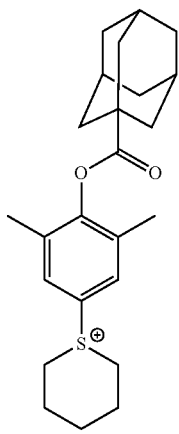

(ca-14-5) 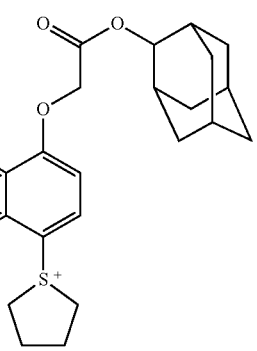

(ca-15-1) 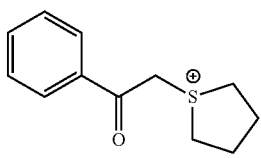

(ca-15-2) 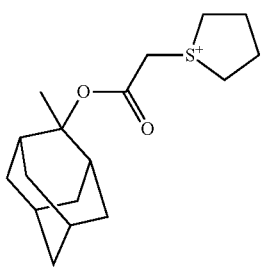

In formula (ca-14-1), Rd represents a substituent. Examples of substituents include the same groups as those described above for substituents which the phenyl group or naphthyl group for $R^9$ may have. Specific examples thereof include an alkyl group, an alkoxy group, a halogen atom, a halogenated alkyl group, a hydroxy group, an oxo group (=O), a cyano group, an aryl group, an alkoxyalkyloxy group, an alkoxycarbonylalkyloxy group, —C(=O)—O—$R^{6'}$, —O—C(=O)—$R^{7'}$, —O—$R^{8'}$, —O—$R^{9'}$, a halogenated alkylsulfonyoxy group and —O—$W^1$—[O—$R^{11"}$—$S^+(R^{21"})(R^{31"})]_x$.

As the aryl group, alkyl group or alkenyl group which may have a substituent for $R^{5"}$ and $R^{6"}$ in the formula (b-2), the same aryl group, alkyl group or alkenyl group which may have a substituent as those described above for $R^{1"}$ to $R^{3"}$ can be mentioned.

It is preferable that at least one of $R^{5"}$ and $R^{6"}$ represents an aryl group which may have a substituent, and it is more preferable that both of $R^{5"}$ and $R^{6"}$ represent an aryl group which may have a substituent.

Specific examples of the cation moiety $(I^+(R^{5"})(R^{6"}))$ in the formula (b-2) include diphenyliodonium and bis(4-tert-butylphenyl)iodonium.

Anion Moiety

In the formulas (b-1) and (b-2), $Z^-$ represents a counteranion, and preferably "$R^{4"}SO_3^-$".

$R^{4"}$ represents an alkyl group, a halogenated alkyl group, an aryl group or an alkenyl group which may have a substituent.

The alkyl group for $R^{4"}$ may be any of linear, branched or cyclic.

The linear or branched alkyl group for $R^{4"}$ preferably has 1 to 10 carbon atoms, more preferably 1 to 8 carbon atoms, and most preferably 1 to 4 carbon atoms.

The cyclic alkyl group for $R^{4"}$ preferably has 4 to 15 carbon atoms, more preferably 4 to 10, and most preferably 6 to 10.

When $R^{4"}$ represents an alkyl group, examples of "$R^{4"}SO_3^-$" includes alkylsulfonates such as methanesulfonate, n-propanesulfonate, n-butanesulfonate, n-octanesulfonate, 1-adamantanesulfonate, 2-norbornanesulfonate, d-camphor-10-sulfonate.

The halogenated alkyl group for $R^{4"}$ is a group in which part of all of the hydrogen atoms in the alkyl group have been substituted with a halogen atom. As the alkyl group, an alkyl group of 1 to 5 carbon atoms is preferred. Among these, a linear or branched alkyl group is preferred, and more preferably a methyl group, an ethyl group, a propyl group, an isopropyl group, an n-butyl group, a tert-butyl group, a tert-pentyl group or an isopentyl group. Examples of the halogen atom which substitutes the hydrogen atoms include a fluorine atom, a chlorine atom, an iodine atom and a bromine atom.

With respect to the halogenated alkyl group, 50 to 100% of the hydrogen atoms in the alkyl group (alkyl group before halogenation) are preferably substituted with the halogen atoms, and all of the hydrogen atoms are more preferably substituted with the halogen atoms.

As the halogenated alkyl group, a fluorinated alkyl group is desirable. The fluorinated alkyl group preferably has 1 to 10 carbon atoms, more preferably 1 to 8 carbon atoms, and most preferably 1 to 4 carbon atoms.

Further, the fluorination ratio of the fluorinated alkyl group is preferably from 10 to 100%, more preferably from 50 to 100%, and it is most preferable that all hydrogen atoms are substituted with fluorine atoms because the acid strength increases.

Specific examples of the fluorinated alkyl group include a trifluoromethyl group, a heptafluoro-n-propyl group and a nonafluoro-n-butyl group.

As examples of the aryl group for $R^{4'''}$, the same aryl groups as those described above for $R^{1'''}$ to $R^{3'''}$, $R^{5'''}$ and $R^{6'''}$ can be used. Among these, the substituent is preferably an aryl group of 6 to 20 carbon atoms.

As examples of the alkenyl group for $R^{4'''}$, the same aryl groups as those described above for $R^{1'''}$ to $R^{3'''}$, $R^{5'''}$ and $R^{6'''}$ can be used. Among these, an alkenyl group of 2 to 10 carbon atoms is preferable.

The alkyl group, halogenated alkyl group, aryl group or alkenyl group for $R^{4'''}$ may have a substituent.

The expression "may have a substituent" means that part of or all of the hydrogen atoms within the aforementioned linear, branched or cyclic alkyl group, halogenated alkyl group, aryl group or alkenyl group may be substituted with substituents (atoms other than hydrogen atoms, or groups).

$R^{4'''}$ may have one substituent, or two or more substituents.

Examples of the substituent include a halogen atom, a hetero atom, an alkyl group, and a group represented by the formula $X^3$-Q'- (in the formula, Q' represents a divalent linking group containing an oxygen atom; and $X^3$ represents a hydrocarbon group of 3 to carbon atoms which may have a substituent).

Examples of halogen atoms and alkyl groups include the same halogen atoms and alkyl groups as those described above with respect to the halogenated alkyl group for $R^{4'''}$.

Examples of hetero atoms include an oxygen atom, a nitrogen atom, and a sulfur atom.

In the group represented by formula $X^3$-Q'-, Q' represents a divalent linking group containing an oxygen atom.

Q' may contain an atom other than an oxygen atom. Examples of atoms other than oxygen include a carbon atom, a hydrogen atom, a sulfur atom and a nitrogen atom.

Examples of divalent linkage groups containing an oxygen atom include non-hydrocarbon, oxygen atom-containing linkage groups such as an oxygen atom (an ether bond; —O—), an ester bond (—C(=O)—O—), an amido bond (—C(=O)—NH—), a carbonyl group (—C(=O)—) and a carbonate group (—O—C(=O)—O—); and a combination of any of the aforementioned non-hydrocarbon, oxygen atom-containing linkage groups with an alkylene group. To the combination, a sulfonyl group (—SO$_2$—) may further be linked.

Specific examples of the combinations of the aforementioned non-hydrocarbon, oxygen atom-containing linkage groups with alkylene groups include —R$^{91}$—O—, —R$^{92}$—O—C(=O)—, —C(=O)—O—R$^{93}$—O—C(=O)—, —SO$_2$—O—R$^{94}$—O—C(=O)— and —R$^{95}$—SO$_2$—O—R$^{94}$—O—C(=O)-(in the formulas, R$^{91}$ to R$^{95}$ each independently represent an alkylene group.)

The alkylene group for R$^{91}$ to R$^{95}$ is preferably a linear or branched alkylene group, and preferably has 1 to 12 carbon atoms, more preferably 1 to 5, and most preferably 1 to 3.

Specific examples of the alkylene group include a methylene group [—CH$_2$—]; alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)— and —C(CH$_2$CH$_3$)$_2$—; an ethylene group [—CH$_2$CH$_2$—]; alkylethylene groups such as —CH(CH$_3$)CH$_2$—, —CH(CH$_3$)CH(CH$_3$)—, —C(CH$_3$)$_2$CH$_2$— and —CH(CH$_2$CH$_3$)CH$_2$—; a trimethylene group (n-propylene group) [—CH$_2$CH$_2$CH$_2$—]; alkyltrimethylene groups such as —CH(CH$_3$)CH$_2$CH$_2$— and —CH$_2$CH(CH$_3$)CH$_2$—; a tetramethylene group [—CH$_2$CH$_2$CH$_2$CH$_2$—]; alkyltetramethylene groups such as —CH(CH$_3$)CH$_2$CH$_2$CH$_2$— and —CH$_2$CH(CH$_3$)CH$_2$CH$_2$—; and a pentamethylene group [—CH$_2$CH$_2$CH$_2$CH$_2$CH$_2$—].

Q' is preferably a divalent linking group containing an ester bond or ether bond, and more preferably a group of —R$^{91}$—O—, —R$^{92}$—O—C(=O)— or —C(=O)—O—R$^{93}$—O—C(=O)—.

In the group represented by the formula $X^3$-Q'-, $X^3$ represents a hydrocarbon group of 1 to 30 carbon atoms which may have a substituent.

The hydrocarbon group for $X^3$ may be either an aromatic hydrocarbon group or an aliphatic hydrocarbon group.

The aromatic hydrocarbon group is a hydrocarbon group having an aromatic ring. The aromatic hydrocarbon group preferably has 5 to 30 carbon atoms, more preferably 5 to 20, still more preferably 6 to 15, and most preferably 6 to 12. Here, the number of carbon atoms within a substituent(s) is not included in the number of carbon atoms of the aromatic ring.

Specific examples of aromatic hydrocarbon groups include an aryl group which is an aromatic hydrocarbon ring having one hydrogen atom removed therefrom, such as a phenyl group, a biphenyl group, a fluorenyl group, a naphthyl group, an anthryl group or a phenanthryl group; and an alkylaryl group such as a benzyl group, a phenethyl group, a 1-naphthylmethyl group, a 2-naphthylmethyl group, a 1-naphthylethyl group, or a 2-naphthylethyl group. The alkyl chain within the arylalkyl group preferably has 1 to 4 carbon atom, more preferably 1 or 2, and particularly preferably 1.

The aromatic hydrocarbon group may have a substituent. For example, part of the carbon atoms constituting the aromatic ring within the aromatic hydrocarbon group may be substituted with a hetero atom, or a hydrogen atom bonded to the aromatic ring within the aromatic hydrocarbon group may be substituted with a substituent.

In the former example, a heteroaryl group in which part of the carbon atoms constituting the ring within the aforementioned aryl group has been substituted with a hetero atom such as an oxygen atom, a sulfur atom or a nitrogen atom, and a heteroarylalkyl group in which part of the carbon atoms constituting the aromatic hydrocarbon ring within the aforementioned arylalkyl group has been substituted with the aforementioned heteroatom can be used.

In the latter example, as the substituent for the aromatic hydrocarbon group, an alkyl group, an alkoxy group, a halogen atom, a halogenated alkyl group, a hydroxy group, an oxygen atom (=O) or the like can be used.

The alkyl group as a substituent for the aromatic hydrocarbon group is preferably an alkyl group of 1 to 5 carbon atoms, and a methyl group, an ethyl group, a propyl group, an n-butyl group or a tert-butyl group is most desirable.

The alkoxy group as a substituent for the aromatic hydrocarbon group is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

Examples of the halogen atom as a substituent for the aromatic hydrocarbon group include a fluorine atom, a chlorine atom, a bromine atom and an iodine atom, and a fluorine atom is preferable.

Example of the halogenated alkyl group as a substituent for the aromatic hydrocarbon group includes a group in which part or all of the hydrogen atoms within the aforementioned alkyl group have been substituted with the aforementioned halogen atoms.

The aliphatic hydrocarbon group for $X^3$ may be either a saturated aliphatic hydrocarbon group, or an unsaturated aliphatic hydrocarbon group. Further, the aliphatic hydrocarbon group may be linear, branched or cyclic.

In the aliphatic hydrocarbon group for $X^3$, part of the carbon atoms constituting the aliphatic hydrocarbon group may be substituted with a substituent group containing a hetero atom, or part or all of the hydrogen atoms constituting the aliphatic hydrocarbon group may be substituted with a substituent group containing a hetero atom.

As the "hetero atom" for $X^3$, there is no particular limitation as long as it is an atom other than carbon and hydrogen. Examples of hetero atoms include a halogen atom, an oxygen atom, a sulfur atom and a nitrogen atom.

Examples of the halogen atom include a fluorine atom, a chlorine atom, an iodine atom and a bromine atom.

The substituent group containing a hetero atom may be a group consisting of a hetero atom, or may be a group containing a group or atom other than a hetero atom.

Specific examples of the substituent group for substituting a part of the carbon atoms include —O—, —C(=O)—O—, —C(=O)—, —O—C(=O)—O—, —C(=O)—NH—, —NH— (wherein the H may be substituted with a substituent such as an alkyl group or an acyl group), —S—, —S(=O)$_2$— and —S(=O)$_2$—O—. When the aliphatic hydrocarbon group is cyclic, the aliphatic hydrocarbon group may contain any of these substituent groups in the ring structure.

Examples of the substituent group for substituting part or all of the hydrogen atoms include an alkoxy group, a halogen atom, a halogenated alkyl group, a hydroxy group, an oxygen atom (=O) and a cyano group.

The aforementioned alkoxy group is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

Examples of the aforementioned halogen atom include a fluorine atom, a chlorine atom, a bromine atom and an iodine atom, and a fluorine atom is preferable.

Example of the aforementioned halogenated alkyl group includes a group in which a part or all of the hydrogen atoms within an alkyl group of 1 to 5 carbon atoms (e.g., a methyl group, an ethyl group, a propyl group, an n-butyl group or a tert-butyl group) have been substituted with the aforementioned halogen atoms.

As the aliphatic hydrocarbon group, a linear or branched saturated hydrocarbon group, a linear or branched monovalent unsaturated hydrocarbon group, or a cyclic aliphatic hydrocarbon group (aliphatic cyclic group) is preferable.

The linear saturated hydrocarbon group (alkyl group) preferably has 1 to 20 carbon atoms, more preferably 1 to 15, and most preferably 1 to 10. Specific examples include a methyl group, an ethyl group, a propyl group, a butyl group, a pentyl group, a hexyl group, a heptyl group, an octyl group, a nonyl group, a decyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group and a docosyl group.

The branched saturated hydrocarbon group (alkyl group) preferably has 3 to 20 carbon atoms, more preferably 3 to 15, and most preferably 3 to 10. Specific examples include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group.

The unsaturated hydrocarbon group preferably has 2 to 10 carbon atoms, more preferably 2 to 5, still more preferably 2 to 4, and particularly preferably 3. Examples of linear monovalent unsaturated hydrocarbon groups include a vinyl group, a propenyl group (an allyl group) and a butynyl group. Examples of branched monovalent unsaturated hydrocarbon groups include a 1-methylpropenyl group and a 2-methylpropenyl group.

Among the above-mentioned examples, as the unsaturated hydrocarbon group, a propenyl group is particularly desirable.

The aliphatic cyclic group may be either a monocyclic group or a polycyclic group. The aliphatic cyclic group preferably has 3 to 30 carbon atoms, more preferably 5 to 30, still more preferably 5 to 20, particularly preferably 6 to 15, and most preferably 6 to 12.

As the aliphatic cyclic group, a group in which one or more hydrogen atoms have been removed from a monocycloalkane or a polycycloalkane such as a bicycloalkane, tricycloalkane or tetracycloalkane can be used. Specific examples include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane.

When the aliphatic cyclic group does not contain a hetero atom-containing substituent group in the ring structure thereof, the aliphatic cyclic group is preferably a polycyclic group, more preferably a group in which one or more hydrogen atoms have been removed from a polycycloalkane, and a group in which one or more hydrogen atoms have been removed from adamantane is particularly desirable.

When the aliphatic cyclic group contains a hetero atom-containing substituent group in the ring structure thereof, the hetero atom-containing substituent group is preferably —O—, —C(=O)—O—, —S—, —S(=O)$_2$— or —S(=O)$_2$ —O—. Specific examples of such aliphatic cyclic groups include groups represented by formulas (L1) to (L6) and (S1) to (S4) shown below.

[Chemical Formula 29]

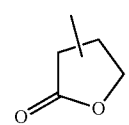

(L1)

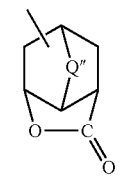

(L2)

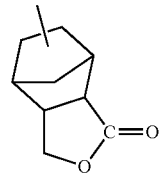

(L3)

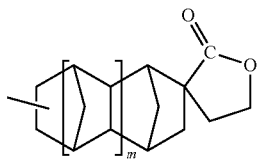
(L4)

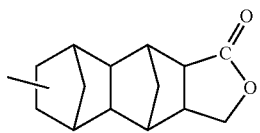
(L5)

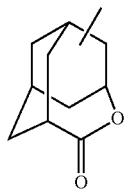
(L6)

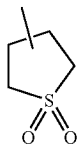
(S1)

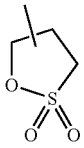
(S2)

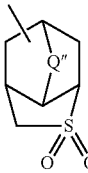
(S3)

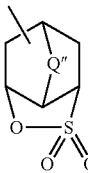
(S4)

In the formulas, Q" represents an alkylene group of 1 to 5 carbon atoms, —O—, —S—, —O—$R^{94}$— or —S—$R^{95}$—, and $R^{94}$ and $R^{95}$ each independently represent an alkylene group of 1 to carbon atoms; and m represents an integer of 0 or 1.

As the alkylene group for Q", $R^{94}$ and $R^{95}$, the same alkylene groups as those described above for $R^{91}$ to $R^{93}$ can be used.

In these aliphatic cyclic groups, part of the hydrogen atoms bonded to the carbon atoms constituting the ring structure may be substituted with a substituent. Examples of substituents include an alkyl group, an alkoxy group, a halogen atom, a halogenated alkyl group, a hydroxy group and an oxygen atom (=O).

As the alkyl group, an alkyl group of 1 to 5 carbon atoms is preferable, and a methyl group, an ethyl group, a propyl group, an n-butyl group or a tert-butyl group is particularly desirable.

As the alkoxy group and the halogen atom, the same groups as the substituent groups for substituting part or all of the hydrogen atoms can be used.

As $X^3$, a cyclic group which may have a substituent is preferable. The cyclic group may be either an aromatic hydrocarbon group which may have a substituent, or a cyclic alkyl group which may have a substituent, and an aliphatic cyclic group which may have a substituent is preferable.

As the aromatic hydrocarbon group, a phenyl group which may have a substituent or a naphthyl group which may have a substituent is preferable. As the substituent, a fluorine atom is preferable.

As the cyclic alkyl group which may have a substituent, a polycyclic alkyl group which may have a substituent is preferable. As the polycyclic alkyl group, the aforementioned group in which one or more hydrogen atoms have been removed from a polycycloalkane, and groups represented by formulas (L2) to (L7), (S3) and (S4) are preferable.

Among the above, as $R^{4"}$, a halogenated alkyl group or a group having $X^3$-Q'- as a substituent is preferable.

When the $R^{4"}$ group has $X^3$-Q'- as a substituent, as $R^{4"}$, a group represented by the formula: $X^3$-Q'-$Y^5$— (in the formula, Q' and $X^3$ are the same as defined above, and $Y^5$ represents an alkylene group of 1 to 4 carbon atoms which may have a substituent or a fluorinated alkylene group of 1 to 4 carbon atoms which may have a substituent is preferable.

In the group represented by the formula $X^3$-Q'-$Y^5$—, as the alkylene group for $Y^5$, the same alkylene group as those described above for Q' in which the number of carbon atoms is 1 to 4 can be used.

As the fluorinated alkylene group, the aforementioned alkylene group in which part or all of the hydrogen atoms has been substituted with fluorine atoms can be used.

Specific examples of $Y^5$ include —$CF_2$—, —$CF_2CF_2$—, —$CF_2CF_2CF_2$—, —$CF(CF_3)CF_2$—, —$CF(CF_2CF_3)$—, —$C(CF_3)_2$—, —$CF_2CF_2CF_2CF_2$—, —$CF(CF_3)CF_2CF_2$—, —$CF_2CF(CF_3)CF_2$—, —$CF(CF_3)CF(CF_3)$—, —$C(CF_3)_2CF_2$—, —$CF(CF_2CF_3)CF_2$—, —$CF(CF_2CF_2CF_3)$—, —$C(CF_3)(CF_2CF_3)$—; —CHF—, —$CH_2CF_2$—, —$CH_2CH_2CF_2$—, —$CH_2CF_2CF_2$—, —$CH(CF_3)CH_2$—, —$CH(CF_2CF_3)$—, —$C(CH_3)(CF_3)$—, —$CH_2CH_2CH_2CF_2$—, —$CH_2CH_2CF_2CF_2$—, —$CH(CF_3)CH_2CH_2$—, —$CH_2CH(CF_3)CH_2$—, —$CH(CF_3)CH(CF_3)$—, —$C(CF_3)_2CH_2$—; —$CH_2$—, —$CH_2CH_2$—, —$CH_2CH_2CH_2$—, —$CH(CH_3)CH_2$—, —$CH(CH_2CH_3)$—, —$C(CH_3)_2$—, —$CH_2CH_2CH_2CH_2$—, —$CH(CH_3)CH_2CH_2$—, —$CH_2CH(CH_3)CH_2$—, —$CH(CH_3)CH(CH_3)$—, —$C(CH_3)_2CH_2$—, —$CH(CH_2CH_3)CH_2$—, —$CH(CH_2CH_2CH_3)$—, —$C(CH_3)(CH_2CH_3)$—.

As $Y^5$, a fluorinated alkylene group is preferable, and a fluorinated alkylene group in which the carbon atom bonded to the adjacent sulfur atom is fluorinated is particularly desirable. Examples of such fluorinated alkylene groups include —$CF_2$—, —$CF_2CF_2$—, —$CF_2CF_2CF_2$—, —CF(CF3)$CF_2$—, —$CF_2CF_2CF_2CF_2$—, —$CF(CF_3)CF_2CF_2$—, —$CF_{22}CF(CF_3)CF_2$—, —$CF(CF_3)CF(CF_3)$—, —$C(CF_3)_2CF_2$—, —$CF(CF_2CF_3)CF_2$—, —$CH_2CF_2$—, —$CH_2CH_2CF_2$—, —$CH_2CF_2CF_2$—, —$CH_2CH_2CH_2CF_2$—, —$CH_2CH_2CF_2CF_2$— and —$CH_2CF_2CF_2CF_2$—.

Of these, —$CF_2$—, —$CF_2CF_2$—, —$CF_2CF_2CF_2$— or $CH_2CF_2CF_2$— is preferable, —$CF_2$—, —$CF_2CF_2$— or —$CF_2CF_2CF_2$— is more preferable, and —$CF_2$— is particularly desirable.

The alkylene group or fluorinated alkylene group may have a substituent. The alkylene group or fluorinated alkylene group "has a substituent" means that part or all of the hydrogen atoms or fluorine atoms in the alkylene group or fluorinated alkylene group has been substituted with groups or atoms other than hydrogen atoms and fluorine atoms.

Examples of substituents which the alkylene group or fluorinated alkylene group may have include an alkyl group of 1 to 4 carbon atoms, an alkoxy group of 1 to 4 carbon atoms, and a hydroxy group.

Specific examples of groups represented by formula $R^{4''}SO_3$— in which $R^{4''}$ represents $X^3$-$Q'$-$Y^5$— include anions represented by the following formulae (b1) to (b9).

[Chemical Formula 30]

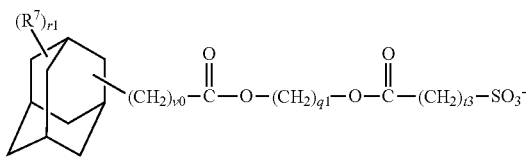
(b1)

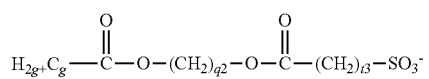
(b2)

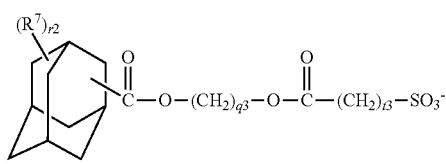
(b3)

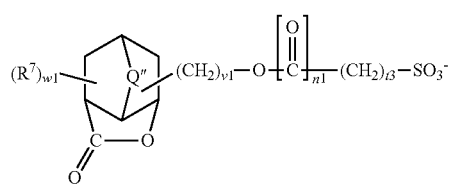
(b4)

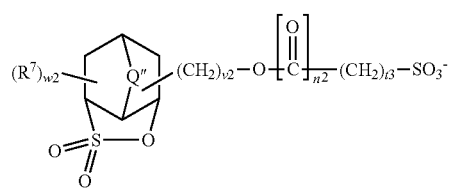
(b5)

[Chemical Formula 31]

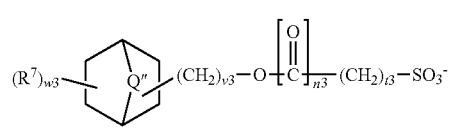
(b6)

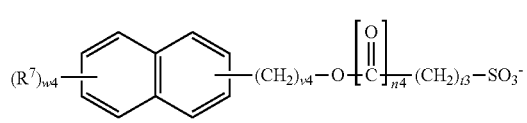
(b7)

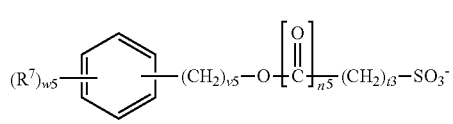
(b8)

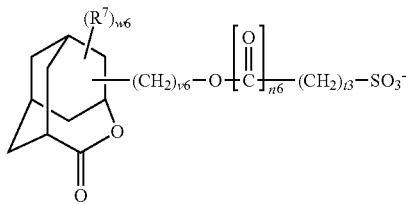
(b9)

In the formulas, each of q1 and q2 independently represents an integer of 1 to 5; q3 represents an integer of 1 to 12; t3 represents an integer of 1 to 3; each of r1 and r2 independently represents an integer of 0 to 3; g represents an integer of 1 to 20; $R^7$ represents a substituent; each of n1 to n6 independently represents 0 or 1; each of v0 to v6 independently represents an integer of 0 to 3; each of w1 to w6 independently represents an integer of 0 to 3; and Q" is the same as defined above.

As the substituent for $R^7$, the same groups as those which the aforementioned aliphatic hydrocarbon group or aromatic hydrocarbon group for $X^3$ may have as a substituent can be used.

If there are two or more of the $R^7$ group, as indicated by the values r1, r2, and w1 to w6 then the two or more of the $R^7$ groups may be the same or different from each other.

Further, onium salt-based acid generators in which the anion moiety ($R^{4''}SO_3$) in the general formula (b-1) or (b-2) is replaced by an anion moiety represented by the general formula (b-3) or (b-4) (the cation moiety is the same as (b-1) or (b-2)) may be used.

[Chemical Formula 32]

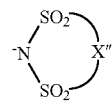
(b-3)

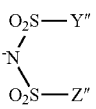
(b-4)

In the formulas, X" represents an alkylene group of 2 to 6 carbon atoms in which at least one hydrogen atom has been substituted with a fluorine atom; and Y" and Z" each independently represents an alkyl group of 1 to 10 carbon atoms in which at least one hydrogen atom has been substituted with a fluorine atom.

In the formula (b-3), X" represents a linear or branched alkylene group in which at least one hydrogen atom has been substituted with a fluorine atom, and the alkylene group has 2 to 6 carbon atoms, preferably 3 to 5 carbon atoms, and most preferably 3 carbon atoms.

In the formula (b-4), each of Y" and Z" independently represents a linear or branched alkyl group in which at least one hydrogen atom has been substituted with a fluorine atom, and the alkyl group has 1 to 10 carbon atoms, preferably 1 to 7 carbon atoms, and most preferably 1 to 3 carbon atoms.

The smaller the number of carbon atoms of the alkylene group for X" or those of the alkyl group for Y" and Z" within the above-mentioned range of the number of carbon atoms, the more the solubility in a resist solvent is improved.

Further, in the alkylene group for X" or the alkyl group for Y" and Z", it is preferable that the number of hydrogen atoms substituted with fluorine atoms is as large as possible because the acid strength increases and the transparency to high energy radiation of 200 nm or less or electron beam is improved. The amount of fluorine atoms within the alkylene group or alkyl group, i.e., fluorination ratio, is preferably from 70 to 100%, more preferably from 90 to 100%, and it is particularly desirable that the alkylene group or alkyl group be a perfluoroalkylene or perfluoroalkyl group in which all hydrogen atoms are substituted with fluorine atoms.

Further, oxime sulfonate-based acid generators disclosed in Japanese Unexamined Patent Application, First Publication No. Hei 9-208554 (Chemical Formulas 18 and 19 shown in paragraphs [0012] to [0014]) and oxime sulfonate-based acid generators disclosed in WO 2004/074242A2 (Examples 1 to 40 described at pages 65 to 86) may be preferably used.

As diazomethane-based acid generators, diazomethane-based acid generators disclosed in Japanese Unexamined Patent Application, First Publication No. Hei 11-035551, Japanese Unexamined Patent Application, First Publication No. Hei 11-035552 and Japanese Unexamined Patent Application, First Publication No. Hei 11-035573 may be preferably used.

Furthermore, as poly(bis-sulfonyl)diazomethanes, those disclosed in Japanese Unexamined Patent Application, First Publication No. Hei 11-322707, including 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexane, and 1,10-bis(cyclohexylsulfonyldiazomethylsulfonyl)decane, may be mentioned.

As the component (B), one type of these acid generators may be used alone, or two or more types may be used in combination.

In the resist composition, the amount of the component (B), relative to 100 parts by weight of the component (A) is preferably from 0.5 to 60 parts by weight, more preferably from 1 to 50 parts by weight, and most preferably from 1 to 40 parts by weight. When the amount of the component (B) is within the above-mentioned range, formation of a resist pattern can be satisfactorily performed. Further, when these components of the resist composition are dissolved in the organic solvent, a uniform solution can be obtained and the storage stability becomes satisfactory.

<Optional Components>
[Component (D)]

The resist composition of the present invention may contain a basic-compound component (D) (hereafter referred to as "component (D)") as an optional component. In the present invention, the component (D) functions as an acid diffusion control agent, i.e., a quencher which traps the acid generated from the component (B) upon exposure. In the present invention, a "basic compound" refers to a compound which is basic relative to the component (B).

In the present invention, the component (D) may be a basic compound (D1) (hereafter, referred to as "component (D1)") which has a cation moiety and an anion moiety, or a basic compound (D2) (hereafter, referred to as "component (D2)") which does not fall under the definition of component (D1).

(Component (D1))

In the present invention, the component (D1) is not particularly limited, and as the component (D1), a sulfonate anion, a carboxylate anion and an alkylsulfonyl imide anion can be mentioned. Among these, it is preferable that the component (D1) include at least one member selected from the group consisting of a compound (d1-1) represented by general formula (d1-1) shown below (hereafter, referred to as "component (d1-1)") and a compound (d1-2) represented by general formula (d1-2) shown below (hereafter, referred to as "component (d1-2)"). The components (d1-1) and (d1-2) are photoreactive quenchers which do not act as quenchers prior to exposure, and which acts as quenchers upon exposure.

[Chemical Formula 33]

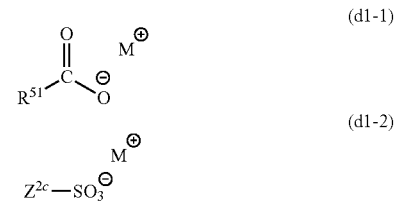

In the formula, $R^{51}$ represents a hydrocarbon group which may have a substituent; $Z^{2c}$ represents a hydrocarbon group of 1 to 30 carbon atoms which may have a substituent, provided that the carbon atom adjacent to the sulfur atom has no fluorine atom as a substituent; and $M^+$ independently represents an organic cation.

{Component (d1-1)}
Anion Moiety

In formula (d1-1), $R^{51}$ represents a hydrocarbon group which may have a substituent.

The hydrocarbon group for $R^{51}$ which may have a substituent may be either an aliphatic hydrocarbon group or an aromatic hydrocarbon group, and the same aliphatic hydrocarbon groups and aromatic hydrocarbon groups as those described above for the aforementioned $X^3$ in the component (B) can be used.

Among these, as the hydrocarbon group for $R^{51}$ which may have a substituent, an aromatic hydrocarbon group which may have a substituent or an aliphatic cyclic group which may have a substituent is preferable, and a phenyl group or a naphthyl group which may have a substituent, or a group in which one or more hydrogen atoms have been removed from a polycycloalkane such as adamantane, norbornane, isobornane, tricyclodecane or tetracyclododecane is more preferable.

As the hydrocarbon group for $R^{51}$ which may have a substituent, a linear, branched or alicyclic alkyl group or a fluorinated alkyl group is also preferable.

The linear, branched or alicyclic alkyl group for $R^{51}$ preferably has 1 to 10 carbon atoms, and specific examples thereof include: a linear alkyl group such as a methyl group, an ethyl group, a propyl group, a butyl group, a pentyl group, a hexyl group, a heptyl group, an octyl group, a nonyl or a decyl group; a branched alkyl group such as a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group or a 4-methylpentyl group; and an alicyclic alkyl group such as a norbornyl group and an adamantyl group.

The fluorinated alkyl group for $R^{51}$ may be either chain-like or cyclic, but is preferably linear or branched.

The fluorinated alkyl group preferably has 1 to 11 carbon atoms, more preferably 1 to 8, and still more preferably 1 to 4. Specific examples include a group in which part or all of the hydrogen atoms constituting a linear alkyl group (such as a methyl group, an ethyl group, a propyl group, a butyl group, a pentyl group, a hexyl group, a heptyl group, an octyl group, a nonyl group or a decyl group) have been substituted with fluorine atom(s), and a group in which part or all of the hydrogen atoms constituting a branched alkyl group (such as a 1-methylethyl group, a 1-methylpropyl group, a 2-methylpropyl group, a 1-methylbutyl group, a 2-methylbutyl group or a 3-methylbutyl group) have been substituted with fluorine atom(s).

The fluorinated alkyl group for $R^{51}$ may contain an atom other than fluorine atom. Examples of the atom other than fluorine include an oxygen atom, a carbon atom, a hydrogen atom, an oxygen atom, a sulfur atom and a nitrogen atom.

Among these, as the fluorinated alkyl group for $R^{51}$, a group in which part or all of the hydrogen atoms constituting a linear alkyl group have been substituted with fluorine atom(s) is preferable, and a group in which all of the hydrogen atoms constituting a linear alkyl group have been substituted with fluorine atoms (i.e., a perfluoroalkyl group) is more preferable.

Specific examples of preferable anion moieties for the component (d1-1) are shown below.

[Chemical Formula 34]

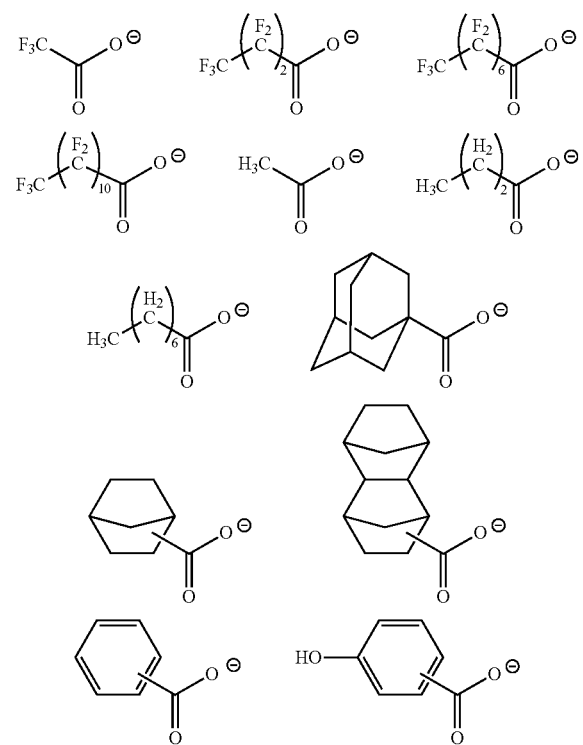

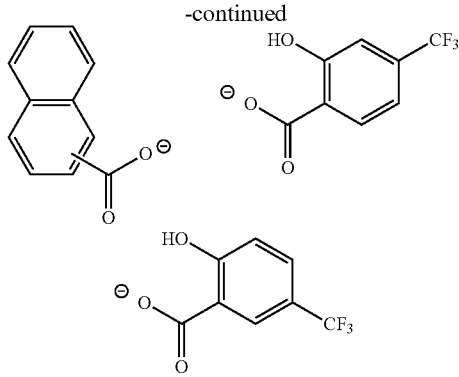

Cation Moiety

In formula (d1-1), M represents an organic cation.

The organic cation for M is not particularly limited, and examples thereof include the same cation moieties as those of compounds represented by the aforementioned formula (b-1) or (b-2), and the cation moieties represented by the aforementioned formula (ca1-1) to (ca-1-46) are preferable.

As the component (d1-1), one type of compound may be used, or two or more types of compounds may be used in combination.

{Component (d1-2)}

Anion Moiety

In formula (d1-2), $Z^{2c}$ represents a hydrocarbon group of 1 to 30 carbon atoms which may have a substituent.

The hydrocarbon group of 1 to 30 carbon atoms for $R^{2c}$ which may have a substituent may be either an aliphatic hydrocarbon group or an aromatic hydrocarbon group, and the same aliphatic hydrocarbon groups and aromatic hydrocarbon groups as those described above for the aforementioned $X^3$ in the component (B) can be used.

Among these, as the hydrocarbon group for $Z^{2c}$ which may have a substituent, an aliphatic cyclic group which may have a substituent is preferable, and a group in which one or more hydrogen atoms have been removed from adamantane, norbornane, isobornane, tricyclodecane, tetracyclododecane or camphor (which may have a substituent) is more preferable.

The hydrocarbon group for $Z^{2c}$ may have a substituent, and the same substituents as those described above for $X^3$ in the aforementioned component (B) can be used. However, in $Z^{2c}$, the carbon adjacent to the S atom within $SO_3$— has no fluorine atom as a substituent. By virtue of $SO_3^-$ having no fluorine atom adjacent thereto, the anion of the component (d1-2) becomes an appropriately weak acid anion, thereby improving the quenching ability of the component (D).

Specific examples of preferable anion moieties for the component (d1-2) are shown below.

[Chemical Formula 35]

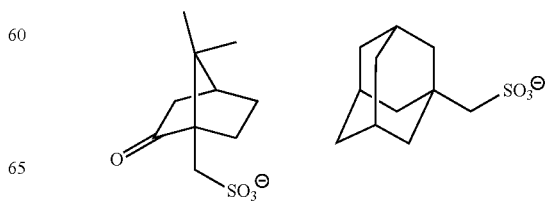

-continued

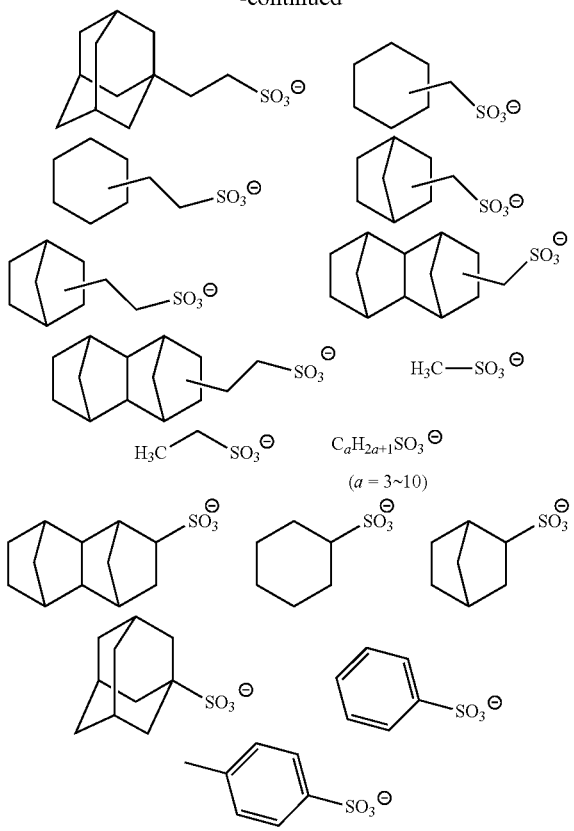

Cation Moiety

In formula (d1-2), $M^+$ is the same as defined for $M^+$ in the aforementioned formula (d1-1).

As the component (d1-2), one type of compound may be used, or two or more types of compounds may be used in combination.

The component (D1) preferably contains the aforementioned components (d1-1) or (d1-2), and may contain only one of the aforementioned components (d1-1) or (d1-2), or may contain at least two of the aforementioned components (d1-1) and (d1-2).

The total amount of the components (d1-1) and (d1-2) relative to 100 parts by weight of the component (A) is preferably within a range from 0.5 to 10.0 parts by weight, more preferably from 0.5 to 8.0 parts by weight, and still more preferably from 1.0 to 5.0 parts by weight. When the amount of at least as large as the lower limit of the above-mentioned range, excellent lithography properties and excellent resist pattern shape can be obtained. On the other hand, in the case where the amount of the component (D1) is no more than the upper limit of the above-mentioned range, sensitivity can be maintained at a satisfactory level, and throughput becomes excellent.

(Component (D2))

The component (D2) is not particularly limited, as long as it is a compound which is basic relative to the component (B), so as to functions as an acid diffusion inhibitor, and does not fall under the definition of the component (D1). As the component (D2), any of the conventionally known compounds may be selected for use. Examples thereof include an aliphatic amine and an aromatic amine. Among these, an aliphatic amine is preferable, and a secondary aliphatic amine or tertiary aliphatic amine is particularly desirable.

An aliphatic amine is an amine having one or more aliphatic groups, and the aliphatic groups preferably have 1 to 12 carbon atoms.

Examples of these aliphatic amines include amines in which at least one hydrogen atom of ammonia ($NH_3$) has been substituted with an alkyl group or hydroxyalkyl group of no more than 12 carbon atoms (i.e., alkylamines or alkylalcoholamines), and cyclic amines.

Specific examples of alkylamines and alkylalcoholamines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decylamine, and tri-n-dodecylamine; and alkyl alcohol amines such as diethanolamine, triethanolamine, diisopropanolamine, triisopropanolamine, di-n-octanolamine, and tri-n-octanolamine. Among these, trialkylamines of 5 to 10 carbon atoms are preferable, and tri-n-pentylamine and tri-n-octylamine are particularly desirable.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine) can be used.

Specific examples of the aliphatic monocyclic amine include piperidine, and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

Examples of other aliphatic amines include tris(2-methoxymethoxyethyl)amine, tris {2-(2-methoxyethoxy)ethyl}amine, tris {2-(2-methoxyethoxymethoxy)ethyl}amine, tris {2-(1-methoxyethoxy)ethyl}amine, tris {2-(1-ethoxyethoxy)ethyl}amine, tris {2-(1-ethoxypropoxy)ethyl}amine, tris[2-{2-(2-hydroxyethoxy)ethoxy}ethyl]amine and triethanolamine triacetate, and triethanolamine triacetate is preferable.

Examples of aromatic amines include aniline, pyridine, 4-dimethylaminopyridine, pyrrole, indole, pyrazole, imidazole and derivatives thereof, diphenylamine, triphenylamine, tribenzylamine, 2,6-diisopropylaniline and N-tert-butoxycarbonylpyrrolidine.

As the component (D2), one type of compound may be used alone, or two or more types may be used in combination.

The component (D2) is typically used in an amount within a range from 0.01 to 5.0 parts by weight, relative to 100 parts by weight of the component (A). When the amount of the component (D2) is within the above-mentioned range, the shape of the resist pattern and the post exposure stability of the latent image formed by the pattern-wise exposure of the resist layer are improved.

As the component (D), one type may be used, or two or more types may be used in combination.

When the resist composition of the present invention contains the component (D), the amount of the component (D) relative to 100 parts by weight of the component (A) is preferably within a range from 0.1 to 15 parts by weight, more preferably from 0.3 to 12 parts by weight, and still more preferably from 0.5 to 10 parts by weight. In the case where the amount of the component (D) is at least as large as the lower limit of the above-mentioned range, various lithography properties (such as roughness) improved, when the resist composition is used as a positive resist composition. Further, a resist pattern having an excellent shape can be obtained. On the other hand, in the case where the amount of the component (D) is no more than the upper limit of the above-mentioned range, sensitivity can be maintained at a satisfactory level, and throughput becomes excellent.

[Component (E)]

Furthermore, in the resist composition of the present invention, for preventing any deterioration in sensitivity, and improving the resist pattern shape and the post exposure stability of the latent image formed by the pattern-wise exposure of the resist layer, at least one compound (E) (hereafter referred to as the component (E)) selected from the group consisting of an organic carboxylic acid, or a phosphorus oxo acid or derivative thereof can be added.

Examples of suitable organic carboxylic acids include acetic acid, malonic acid, citric acid, malic acid, succinic acid, benzoic acid, and salicylic acid.

Examples of phosphorus oxo acids include phosphoric acid, phosphonic acid and phosphinic acid. Among these, phosphonic acid is particularly desirable.

Examples of phosphorous oxo acid derivatives include esters in which a hydrogen atom within the above-mentioned phosphorous oxo acids is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenylphosphonic acid, diphenyl phosphonate and dibenzyl phosphonate.

Examples of phosphinic acid derivatives include phosphinic acid esters and phenylphosphinic acid.

As the component (E), one type may be used alone, or two or more types may be used in combination.

The component (E) is typically used in an amount within a range from 0.01 to 5.0 parts by weight, relative to 100 parts by weight of the component (A).

[Component (F)]

In the present invention, the resist composition may further include a fluorine additive (hereafter, referred to as "component (F)") for imparting water repellency to the resist film.

As the component (F), for example, a fluorine-containing polymeric compound described in Japanese Unexamined Patent Application, First Publication No. 2010-002870 can be given.

As the component (F), a polymer having a structural unit (f1-1) represented by general formula (f1-1) shown below can be used. The polymer is preferably a polymer (homopolymer) consisting of a structural unit (f1) represented by formula (f1-1) shown below; a copolymer of a structural unit represented by formula (f1-1) shown below and the aforementioned structural unit (a1'); or a copolymer of a structural unit represented by formula (f1-1) shown below, a structural unit derived from acrylic acid or methacrylic acid and the aforementioned structural unit (a1'). As the structural unit (a1') to be copolymerized with a structural unit represented by formula (f1-1) shown below, a structural unit represented by the aforementioned formula (a1-0-1) is preferable, and a structural unit derived from 1-ethyl-1-cyclooctyl (meth)acrylate is particularly preferable.

[Chemical Formula 36]

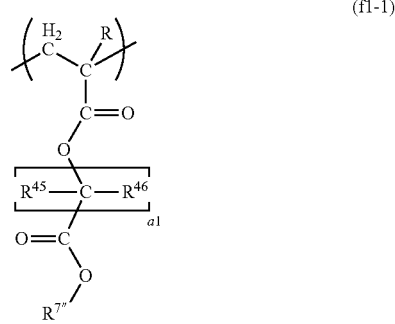

In the formula, R is the same as defined above; each of $R^{45}$ and $R^{46}$ independently represents a hydrogen atom, a halogen atom, an alkyl group of 1 to 5 carbon atoms or a halogenated alkyl group of 1 to 5 carbon atoms, provided that the plurality of $R^{45}$ to $R^{46}$ may be the same or different from each other; a1 represents an integer of 1 to 5; and $R^{7''}$ represents an organic group containing a fluorine atom.

In formula (f1-1), R is the same as defined above. As R, a hydrogen atom or a methyl group is preferable.

Examples of the halogen atom for $R^{45}$ and $R^{46}$ in the formula (f1-1) include a fluorine atom, a chlorine atom, a bromine atom and an iodine atom, and a fluorine atom is particularly desirable. Examples of the alkyl group of 1 to 5 carbon atoms for $R^{45}$ and $R^{46}$ include the same alkyl group of 1 to 5 carbon atoms as those defined above for R defined above, and a methyl group or an ethyl group is preferable. Specific examples of the halogenated alkyl group of 1 to 5 carbon atoms for $R^{45}$ or $R^{46}$ include groups in which part or all of the hydrogen atoms of the aforementioned alkyl groups of 1 to 5 carbon atoms have been substituted with halogen atoms. Examples of the halogen atom include a fluorine atom, a chlorine atom, a bromine atom and an iodine atom, and a fluorine atom is particularly preferred. Among these, $R^{45}$ and $R^{46}$ are preferably a hydrogen atom, a fluorine atom or an alkyl group of 1 to 5 carbon atoms, and more preferably a hydrogen atom, a fluorine atom, a methyl group or an ethyl group.

In formula (f1-1), a1 represents an integer of 1 to 5, preferably an integer of 1 to 3, and more preferably 1 or 2.

In formula (f1-1), $R^{7''}$ represents an organic group containing a fluorine atom, and is preferably a hydrocarbon group containing a fluorine atom.

The hydrocarbon group containing a fluorine atom may be linear, branched or cyclic, and preferably has 1 to 20 carbon atoms, more preferably 1 to 15 carbon atoms, and particularly preferably 1 to 10 carbon atoms.

The hydrocarbon group having a fluorine atom preferably has 25% or more of the hydrogen atoms within the hydrocarbon group fluorinated, more preferably 50% or more, and most preferably 60% or more, because the hydrophobicity of the resist film during immersion exposure is enhanced.

As $R^{7''}$, a fluorinated hydrocarbon group of 1 to 5 carbon atoms is particularly preferable, and most preferably methyl group, —$CH_2$—$CF_3$, —$CH_2$—$CF_2$—$CF_3$, —$CH(CF_3)_2$, —$CH_2$—$CH_2$—$CF_3$ and —$CH_2$—$CH_2$—$CF_2$—$CF_2$—$CF_2$—$CF_3$.

The weight average molecular weight (Mw) (the polystyrene equivalent value determined by gel permeation chromatography) of the component (F) is preferably 1,000 to 50,000, more preferably 5,000 to 40,000, and most preferably 10,000 to 30,000. When the weight average molecular weight of the component (A) is no more than the upper limit of the above-mentioned range, the resist composition exhibits a satisfactory solubility in a resist solvent. On the other hand, when the weight average molecular weight is at least as large as the lower limit of the above-mentioned range, the dry etching resistance and the cross-sectional shape of the resist pattern becomes satisfactory.

Further, the dispersity (Mw/Mn) of the component (F) is preferably 1.0 to 5.0, more preferably 1.0 to 3.0, and most preferably 1.2 to 2.5.

As the component (F), one type may be used alone, or two or more types may be used in combination.

The component (F) is used in an amount within a range from 0.5 to 10 parts by weight, relative to 100 parts by weight of the component (A).

If desired, other miscible additives can also be added to the negative resist composition according to the present invention. Examples of such miscible additives include additive resins for improving the performance of the resist film, dissolution inhibitors, plasticizers, stabilizers, colorants, halation prevention agents, and dyes.

[Component (S)]

The negative resist composition of the present invention can be prepared by dissolving the materials for the resist composition in an organic solvent (hereafter, frequently referred to as "component (S)").

The component (S) may be any organic solvent which can dissolve the respective components to give a uniform solution, and one or more kinds of any organic solvent can be appropriately selected from those which have been conventionally known as solvents for a chemically amplified resist.

Examples thereof include lactones such as γ-butyrolactone; ketones such as acetone, methyl ethyl ketone (MEK), cyclohexanone, methyl-n-pentyl ketone, methyl isopentyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene; and dimethylsulfoxide (DMSO).

These solvents can be used individually, or in combination as a mixed solvent.

Among these, PGMEA, PGME, γ-butyrolactone and EL are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably in the range of 1:9 to 9:1, more preferably from 2:8 to 8:2.

Specifically, when EL or cyclohexanone is mixed as the polar solvent, the PGMEA:EL (or PGMEA: cyclohexanone) weight ratio is preferably from 1:9 to 9:1, and more preferably from 2:8 to 8:2. Alternatively, when PGME is mixed as the polar solvent, the PGMEA:PGME is preferably from 1:9 to 9:1, more preferably from 2:8 to 8:2, and still more preferably 3:7 to 7:3.

Further, as the component (S), a mixed solvent of at least one of PGMEA and EL with γ-butyrolactone is also preferable. The mixing ratio (former:latter) of such a mixed solvent is preferably from 70:30 to 95:5.

The amount of the component (S) is not particularly limited, and is appropriately adjusted to a concentration which enables coating of a coating solution to a substrate In general, the organic solvent is used in an amount such that the solid content of the resist composition becomes within the range from 1 to 20% by weight, and preferably from 2 to 15% by weight.

EXAMPLES

As follows is a description of examples of the present invention, although the scope of the present invention is by no way limited by these examples.

Examples 1 to 4, Comparative Examples 1 and 2

The components shown in Table 1 were mixed together and dissolved to obtain positive resist compositions.

TABLE 1

|  | Component (A) | Component (B) | Component (D) | Component (E) | Component (S) | PEB (° C.) | Eop (mJ/cm$^2$) | LWR (nm) |
| --- | --- | --- | --- | --- | --- | --- | --- | --- |
| Example 1 | (A)-1 [100] | (B)-1 [11.4] | (D)-1 [5.0] | (E)-1 [1.4] | (S)-1 [4100] | 80 | 26.0 | 3.7 |
| Example 2 | (A)-2 [100] | (B)-1 [11.4] | (D)-1 [5.0] | (E)-1 [1.4] | (S)-1 [4100] | 80 | 23.0 | 3.5 |
| Example 3 | (A)-3 [100] | (B)-1 [11.4] | (D)-1 [5.0] | (E)-1 [1.4] | (S)-1 [4100] | 80 | 22.0 | 3.5 |
| Example 4 | (A)-4 [100] | (B)-1 [11.4] | (D)-1 [5.0] | (E)-1 [1.4] | (S)-1 [4100] | 80 | 21.0 | 3.5 |
| Comparative Example 1 | (A)-5 [100] | (B)-1 [11.4] | (D)-1 [5.0] | (E)-1 [1.4] | (S)-1 [4100] | 80 | 26.0 | 5.6 |
| Comparative Example 2 | (A)-6 [100] | (B)-1 [11.4] | (D)-1 [5.0] | (E)-1 [1.4] | (S)-1 [4100] | 90 | 28.0 | 6.4 |

TABLE 1-continued

In Table 1, the reference characters indicate the following. Further, the values in brackets[ ] indicate the amount (in terms of parts by weight) of the component added. In the formulas, the subscript numerals shown to the bottom right of the parentheses ( ) indicate the compositional ratio (in terms of molar ratio) of the copolymer.

(A)-1: a polymeric compound represented by formula (A)-1 shown below [Mw = 6,800, Mw/Mn = 1.6]

(A)-2: a polymeric compound represented by formula (A)-2 shown below [Mw = 6,800, Mw/Mn = 1.61]

(A)-3: a polymeric compound represented by formula (A)-3 shown below [Mw = 7,300, Mw/Mn = 1.64]

(A)-4: a polymeric compound represented by formula (A)-4 shown below [Mw = 7,000, Mw/Mn = 1.59]

(A)-5: a polymeric compound represented by formula (A)-5 shown below [Mw = 7,400, Mw/Mn = 1.69]

(A)-6: a polymeric compound represented by formula (A)-6 shown below [Mw = 6,500, Mw/Mn = 1.55]

(B)-1: a compound (B)-1 shown below (D)-1: a compound (D)-1 shown below (E)-1: salicylic acid (S)-1: a mixed solvent of PGMEA/PGME/cyclohexanone = 45/30/25 (weight ratio)

[Chemical Formula 37]

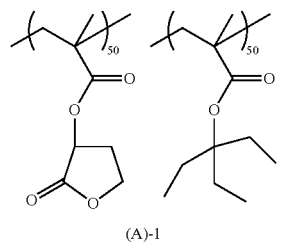

(A)-1

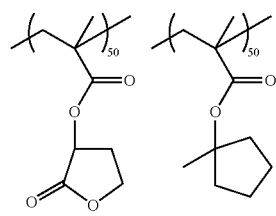

(A)-2

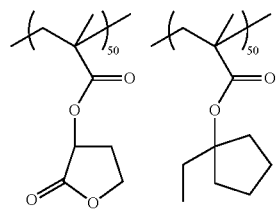

(A)-3

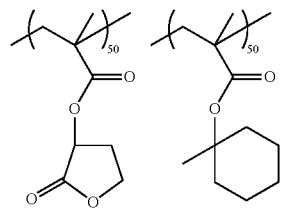

(A)-4

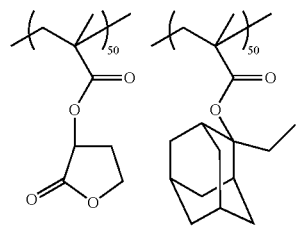

(A)-5

TABLE 1-continued

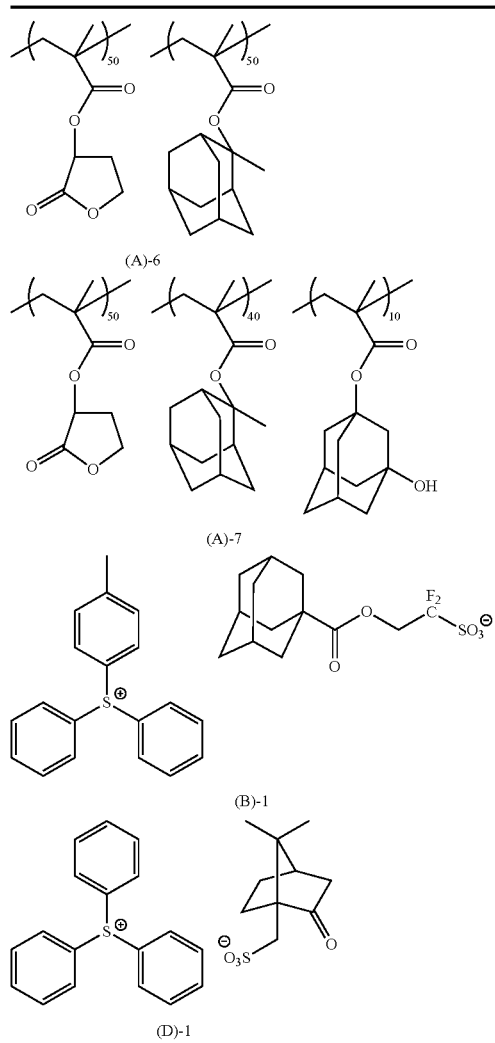

[Formation of Resist Pattern]

An organic anti-reflection film composition (product name: ARC29A, manufactured by Brewer Science Ltd.) was applied to an 8-inch silicon wafer using a spinner, and the composition was then baked at 205° C. for 60 seconds on a hotplate, thereby forming an organic anti-reflection film having a film thickness of 89 nm.

Then, the resist composition was applied to the anti-reflection film using a spinner, and was then prebaked (PAB) on a hotplate at 90° C. for 60 seconds and dried, thereby forming a resist film having a film thickness of 80 nm.

Subsequently, a coating solution for forming a protection film (product name: TILC-057; manufactured by Tokyo Ohka Kogyo Co., Ltd.) was applied onto the resist film using a spinner, and then heated at 90° C. for 60 seconds, thereby forming a top coat having a film thickness of 35 nm.

Subsequently, the resist film was selectively irradiated with an ArF excimer laser through a half tone mask, using an ArF immersion exposure apparatus NSR-S609B (manufactured by Nikon Corporation, NA (numerical aperture)=1.07, Dipole (in/out: 0.78/0.97)). Next, a post exposure bake (PEB) treatment was conducted at a temperature indicated in Table 1 for 60 seconds, followed by development for 10 seconds at 23° C. in a 2.38% by weight aqueous solution of tetramethylammonium hydroxide (TMAH) (product name: NMD-W; manufactured by Tokyo Ohka Kogyo Co., Ltd.). Then, the resist film was rinsed for 30 seconds with pure water, followed by drying by shaking.

As a result, in each of the examples, a 1:1 line and space pattern (LS pattern) having a line width of 49 nm and a pitch of 98 nm was formed. The optimum exposure dose Eop (mJ/cm$^2$; sensitivity) with which the LS pattern was formed was determined. The results are shown in Table 1.

[Evaluation of Line Width Roughness (LWR)]

With respect to each of the LS patterns having a line width of 49 nm and a pitch of 98 nm formed with the above optimum exposure dose Eop, the space width at 400 points in the lengthwise direction of the space were measured using a measuring scanning electron microscope (SEM) (product name: S-9380, manufactured by Hitachi High-Technologies Corporation; acceleration voltage: 300V). From the results, the value of 3 times the standard deviation s (i.e., 3s) was determined, and the average of the 3s values at 400 points was calculated as a yardstick of LWR. The results are shown in Table 1.

The smaller this 3s value is, the lower the level of roughness of the line width, indicating that a LS pattern with a uniform width was obtained.

From the results, it was confirmed that when the resist compositions of Examples 1 to 4 were used, roughness of resist pattern was able to be reduced.

Example 1 and Comparative Example 1

The components shown in Table 2 were mixed together and dissolved to obtain positive resist compositions.

TABLE 2

| | Component (A) | Component (B) | Component (D) | Component (E) | Component (S) |
|---|---|---|---|---|---|
| Example 1 | (A)-2 [100] | (B)-1 [11.4] | (D)-1 [5.0] | (E)-1 [1.4] | (S)-1 [4100] |
| Comparative Example 1 | (A)-7 [100] | (B)-1 [11.4] | (D)-1 [5.0] | (E)-1 [1.4] | (S)-1 [4100] |

In Table 2, (A)-2, (B)-1, (D)-1, (E)-1 and (S)-1 are the same as defined above, and (A)-7 is a polymeric compound represented by the formula (A)-7 [Mw=7,300, Mw/Mn 1.64].

Further, the values in brackets [ ] indicate the amount (in terms of parts by weight) of the component added. In the formulas, the subscript numerals shown to the bottom right of the parentheses ( ) indicate the compositional ratio (in terms of molar ratio) of the copolymer.

[Formation of Resist Pattern]

Each resist composition obtained in the examples was applied to an 8-inch silicon wafer using a spinner, and was then prebaked (PAB) on a hotplate at a temperature indicated in Table 3 for 60 seconds and dried, thereby forming a resist film having a film thickness of 80 nm.

Subsequently, the resist film was selectively irradiated with an ArF excimer laser through a half tone mask, using an ArF immersion exposure apparatus Nikon s-610c (manufactured by Nikon Corporation, NA (numerical aperture)=1.30, Dipole (in/out: 0.88/0.98)). Next, a post exposure bake (PEB) treatment was conducted at a temperature indicated in Table 3 for 60 seconds, followed by development for 10 seconds at 23° C. in a 2.38% by weight aqueous solution of tetramethylammonium hydroxide (TMAH) (product name: NMD-W; manufactured by Tokyo Ohka Kogyo Co., Ltd.). Then, the resist film was rinsed for 30 seconds with pure water, followed by drying by shaking.

As a result, in each of the examples, a 1:1 line and space pattern (LS pattern) having a line width of 40 nm and a pitch of 80 nm was formed. The optimum exposure dose Eop (mJ/cm$^2$; sensitivity) with which the LS pattern was formed was determined. The results are shown in Table 2.

The LWR of each resist pattern (first pattern) was determined in the same manner as described above.

The results are indicated "LWR (1)" in Table 3.

A second pattern was obtained by following steps.

Step Of Conducting Slimming Treatment

The resist pattern (first pattern) was subjected to slimming treatment by controlling exposure dose, such that a 1:3 line and space pattern (LS pattern) having a line width of 20 nm and a pitch of 80 nm was formed.

Film Forming Step of SiO$_2$ Film in Accordance with ALD Method

A precursor of BTBAS was deposited at a room temperature (23° C.) using TELINDY i-Rad (manufactured by Tokyo Electron Limited) on the substrate on which the first pattern had been formed, and then, the precursor was exposed to oxygen plasma thereby forming a silicon oxide film at the molecular level. This process step was repeated arbitrary number of times, thereby forming an SiO$_2$ film (coating pattern) having a film thickness of 20 nm and a width of side wall of 20 nm.

Step of Etching

By introducing CF$_4$ reactive gas into vacuum at a temperature of 30° C. using Tactras Vigas (manufactured by Tokyo Electron Limited) and applying high frequency to an opposite electrode, plasma was generated, and an anisotropic etching was conducted using the plasma such that the SiO$_2$ formed on a side wall portion of the resist pattern selectively remained. As a result, the SiO$_2$ film formed on the surface of the first pattern and the substrate was removed thereby forming an LS pattern having a line width of 60 nm, a space width of 20 nm and a height of 20 nm.

Step Of Removing Resist Pattern

The substrate on which the aforementioned pattern had been formed was exposed to oxygen plasma at a temperature of 30° C. using Tactras Vigas (manufactured by Tokyo Electron Limited) to conduct plasma ashing of the first pattern (resist pattern) thereby removing the first pattern. As a result, a second pattern having a line width of 20 nm and a space width of 20 nm composed of the SiO$_2$ film was formed.

TABLE 3

| | PAB (° C.) | PEB (° C.) | Eop (mJ/cm$^2$) | LWR(1) (nm) | LWR(2) (nm) |
|---|---|---|---|---|---|
| Example 1 | 90 | 80 | 24 | 2.1 | 2.0 |
| Comparative Example 1 | 120 | 110 | 24 | 4.3 | 3.8 |

[Evaluation of Line Width Roughness (LWR) (2)]

The LWR of each pattern (second pattern) composed of the SiO$_2$ film was determined in the same manner as described above.

The results are indicated "LWR (2)" in Table 3.

From the results, it was confirmed that when the resist composition of Example 1 was used, roughness was able be reduced, and a fine pattern was able to be obtained as compared to the resist composition of Comparative Example 1.

BRIEF DESCRIPTION OF THE DRAWINGS

1: substrate, 2: resist film, 2a: first pattern, 3: photomask, 4: SiO$_2$ film, 4b: second pattern While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method of forming a pattern comprising:
a first pattern forming step in which a resist composition is applied to a substrate to form a resist film, and then the resist film is subjected to exposure and development, thereby forming a first pattern comprising the resist film;
a film forming step in which a SiO$_2$ film is formed on the surface of the first pattern and the substrate;

an etching step in which the SiO$_2$ film is subjected to etching such that the SiO$_2$ film remains only on a side wall portion of the first pattern; and a second pattern forming step in which the first pattern is removed, thereby forming a second pattern comprising the SiO$_2$ film, wherein the resist composition comprises a base component (A) which exhibits changed solubility in a developing solution by the action of an acid, an acid generator component (B) which generates the acid upon exposure, and a basic compound (D1) which has a cation moiety and an anion moiety selected from the group consisting of a sulfonate anion, a carboxylate anion and an alkylsulfonyl imide anion, and the base component (A) comprises a resin component (A1) consisting of a structural unit (a2) derived from an acrylate ester which has a hydrogen atom, a halogen atom, an alkyl group of 1 to 5 carbon atoms, a halogenated alkyl group of 1 to 5 carbon atoms or a hydroxyalkyl group bonded to the carbon atom at the α-position, the structural unit (a2) having a —SO$_2$— containing cyclic group selected from the group consisting of (3-1), (3-2), (3-3) and (3-4) shown below or a lactone-containing cyclic group selected from the group consisting of (4-1), (4-2), (4-3), (4-4), (4-5), (4-6 and (4-7) shown below; and a structural unit (a1') represented by general formula (a1-0-1) shown below or general formula (a1-0-2) shown below:

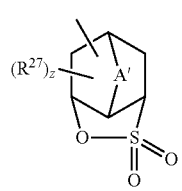

(3-1)

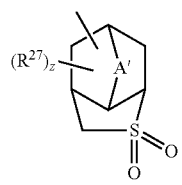

(3-2)

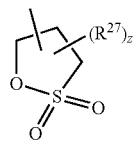

(3-3)

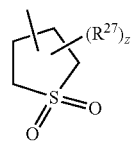

(3-4)

wherein A' represents an oxygen atom, a sulfur atom or an alkylene group of 1 to 5 carbon atoms which may contain an oxygen atom or a sulfur atom; z represents an integer of 0 to 2; and R$^{27}$ represents an alkyl group, an alkoxy group, a halogenated alkyl group, a hydroxyl group, —COOR", —OC(=O)R", a hydroxyalkyl group or a cyano group, wherein R" represents a hydrogen atom or an alkyl group;

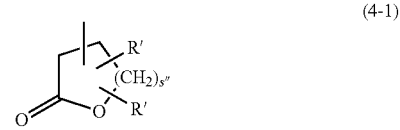

(4-1)

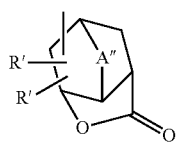

(4-2)

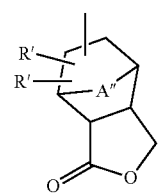

(4-3)

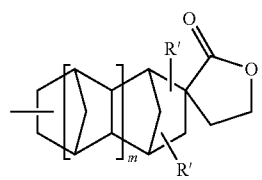

(4-4)

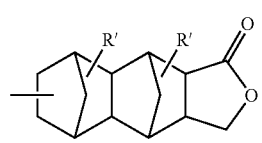

(4-5)

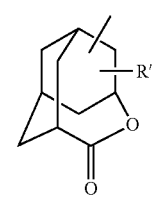

(4-6)

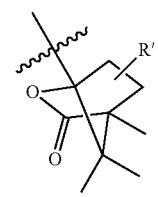

(4-7)

wherein R' represents a hydrogen atom, an alkyl group, an alkoxy group, a halogen atom, a halogenated alkyl group, a hydroxy group, —COOR", —OC(=O)R", a hydroxyalkyl group, or a cyano group, wherein R" represents a hydrogen atom or an alkyl group; s" represents an integer of 0 to 2; A" represents an oxygen atom, a sulfur atom or an alkylene group of 1 to 5 carbon atoms which may contain an oxygen atom or a sulfur atom; and m represents 0 or 1;

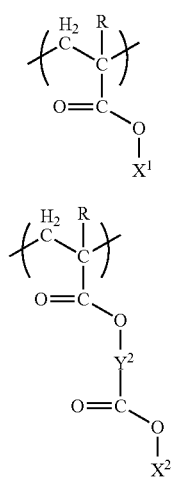

(a1-0-1)

(a1-0-2)

wherein R represents a hydrogen atom, an alkyl group of 1 to 5 carbon atoms or a halogenated alkyl group of 1 to 5 carbon atoms; $Y^2$ represents a divalent linking group; and $X^1$ and $X^2$ each independently represents a group represented by general formula (1-1) shown below, or a group represented by general formula (2-1) shown below

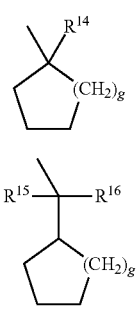

(1-1)

(2-1)

wherein $R^{14}$ represents an alkyl group; $R^{15}$ and $R^{16}$ each independently represents an alkyl group; and g represents an integer of 0 to 8, wherein the cation moiety of the basic compound (D1) is represented by $R^{1'''}(R^{2'''})(R^{3'''})S^+$ or $R^{5'''}(R^{6'''})I^+$, wherein each of $R^{1'''}$ to $R^{3'''}$, and $R^{5'''}$ to $R^{6'''}$ independently represents an aryl group, alkyl group or alkenyl group which may have a substituent; and two of $R^{1'''}$ to $R^{3'''}$ may be bonded to each other to form a ring with the sulfur atom.

2. The method of forming a pattern according to claim 1, wherein the amount of the structural unit (a1') based on the combined total of all structural units constituting the resin component (A1) is in the range of 30 to 70 mol%.

3. The method of forming a pattern according to claim 1, wherein the second pattern has a thickness of 5 to 40 nm.

4. The method of forming a pattern according to claim 1, wherein the first pattern has a space width of 15 to 100 nm.

5. The method of forming a pattern according to claim 1, wherein the resist film has a thickness of 50 to 500 nm.

6. The method of forming a pattern according to claim 1, wherein the substrate is provided with at least one film selected from the group consisting of an inorganic film and organic film on the surface thereof where the resist composition is to be applied.

7. The method of forming a pattern according to claim 1, wherein the structural unit (a1') is at least one structural unit selected from the group consisting of the structural units represented by formulae (a1-1-1) to (a1-1-15) and (a1-3-1) to (a1-3-22) shown below;

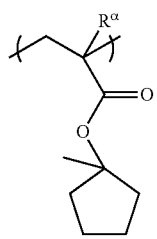

(a1-1-1)

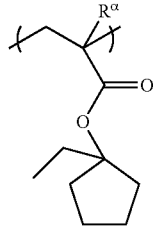

(a1-1-2)

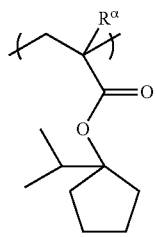

(a1-1-3)

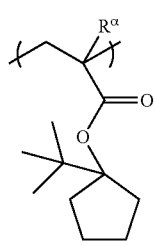

(a1-1-4)

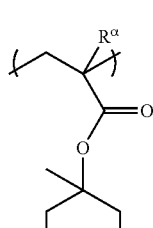

(a1-1-5)

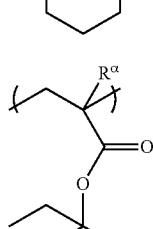

(a1-1-6)

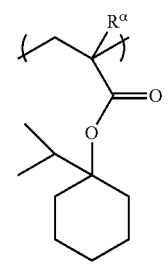 (a1-1-7)
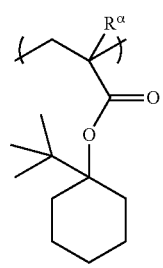 (a1-1-8)
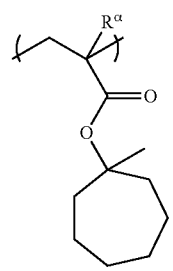 (a1-1-9)
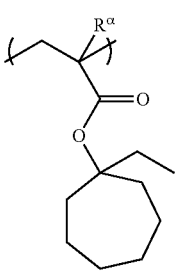 (a1-1-10)
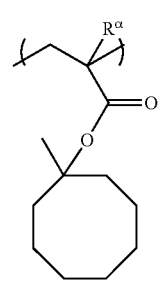 (a1-1-11)
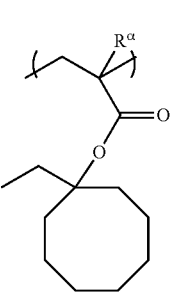 (a1-1-12)
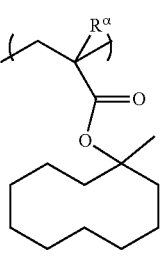 (a1-1-13)
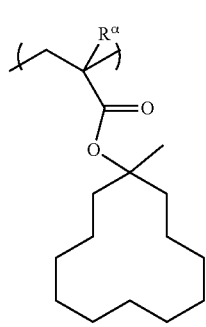 (a1-1-14)
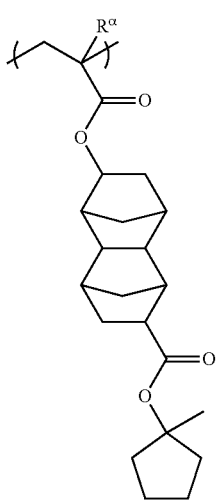 (a1-3-1)
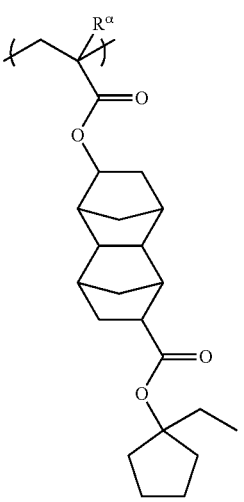 (a1-3-2)

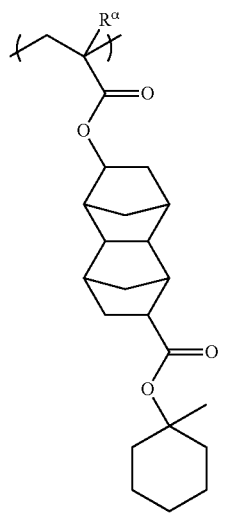
(a1-3-3)
(a1-3-4)
(a1-3-5)
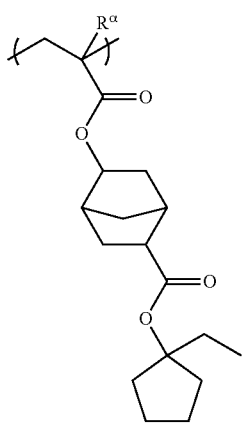
(a1-3-6)
(a1-3-7)
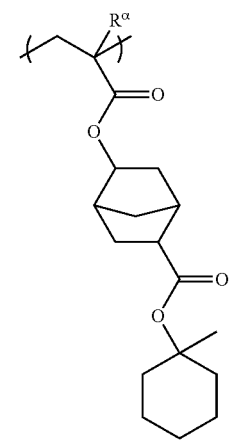
(a1-3-8)
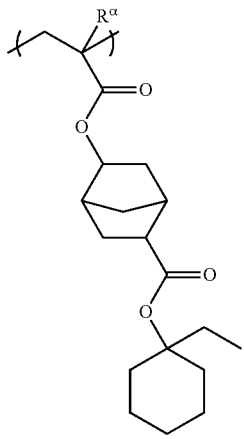
(a1-3-9)
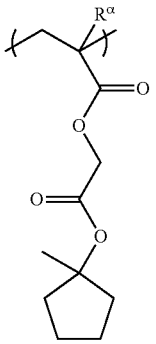

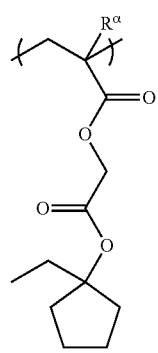 (a1-3-10)
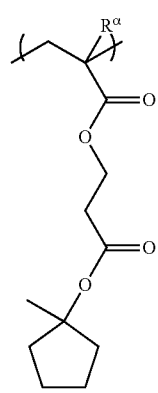 (a1-3-11)
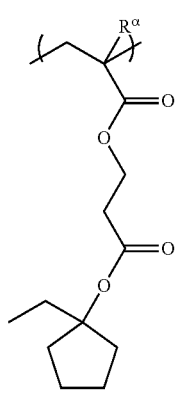 (a1-3-12)
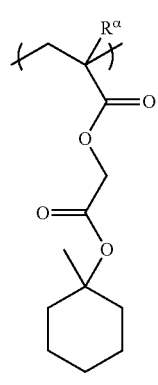 (a1-3-13)
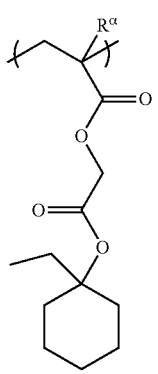 (a1-3-14)
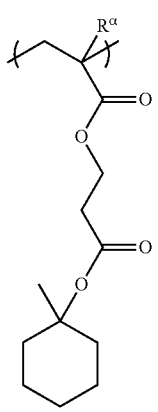 (a1-3-15)
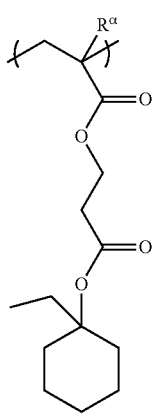 (a1-3-16)
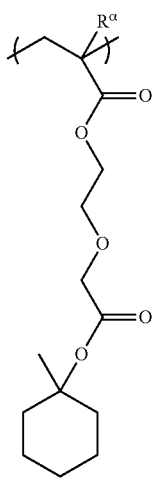 (a1-3-17)

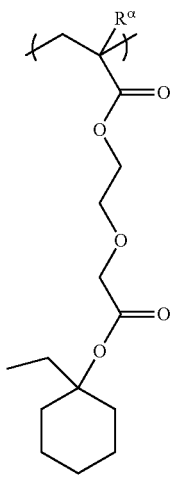 (a1-3-18)
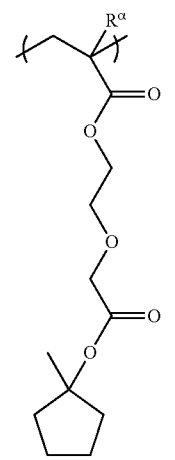 (a1-3-19)
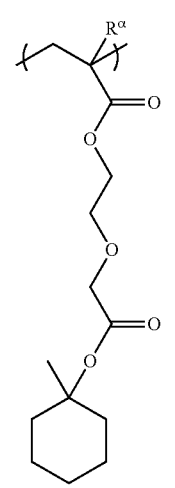 (a1-3-20)
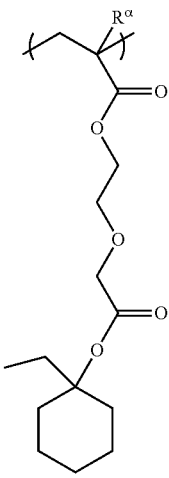 (a1-3-21)
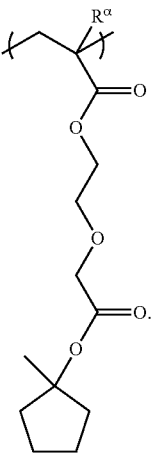 (a1-3-22)
* * * * *

UNITED STATES PATENT AND TRADEMARK OFFICE
CERTIFICATE OF CORRECTION

PATENT NO.        : 9,459,535 B2
APPLICATION NO.   : 13/759669
DATED             : October 4, 2016
INVENTOR(S)       : Naoto Motoike et al.

It is certified that error appears in the above-identified patent and that said Letters Patent is hereby corrected as shown below:

In the Specification

Column 8, Line 63, "at" should be --as--.

Column 18, Line 44, "0," should be --0.--.

Column 20, Line 14, after "to" insert --5--.

Column 21, Line 20, "stylene" should be --styrene--.

Column 29, Line 66, "$R^a$" should be --$R^\alpha$--.

Column 52, Line 57, "(a1-0-1)," should be --(3-1-1),--.

Column 52, Line 59, "(a1-0-1)," should be --(3-1-1),--.

Column 53, Line 12, "propionolatone," should be --propiolactone,--.

Column 60, Line 54, "(a1-0-1) to (a2-O-3)" should be --(a2-0-1) to (a2-0-3)--.

Column 61, Line 33, "(a1-0-11)," should be --(a2-1-11),--.

Column 61, Line 35, "(a1-0-12)" should be --(a2-1-12)--.

Column 63, Line 16, "(a1-0-1)" should be --(a4-1)--.

Column 66, Line 40, "Z-" should be --$Z^-$--.

Column 66, Line 43, "unsubstitued" should be --unsubstituted--.

Signed and Sealed this
Thirty-first Day of January, 2017

Michelle K. Lee
*Director of the United States Patent and Trademark Office*

CERTIFICATE OF CORRECTION (continued)
U.S. Pat. No. 9,459,535 B2

Column 67, Line 9, after "(a1-0-2)" insert --.--.

Column 68, Line 12, after "R$^{49}$" insert --.--.

Column 70, Line 11, after "to" insert --20--.

Column 71, Line 36, "(R$^{3"}$)]$_x$." should be --(R$^{31"}$)]$_x$.--.

Column 71, Line 43, "—R$^{1"}$—" should be -- —R$^{11"}$— --.

Column 82, Line 29, "R$^{3'"}$" should be --R$^{3"}$--.

Column 86, Line 9, "alkylsulfonyoxy" should be --alkylsulfonyloxy--.

Column 86, Line 37, "alkylsulfonyoxy" should be --alkylsulfonyloxy--.

Column 88, Line 10, "alkylsulfonyoxy" should be --alkylsulfonyloxy--.

Column 89, Line 25, after "to" insert --30--.

Column 92, Line 43, "(Si)" should be --(S1)--.

Column 93, Line 53, after "to" insert --5--.

Column 94, Line 59, "—CF$_{22}$" should be -- —CF$_2$--.

Column 96, Line 29, "(R$^{4"}$SO$^3$)" should be --(R$^{4"}$SO$^{3-}$)--.

Column 98, Line 7, "(dl-1)" should be --(d1-1)--.

Column 100, Line 19, "M" should be --M$^+$--.

Column 100, Line 20, "M" should be --M$^+$--.

Column 100, Line 24, "(ca1-1)" should be --(ca-1-1)--.

Column 101, Line 36, "M$^+$is" should be --M$^+$ is--.

Column 101, Line 36, "M$^+$in" should be --M$^+$ in--.

Column 112, Line 7, "Vigas" should be --Vigus--.

Column 112, Line 19, "Vigas" should be --Vigus--.

CERTIFICATE OF CORRECTION (continued)
U.S. Pat. No. 9,459,535 B2

In the Claims

Column 113, Line 16 (Claim 1), "(Al)" should be --(A1)--.

Column 113, Line 27 (Claim 1), "(al')" should be --(a1')--.

Column 113, Line 63 (Claim 1), "0to" should be --0 to--.

Column 115, Lines 23-24 (Claim 1), "1to 5carbon" should be --1 to 5 carbon--.

Column 115, Line 48 (Claim 1), "S⁺or" should be --S⁺ or--.

Column 115, Line 54 (Claim 2), "(al')" should be --(a1')--.

Column 115, Line 56 (Claim 2), "(Al)" should be --(A1)--.

Column 116, Line 2 (Claim 7), "(al')" should be --(a1')--.

Column 116, Line 4 (Claim 7), "(a 1-1-1)" should be --(a1-1-1)--.

Column 123, Lines 37-55 (Claim 7):

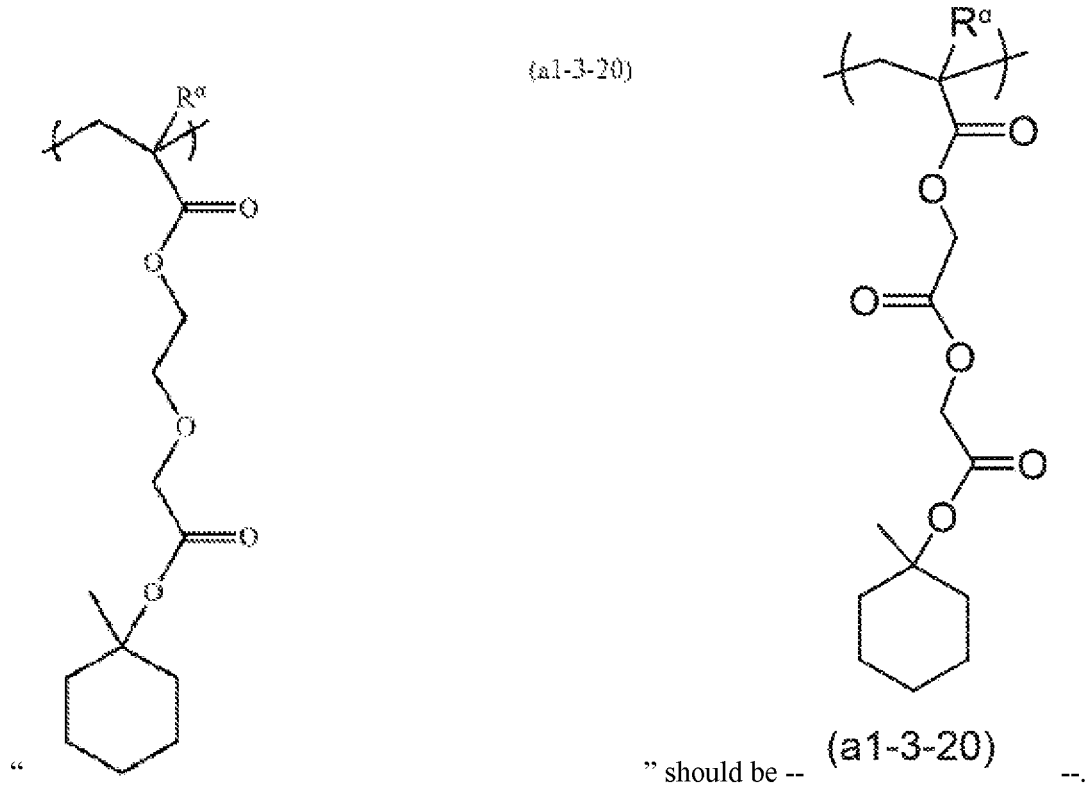

CERTIFICATE OF CORRECTION (continued)
U.S. Pat. No. 9,459,535 B2

Page 4 of 4

Column 124, Lines 2-22 (Claim 7):

" 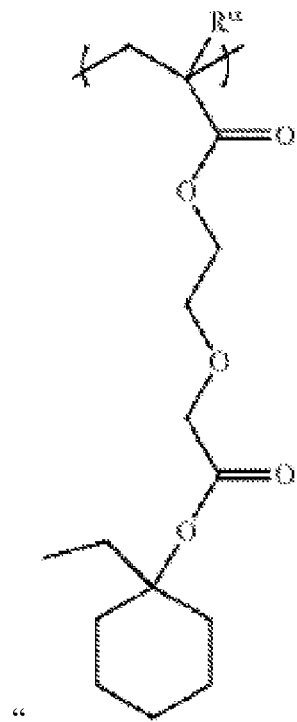 " should be -- 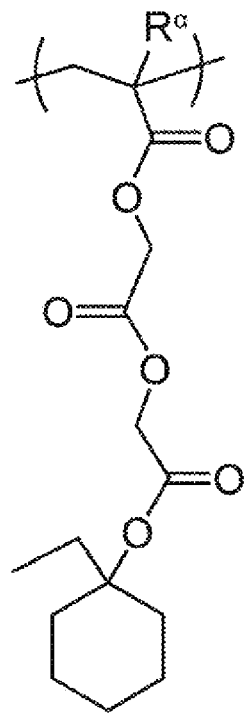 --.

Column 124, Lines 37-54 (Claim 7):

" 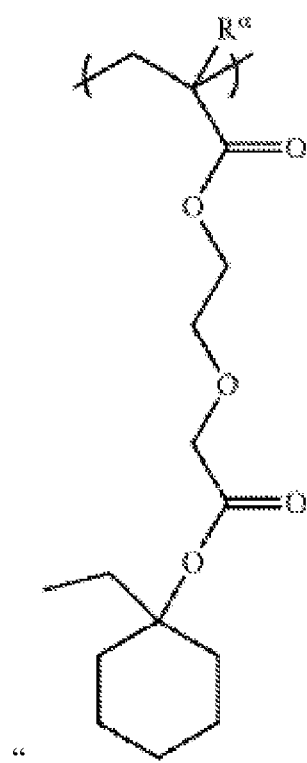 " should be -- 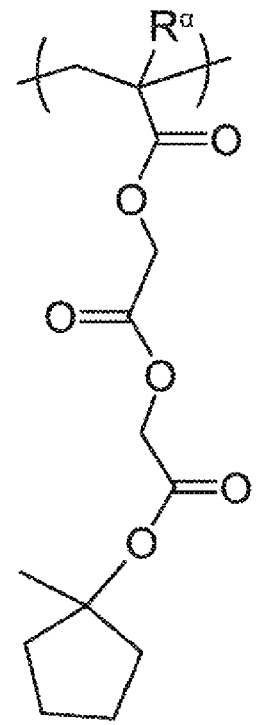 --.